(12) United States Patent
Chiang et al.

(10) Patent No.: US 8,882,914 B2
(45) Date of Patent: Nov. 11, 2014

(54) PROCESSING SUBSTRATES USING SITE-ISOLATED PROCESSING

(75) Inventors: Tony P. Chiang, San Jose, CA (US); David E. Lazovsky, San Jose, CA (US); Sandra G. Malhotra, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 1464 days.

(21) Appl. No.: 11/418,689

(22) Filed: May 5, 2006

(65) Prior Publication Data
US 2006/0292845 A1    Dec. 28, 2006

Related U.S. Application Data

(63) Continuation-in-part of application No. 11/231,047, filed on Sep. 19, 2005, and a continuation-in-part of application No. 11/132,817, filed on May 18, 2005, now Pat. No. 7,390,739, and a continuation-in-part of application No. 11/132,841, filed on May 18, 2005, application No. 11/418,689, which is a continuation-in-part of application No. 11/352,077, filed on Feb. 10, 2006.

(60) Provisional application No. 60/610,937, filed on Sep. 17, 2004, provisional application No. 60/725,186, filed on Oct. 11, 2005.

(51) Int. Cl.
*C23C 16/00* (2006.01)
*C23C 14/00* (2006.01)
*H01L 21/3205* (2006.01)
*H01L 21/768* (2006.01)
*H01L 21/677* (2006.01)
*H01L 21/67* (2006.01)

(52) U.S. Cl.
CPC .... *H01L 21/32051* (2013.01); *H01L 21/76849* (2013.01); *H01L 21/76871* (2013.01); *H01L 21/76834* (2013.01); *H01L 21/6708* (2013.01); *H01L 21/67745* (2013.01); *H01L 21/67028* (2013.01); *H01L 21/76841* (2013.01); *H01L 21/67207* (2013.01)
USPC .. 118/719; 118/712; 204/298.25; 204/298.26

(58) Field of Classification Search
USPC .................. 118/719; 156/345.31, 345.32
See application file for complete search history.

(56) References Cited

U.S. PATENT DOCUMENTS

| 4,743,954 A | 5/1988 | Brown |
| 5,356,756 A | 10/1994 | Cavicchi et al. |

(Continued)

FOREIGN PATENT DOCUMENTS

| WO | WO 03/034484 A2 | 4/2003 |
| WO | WO 03/058671 A2 | 7/2003 |

OTHER PUBLICATIONS

Jousseaume V., "Pore sealing of a porous dielectric by using a thin PECVD a-SiC:H Conformal Liner", Journal of the Electrochemical Society 152 (10), Aug. 22, 2005, pp. F156-F161.

(Continued)

*Primary Examiner* — Karla Moore

(57) ABSTRACT

Substrate processing systems and methods are described for processing substrates having two or more regions. The processing includes one or more of molecular self-assembly and combinatorial processing. At least one of materials, processes, processing conditions, material application sequences, and process sequences is different for the processing in at least one region of the substrate relative to at least one other region of the substrate. Processing systems are described that include numerous processing modules. The modules include a site-isolated reactor (SIR) configured for one or more of molecular self-assembly and combinatorial processing of a substrate.

14 Claims, 14 Drawing Sheets

(56) References Cited

U.S. PATENT DOCUMENTS

| | | | |
|---|---|---|---|
| 5,769,952 A * | 6/1998 | Komino | 118/733 |
| 5,985,356 A | 11/1999 | Schultz et al. | |
| 6,004,617 A | 12/1999 | Schultz et al. | |
| 6,040,193 A | 3/2000 | Winkler et al. | |
| 6,045,671 A * | 4/2000 | Wu et al. | 506/40 |
| 6,045,755 A * | 4/2000 | Lebl et al. | 506/33 |
| 6,063,633 A | 5/2000 | Willson, III | |
| 6,187,164 B1 | 2/2001 | Warren et al. | |
| 6,270,582 B1 * | 8/2001 | Rivkin et al. | 118/719 |
| 6,287,977 B1 | 9/2001 | Hashim et al. | |
| 6,306,658 B1 | 10/2001 | Turner et al. | |
| 6,342,733 B1 | 1/2002 | Hu et al. | |
| 6,364,956 B1 | 4/2002 | Wang et al. | |
| 6,468,806 B1 | 10/2002 | MacFarland et al. | |
| 6,503,834 B1 | 1/2003 | Chen et al. | |
| 6,607,977 B1 | 8/2003 | Rozbicki et al. | |
| 6,632,285 B2 | 10/2003 | Wang et al. | |
| 6,646,345 B2 | 11/2003 | Sambucetti et al. | |
| 6,750,152 B1 | 6/2004 | Christenson et al. | |
| 6,756,109 B2 | 6/2004 | Warren et al. | |
| 6,758,951 B2 * | 7/2004 | Giaquinta et al. | 506/32 |
| 6,818,110 B1 | 11/2004 | Warren et al. | |
| 6,821,909 B2 | 11/2004 | Ramanathan et al. | |
| 6,828,096 B1 | 12/2004 | Boussie et al. | |
| 6,830,663 B2 | 12/2004 | Wang et al. | |
| 6,849,462 B1 | 2/2005 | Winkler et al. | |
| 6,858,527 B2 | 2/2005 | Gracias | |
| 6,872,534 B2 | 3/2005 | Boussie et al. | |
| 6,902,934 B1 | 6/2005 | Bergh et al. | |
| 6,905,958 B2 | 6/2005 | Gracias et al. | |
| 6,911,129 B1 | 6/2005 | Li | |
| 6,919,275 B2 | 7/2005 | Chiang et al. | |
| 6,975,032 B2 | 12/2005 | Chen et al. | |
| 7,008,871 B2 | 3/2006 | Andricacos et al. | |
| 7,022,606 B2 | 4/2006 | Mikami et al. | |
| 7,077,992 B2 | 7/2006 | Sreenivasan et al. | |
| 7,084,060 B1 | 8/2006 | Furukawa et al. | |
| 7,247,346 B1 * | 7/2007 | Sager et al. | 427/162 |
| 2002/0079487 A1 | 6/2002 | Ramanath et al. | |
| 2002/0105081 A1 | 8/2002 | Ramanath et al. | |
| 2003/0032198 A1 | 2/2003 | Lugmair et al. | |
| 2003/0082587 A1 | 5/2003 | Seul et al. | |
| 2003/0141018 A1 | 7/2003 | Stevens et al. | |
| 2004/0023302 A1 | 2/2004 | Archibald et al. | |
| 2004/0092032 A1 | 5/2004 | Winkler et al. | |
| 2004/0180506 A1 | 9/2004 | Ramanath et al. | |
| 2004/0203192 A1 | 10/2004 | Gracias | |
| 2004/0245214 A1 | 12/2004 | Katakabe et al. | |
| 2005/0011434 A1 | 1/2005 | Couillard et al. | |
| 2005/0020058 A1 | 1/2005 | Gracias et al. | |
| 2005/0032100 A1 | 2/2005 | Heath et al. | |
| 2005/0064251 A1 | 3/2005 | Li et al. | |
| 2005/0081785 A1 | 4/2005 | Lubomirsky et al. | |
| 2005/0090103 A1 | 4/2005 | Gracias | |
| 2005/0091931 A1 | 5/2005 | Gracias | |
| 2005/0106762 A1 | 5/2005 | Chakrapani et al. | |
| 2005/0263066 A1 | 12/2005 | Lubomirsky et al. | |
| 2007/0068598 A1 * | 3/2007 | Rodewald | 141/301 |

OTHER PUBLICATIONS

Satyanarayana Sri, "Damage mechanisms in porous low-k integration", Semiconductor International, Jun. 1, 2005, pp. 1-8.

Peters Laura, Is pore sealing key to ultralow-k adoption?, Semiconductor International, Oct. 1, 2005, pp. 1-5.

Rossnagel Stephen, "The latest on Ru—Cu interconnect technology", Solid State Technology, Feb. 2005; pp. O1-O4.

De Gans Berend-Jan, "Sector spin coating for fast preparation of polymer libraries", J. Comb. Chem 2005, 7, pp. 952-957.

Guerin Samuel, "Physical vapor deposition method for the high-throughput synthesis of solid-state material libraries", J. Comb. Chem. 2006, 8, pp. 66-73.

Pohm Arthur V., "High-density very efficient magnetic film memory arrays", IEEE Transactions on Magnetics, vol. MAG-5, No. 3, Sep. 1969, pp. 408-412.

Takeuchi I., "Combinatorial synthesis and evaluation of epitaxial ferroelectric device libraries", Applied Physics Letters, vol. 73, No. 7, Aug. 17, 1998, pp. 894-896.

Chang H., "Combinatorial synthesis and high throughput evaluation of ferroelectric/dielectric thin-film libraries for microwave applications", Applied Physics Letters, vol. 72, No. 17, Apr. 27, 1998, pp. 2185-2187.

Chang K.-S., "Exploration of artificial multiferroic thin-film heterostructures using composition spreads", Applied Physics Letters, vol. 84, No. 16, Apr. 19, 2004; pp. 3091-3093.

Van Bavel Mieke, "Introducing Cu and low-k dielectrics; process consequences and reliability issues", Future Fab International, vol. 16, Feb. 3, 2004, 7 pages.

* cited by examiner

PROCESSING SUBSTRATES USING SITE-ISOLATED PROCESSING

RELATED APPLICATIONS

This application is a continuation-in-part (CIP) application of U.S. patent application Ser. No. 11/231,047, filed Sep. 19, 2005, which claims the benefit of U.S. Patent Application No. 60/610,937, filed Sep. 17, 2004, and which is a CIP application of U.S. patent application Ser. Nos. 11/132,817 and 11/132,841, both filed May 18, 2005.

This application is also a CIP application of U.S. patent application Ser. No. 11/352,077, filed Feb. 10, 2006, which claims the benefit of U.S. Patent Application No. 60/725,186, filed Oct. 11, 2005.

TECHNICAL FIELD

The disclosure herein relates generally to processing a substrate and, more particularly, to substrate processing using site-isolated processing in conjunction with conventional full wafer processing of substrates and/or molecular self-assembly.

BACKGROUND

The manufacture of a variety of products now requires the cost-effective production of very small structures and features, e.g., structures and features having a characteristic dimension at the micrometer or nanometer size scale. Electronic components (e.g., integrated circuits (IC), semiconductor devices, optoelectronics devices, data storage devices, magnetoelectronic devices, magnetooptic devices, packaged devices, microprocessors, memory chips, etc.) for computers and other devices are well-known examples of such products. The never-ending pursuit of electronic components including smaller structures and features is leading increasingly to a need for cost-effective processing of semiconductor substrates with which such components are made to produce structures and features at the nanometer size scale. Other products too, such as flat panel displays, can benefit from substrate processing capability that enables cost-effective production of such small structures and features.

Molecular self-assembly is a technique that can be used to produce very small structures and features, e.g., structures and features having a characteristic dimension at the nanometer size scale. Molecular self-assembly can be used to produce a variety of material formations, such as molecular monolayers (often referred to as self-assembled monolayers, or SAMs), molecular multilayers and nanostructures (e.g., nanotubes, Buckey balls, nanowires). However, to date, molecular self-assembly has not been introduced into commercial production processes used to create products as described above which require production of very small structures and features. Consequently there is a need for the use of molecular self-assembly in substrate processing to form material on a substrate leading to commercial product creation.

The manufacturing of the products described above also entails the integration and sequencing of many unit processing steps. As an example, IC manufacturing typically includes a series of processing steps such as cleaning, surface preparation, deposition, lithography, patterning, etching, planarization, implantation, thermal annealing, and other related unit processing steps. The precise sequencing and integration of the unit processing steps enables the formation of functional devices meeting desired performance metrics such as speed, power consumption, and reliability.

The drive towards ever increasing performance of devices or systems of devices such as in systems on a chip (SOCs) has led to a dramatic increase in the complexity of process sequence integration and device integration, or the means by which the collection of unit processing steps are performed individually and collectively in a particular sequence to yield devices with desired properties and performance. This increase in complexity of device integration has driven the need for, and the subsequent utilization of increasingly complex processing equipment with precisely sequenced process modules to collectively perform an effective unit processing step. The precise sequencing of the unit processing tools, in addition to the unit process modules within each tool, must be properly sequenced and integrated.

In addition to the increasingly challenging process sequence integration requirements, the tools and equipment employed in device manufacturing have been developed to enable the processing of ever increasing substrate sizes in order to fit more ICs per substrate per unit processing step for productivity and cost benefits. Other methods of increasing productivity and decreasing manufacturing costs have been to use batch reactors which provide for parallel processing of multiple monolithic substrates. A common theme has been to process the entire monolithic substrate or batch substrates uniformly, in the same fashion with the same resulting physical, chemical, electrical, and the like properties across the monolithic substrate.

The ability to process uniformly across an entire monolithic substrate and/or across a series of monolithic substrates is advantageous for manufacturing cost effectiveness, repeatability and control when a desired process sequence flow for IC manufacturing has been qualified to provide devices meeting desired yield and performance specifications. However, processing the entire substrate can be disadvantageous since the entire substrate is nominally made the same using the same material(s), process(es), and process sequence integration scheme. Conventional full wafer uniform processing results in fewer data per substrate, longer times to accumulate a wide variety of data and higher costs associated with obtaining such data. Consequently, in order to increase productivity and decrease manufacturing cost there is a need to run more than one processing condition, more than one sequence of processing conditions, more than one process sequence integration flow, and/or combinations of the same, collectively referred to as "combinatorial process sequence integration", on a single monolithic substrate.

Incorporation By Reference

Each publication, patent, and/or patent application mentioned in this specification is herein incorporated by reference in its entirety to the same extent as if each individual publication and/or patent application was specifically and individually indicated to be incorporated by reference.

DETAILED DESCRIPTION

Figure 1:
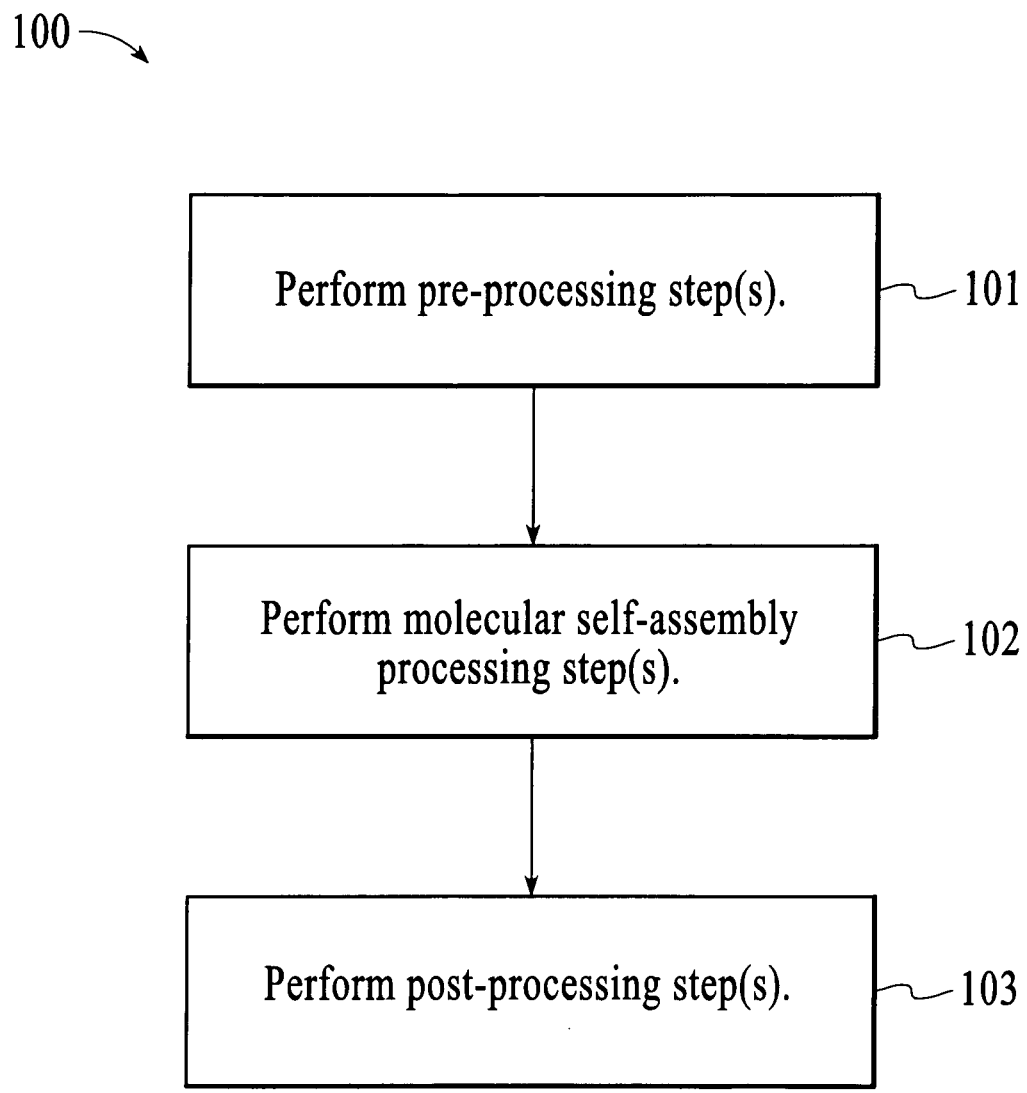
FIG. 1 is a flow diagram for processing a substrate using molecular self-assembly, under an embodiment.

Systems and methods for molecular self-assembly and/or combinatorial process sequence integration using site-isolated processing are described below for processing a substrate (e.g., forming material(s) on a substrate). The use of molecular self-assembly and site-isolated processing enables production of very small structures and features on substrates (e.g., at the nanometer size scale) at very low cost, which can be useful in the commercial manufacturing of a variety of products, such as electronic components and flat panel displays to name a few. The various systems and methods described below are presented as examples only and are not intended to limit the systems and methods described and claimed herein to systems that only include molecular self-assembly and/or combinatorial process sequence integration using site-isolated processing. Furthermore, the systems and methods described below are not limited to any particular processes (e.g., wet processes, dry processes, etc.).

A system for molecular self-assembly is referred to herein as a "molecular self-assembly system" or "MSAS" and includes at least one interface configured to receive at least one substrate. The MSAS also includes a number of modules coupled to the interface. The modules, also referred to herein as components, include a pre-processing module, a molecular self-assembly processing module, and a post-processing module, but may include any number and/or type of other modules where any of the modules may include functions of the pre-processing, molecular self-assembly, and/or post-processing modules. The MSAS is not required to include at least one of each of the preceding module types; for example, a particular process flow may include only the molecular self-assembly processing module and means for moving a substrate into and out of the MSAS. Also, functions of all of the pre-processing, molecular self-assembly, and post-processing modules may be embedded within a single module. Each module of the multiple modules can contain at least one of a number of different processes as appropriate to processes contained in at least one other of the modules. The MSAS also includes at least one handler coupled to the interface and configured to move the substrate between the interface and one or more of the modules.

The molecular self-assembly of an embodiment is used in one or more substrate processing systems and processes to form material (e.g., produces a layer or structure) on a substrate. The forming of material on a substrate as used herein encompasses both forming the material directly on the substrate material as well as forming the material on another material previously formed on the substrate, but may not be so limited. The molecular self-assembly enables production of very small structures and features on substrates (e.g., at the nanometer size scale) at very low cost, which can be useful in the manufacture of a variety of products. Molecular self-assembly is also particularly suitable for forming material with good selectivity, a very useful characteristic in substrate processing that has previously been difficult to achieve. Additionally, the molecular self-assembly can take advantage of one or more capabilities enabled by commercial substrate processing apparatus and methods (e.g., commercial semiconductor processing equipment and methods) to facilitate and/or enhance the performance of molecular self-assembly to form material on a substrate.

The molecular self-assembly can be used for a wide variety of applications and in the cost-effective production of products (e.g., electronic components, such as processors and memories, among others) including the increasingly small structures and features demanded by developing and future generations of technology. For example, the applications and/or products include but are not limited to the processing of a semiconductor substrate, processing one or more semiconductor wafers for use in production of electronic components, processing of a substrate for use in production of a flat panel display, producing anti-stiction layers for micro-electromechanical machines (MEMs), producing active molecular electronic components (such as capacitors and transistors) for bottom-up manufacturing of logic and memory integrated circuits, producing release layers for micro-contact printing or step-and-flash lithographic applications. As can be appreciated, there are many other applications of the molecular self-assembly.

The molecular self-assembly of an embodiment can form a variety of materials in a variety of types of layers or structures. In general, the molecularly self-assembled material can be organic or inorganic. The molecular self-assembly can be used to produce one or more of a molecular monolayer and a molecular multilayer. The molecular self-assembly also produces a nanostructure (e.g., nanotube, Buckey ball, nanowire). The molecular self-assembly can make use of chemical self-assembly or directed self-assembly.

The molecular self-assembly can be used in the processing of a substrate comprising any type of material. For example, the molecularly self-assembled material can be formed on material previously formed on a substrate and can be formed on material (substrate or other material) that has been functionalized to have desired properties, such as desired adhesion characteristics. In particular, the molecular self-assembly can be used in processing semiconductor substrates as in the manufacture of components for use in the electronics industry. The molecular self-assembly can also be used in processing substrates like glass, silicon, and/or plastic for use in the production of flat panel displays, for example. The molecular self-assembly can be used in the processing of any type of semiconductor substrate, including but not limited to silicon substrates, silicon-on-insulator substrates, silicon carbide substrates, strained silicon substrates, silicon germanium substrates, and gallium arsenide substrates.

The molecular self-assembly can include a substrate of any size. For example, the molecular self-assembly can be used in the processing of small semiconductor substrates having areas of less than one square inch up to twelve (12) inch (300 millimeter (mm)) or larger semiconductor substrates used in the production of many electronic components. In general, there is no limit to the size of substrates that can be processed. For example, the molecular self-assembly can be used to process each succeeding larger generation of semiconductor substrates used to produce electronic components. The molecular self-assembly can also be used to process the relatively large substrates that are used in the production of flat panel displays. Such substrates include rectangular substrates on the order of approximately one square meter, but larger substrates can be used. The molecular self-assembly can also be scaled for use in roll-to-roll processing applications for flexible substrates having a fixed width, but (theoretically) unlimited length (a manner of substrate processing that can be particularly useful in the production of flat panel displays); for example, such substrate rolls can be hundreds of feet long.

The molecular self-assembly can be used in processing substrates of any shape, e.g., circular, rectangular (including square), etc. For example, and as described above, the molecular self-assembly can be used in the processing of semiconductor substrates used in the production of electronic components (e.g., circular substrates), as well as in the processing of substrates used in the production of flat panel displays (e.g., rectangular substrates).

The molecular self-assembly can be used in the processing of a single substrate or multiple substrates (e.g., batch processing). For example, in wet semiconductor processing, a single substrate can be processed or a batch of, for example, 13, 25 or 50 substrates can be processed at a single time. In dry semiconductor processing and flat panel display production, typically, a single substrate is processed at one time.

The molecular self-assembly described herein can include wet processing and/or dry processing. In wet processing, a substrate is processed using a fluid. For example, the substrate can be immersed, in whole or in part, in a fluid having specified characteristics (e.g., a specified chemical composition). Also, for example, a fluid can be sprayed on to the substrate in a specified manner. Wet processing for use with the molecular self-assembly of an embodiment can make use of any of a variety of chemical constituents, as appropriate for the desired processing.

In dry processing (e.g., physical vapor deposition, chemical vapor deposition, plasma-enhanced chemical vapor deposition, and atomic layer deposition), a plasma or gas is used to produce a desired interaction with a substrate that processes a substrate surface in a specified way. Dry processing for use with the molecular self-assembly can make use of inert or reactive gases, as appropriate for the desired processing.

Any of a variety of chemical constituents or other reactants (collectively referred to herein as constituents or chemical constituents) can be used by a molecular self-assembly system of an embodiment to effect molecular self-assembly and related processes. The constituents can be in the liquid phase, gaseous phase, and/or some combination of the liquid and gaseous phases (including, for example, the super-critical fluid phase). The constituents used and their concentrations, as well as the mixture of constituents, will depend on the particular process step(s) to be performed. The chemical delivery system can enable precise control of the molar concentrations, temperature, flow rate and pressure of chemical constituents as appropriate to the process. The chemical delivery system can also provide appropriate filtration and control of contamination.

In the following description, numerous specific details are introduced to provide a thorough understanding of, and enabling description for, embodiments of the molecular self-assembly. One skilled in the relevant art, however, will recognize that these embodiments can be practiced without one or more of the specific details, or with other components, systems, etc. In other instances, well-known structures or operations are not shown, or are not described in detail, to avoid obscuring aspects of the disclosed embodiments.

FIG. 1 is a flow diagram for processing 100 a substrate using molecular self-assembly, under an embodiment. The processing 100 includes pre-processing 101, molecular self-assembly processing 102, and post-processing 103. Each of the pre-processing 101, molecular self-assembly processing 102, and post-processing 103 may include one or multiple processes or processing steps but is not so limited. Various implementations of each of the pre-processing 101, molecular self-assembly processing 102 and post-processing 103 are described below. Aspects of the molecular self-assembly of an embodiment relate to implementation of part or all of the pre-processing 101, molecular self-assembly processing 102 and/or post-processing 103 in a particular manner and/or using particular apparatus.

The pre-processing 101 prepares the substrate for formation of a desired material in the molecular self-assembly processing 102. The particular pre-processing 101 may depend on processes of the molecular self-assembly 102, i.e., the characteristics of the processes and material(s) formed. The pre-processing 101 can include one or more wet pre-processing processes, one or more dry pre-processing processes, and/or a combination of wet pre-processing and dry pre-processing.

Generally, in an embodiment, any pre-processing 101 can be used that is necessary or desirable to prepare the substrate for material formation in the molecular self-assembly processing 102. For example, the substrate can be cleaned to remove contaminants and/or the substrate can be functionalized in a manner that facilitates formation of the material in the molecular self-assembly processing 102. As used herein, functionalization of a material refers to modifying the characteristics of an exposed part of the material to achieve a desired interaction with another material subsequently formed on the exposed part of the material. For instance, the pre-processing 101 of an embodiment establishes the adhesion properties of a surface on which material is to be formed in the molecular self-assembly processing 102 to improve adhesion of the formed material on that surface. If, for instance, a molecule to be formed on a surface adheres only to a hydroxyl (OH) group, then the surface can be functionalized to expose hydroxyl groups on that surface. There are many other ways contemplated under the molecular self-assembly described herein in which surface(s) on which material(s) are to be formed in subsequent processes can be functionalized; functionalizing surface(s) to facilitate adhesion of subsequently formed material(s) is only one example of functionalization.

In one aspect of the molecular self-assembly, one or more parameters of wet pre-processing can be controlled to facilitate or enhance performance of that processing. For instance, parameter(s) of wet pre-processing can be controlled to reduce the time required for the desired processing, to enable better control over physical characteristics (such as temperature) of the processing, and/or to enable defect-free processing. In particular, one or more parameters of wet pre-processing can be controlled to facilitate or enhance performance of that processing to effect desired processing of a substrate material (e.g., functionalization of a substrate material) on which material will subsequently be formed using molecular self-assembly. The molecular self-assembly can make use of capabilities that are provided by existing commercial substrate processing apparatus (e.g., conventional semiconductor processing apparatus), or that can be provided with some modification of such apparatus, to effect control of one or more parameters associated with wet pre-processing to enhance performance of that processing.

For example, vibration can be imparted to a substrate during wet pre-processing (e.g., being immersed in a fluid bath or sprayed with a fluid). More generally, vibration can be imparted to a substrate during any wet processing processes. For example, vibration can be imparted to a substrate to facilitate a cleaning process. The frequency and/or amplitude of vibration imparted to a substrate while undergoing wet processing is chosen so as to be appropriate for the process. For example, the molecular self-assembly can include application of high frequency vibration, such as ultrasonic or megasonic vibration, to a substrate during wet processing to facilitate a desired functionalization and/or cleaning of a substrate material on which material will subsequently be formed using molecular self-assembly. The use of vibration of a substrate during wet pre-processing can enhance reaction kinetics and/or reaction efficiency so as to reduce the time required for the processing. The substrate can also be rotated to improve kinetics, reaction efficiency and/or uniformity of processing across the substrate.

The molecular self-assembly of an embodiment can also be implemented to control the fluid dynamics of wet pre-processing. Appropriate control of the fluid dynamics of wet pre-processing, in accordance with the molecular self-assembly, can advantageously promote a desired functionalization of a surface or surfaces. The fluid dynamics can be controlled in a manner that is the same as, or similar to, that described below with respect to the control of the fluid dynamics during the molecular self-assembly processing 102.

The molecular self-assembly can also be implemented to control temperature during wet pre-processing. The temperature control includes control of the temperature of the fluid used during wet pre-processing (e.g., by controlling the temperature of one or more chemicals used) and/or the temperature of the substrate. In either case, the temperature can be controlled using closed or open loop control. Appropriate control of the fluid or substrate temperature during wet pre-processing can enable control over the temperature at which the processing occurs. For instance, some wet pre-processing produces an exothermic reaction that may cause the temperature of the process to elevate out of control. The molecular self-assembly can be used to monitor the process temperature and compensate accordingly (e.g., adjust temperature(s) used in the delivery of chemical(s) for use in the wet processing). Processes that produce an endothermic reaction can be similarly controlled.

In another aspect of the molecular self-assembly, dry pre-processing is used to effect desired processing of a substrate material (e.g., functionalization of a substrate material) on which material will subsequently be formed using molecular self-assembly. In particular, a plasma process can be used. The plasma pre-processing can be implemented so that the substrate is exposed to the plasma or so that the substrate is not exposed to the plasma (i.e., so that the plasma is remote). The latter can be desirable because such processing may be less damaging to the substrate. The plasma pressure and bias power can be controlled to produce desired processing. Plasma pre-processing in an embodiment can be performed using one or more of a variety of chemical constituents, such as, for example, oxygen, hydrogen, nitrogen and ammonia. For example, plasma pre-processing can be used to oxidize a substrate surface by exposing the surface to oxygen plasma. Alternatively, for example, plasma pre-processing can be used to reduce or eliminate oxidation of a substrate surface by exposing the surface to hydrogen plasma. The latter can be useful, for example, to reduce or eliminate surface oxidation that may occur as a substrate is moved around a production facility during processing (e.g., as a semiconductor wafer is moved around a semiconductor fabrication facility). The molecular self-assembly can make use of existing commercial substrate processing apparatus (e.g., conventional semiconductor processing apparatus) to effect dry pre-processing.

In another aspect of the molecular self-assembly, both wet pre-processing and dry pre-processing are used to effect desired processing of a substrate material on which material will subsequently be formed using molecular self-assembly. In general, any number and combination of any types of wet pre-processing and dry pre-processing can be used. For example, any combination of the examples of wet pre-processing and dry pre-processing described above can be used to effect desired processing of a substrate material on which material will subsequently be formed using molecular self-assembly.

The molecular self-assembly processing 102 is used to form a material on a substrate. The molecular self-assembly processing 102 can include one or more of wet post-processing processes, one or more dry post-processing processes, and/or a combination of wet post-processing and dry post-processing processes. In general, the molecular self-assembly processing 102 can be performed using existing commercial substrate processing apparatus (e.g., conventional semiconductor processing apparatus), with modification or addition as necessary for the particular processing to be performed. The molecular self-assembly processing 102 includes formation of a material on a substrate using molecular self-assembly.

Molecular self-assembly can be used to form any of a variety of materials in any of a variety of structures (e.g., monolayer, multilayer, nanostructure). For example, the system of an embodiment can use molecular self-assembly to produce a self-assembled monolayer for a CMOS interconnect application, such as a self-assembled monolayer to act as an interface of adhesion between materials (e.g., between a low-k dielectric and a copper barrier such as tantalum nitride).

The system of an embodiment can also use molecular self-assembly to produce a self-assembled monolayer to act as an adhesion layer between a copper barrier and a copper seed layer. The molecular self-assembly processing 102 can also include one or more additional processes in addition to processes for performing molecular self-assembly. For example, after formation of a material on a substrate using molecular self-assembly, one or more processes can be performed to functionalize the material. Any functionalization process can be used in concert with the molecular self-assembly of an embodiment.

For example, a material formed using molecular self-assembly can be functionalized to improve the adhesion properties of that material with respect to a material subsequently to be formed on the molecularly self-assembled material. Alternatively, for example, a material formed using molecular self-assembly can be functionalized to promote subsequent growth of a material. As an example, an organo-metallic terminal group can be used as a seed layer to promote subsequent deposition via chemical vapor deposition, atomic layer deposition, electroless deposition, and electrochemical deposition. Numerous other methods for functionalizing a molecularly self-assembled material are contemplated under the embodiments described herein.

The molecular self-assembly systems and methods described herein include any molecular self-assembly process. Molecular self-assembly can be used to form material directly on surface(s) of a substrate being processed. Alternatively, molecular self-assembly can be used to indirectly form material on surfaces(s) of a substrate (referred to herein as the primary substrate) being processed by forming molecularly self-assembled material (e.g., a self-assembled monolayer) on a blank (i.e., a substrate that is used just for forming the molecularly self-assembled material, referred to herein as the secondary substrate), functionalizing the molecularly self-assembled material, then stamping the molecularly self-assembled material onto specified surface(s) of the primary substrate. The stamping can be done using equipment particularly tailored for that purpose. The molecularly self-assembled material can be functionalized (as appropriate) and the substrate subjected to post-processing 103, whether the molecularly self-assembled material is formed directly or indirectly on the primary substrate. As with the pre-processing 101, one or more parameters of one or more of the molecular self-assembly processing 102 can be controlled to facilitate or enhance performance of that processing, e.g., reduce the time required for the desired processing, enable better control over physical characteristics (such as temperature) of the processing, and/or enable defect-free processing. Also as with the pre-processing 101, the molecular self-assembly can make use of capabilities that are provided by existing commercial substrate processing apparatus (e.g., conventional semiconductor processing apparatus), or that can be provided with some modification of such apparatus, to effect control of one or more parameters associated with one or more of the molecular self-assembly processing 102 to enhance performance of that processing.

For example, the surface kinetics associated with the molecular self-assembly processing 102 can be controlled using one or more of a variety of techniques. Some illustrative examples of such techniques are as follows; however, generally, any technique or combination of techniques can be used to produce desired kinetic behavior of a processing fluid at a substrate surface. For instance, vibration can be imparted to a substrate during molecular self-assembly. The description above regarding the use of vibration during pre-processing 101 applies as well to the use of vibration during the molecular self-assembly processing 102. The substrate can also be rotated or translated (at a frequency much less than that of the vibration). Additionally, the chemistry fluid dynamics can be controlled to produce desired flow conditions (e.g., particular regime of turbulent or laminar flow) of chemical constituent(s) at the surface of the substrate by, for example, ensuring that a desired amount of the chemical constituent(s) is delivered to a surface of the substrate in a desired manner. A magnetic and/or electric field in the region of the substrate can also be used to enhance reaction kinetics, efficiency, and/or uniformity. Control of the surface kinetics during the molecular self-assembly processing 102 using one or more of the techniques described above can reduce the time required for the processing by promoting formation of a molecularly self-assembled layer, and can promote defect-free formation of the molecularly self-assembled layer. Each of the above-described techniques can be implemented using conventional commercial substrate processing apparatus and methods, or by modifying such substrate processing apparatus and methods in an appropriate manner as can be readily understood by one skilled in the art in view of the description herein.

As for the wet pre-processing described above, the molecular self-assembly can control fluid dynamics during the molecular self-assembly processing 102. In general, any technique or combination of techniques can be used to produce desired fluid dynamic behavior of a processing fluid. Some illustrative examples of such techniques are given following. The flow rate(s) of chemicals into the processing chamber can be controlled to affect the fluid dynamic characteristics in the chamber. The fluid dynamic characteristics affecting the substrate can also be affected by how much and which part of the substrate (e.g., the entire area of the substrate that is to be processed) is exposed to the processing fluid. Spray processing, spin processing, puddle processing, agitation and the like can be used. A magnetic and/or electric field in the region of the substrate can also be used to alter the flow dynamics of the magnetic and/or charged species. The fluid dynamics of the processing fluid can also be affected by the efficacy of a previous drying step, e.g., how free of streaks and water marks the substrate is. Appropriate control of the fluid dynamics during the molecular self-assembly processing 102 can ensure adequate delivery of chemical constituents to substrate surface(s) to promote the molecular self-assembly process.

As for the wet pre-processing described above, the molecular self-assembly can control temperature during the molecular self-assembly processing 102. The description above regarding the control of temperature during the pre-processing 101 applies as well to the control of temperature during the molecular self-assembly processing 102. Control of the process temperature during molecular self-assembly processing enables the use of temperature compensation to avoid undesirable temperature extremes that may otherwise result during an exothermic or endothermic reaction that can occur during molecular self-assembly processing.

Residue can build up on the walls of a processing chamber as the amount of processing done in the chamber increases. This residue buildup can contaminate chemistries introduced into the processing chamber and/or may increase the attraction of chemical constituents of those chemistries to the substrate walls, exacerbating the residue buildup. In one aspect of the molecular self-assembly, the negative consequences of residue buildup on the walls of a wet processing chamber used for molecular self-assembly can be reduced or eliminated by using the chamber to form a molecularly self-assembled layer on the chamber walls. The formed layer passivates the chamber walls for molecular self-assembly to be subsequently performed in the chamber. This can be done by flooding the processing chamber with a fluid having a specified chemistry that will form a molecularly self-assembled material (e.g., a self-assembled monolayer) on the walls of the processing chamber, that molecularly self-assembled material having properties that enable it to act as a passivation layer for a molecularly self-assembled material to be formed in subsequent processing. For example, the chemistry used to produce the passivation layer can be specified so that a polymeric material forms by molecular self-assembly on the chamber walls. Additionally, before performance of the subsequent molecular self-assembly for which the chamber walls are being passivated, another process can be performed to functionalize the passivation layer to inhibit any propensity of that layer to react with the chemistry used in the subsequent molecular self-assembly.

The post-processing 103 of an embodiment finishes in some way the material formed in the molecular self-assembly processing 102. As with the pre-processing 101, the particular post-processing performed often depends on what is done in the molecular self-assembly processing 102, i.e., the characteristics of the processing performed and material(s) formed. The post-processing 103 can include one or more of wet post-processing, dry post-processing, and/or a combination of wet post-processing and dry post-processing. Generally, in an embodiment, any post-processing 103 can be used. As with other processing, the post-processing 103 can generally be performed using existing commercial substrate processing apparatus (e.g., conventional semiconductor processing apparatus).

For example, the post-processing 103 will include cleaning in which residue, contaminants and/or other unwanted material (e.g., unwanted regions of material formed in the molecular self-assembly processing 102) are removed from exposed substrate surface(s). Post-processing cleaning can be used, for instance, to get rid of unattached molecules formed on the substrate during the molecular self-assembly processing 102, such as un-bonded molecules that formed on substrate surface(s) other than surface(s) functionalized for attachment (covalent bonding) of the self-assembled molecules. Post-processing cleaning can be implemented, for example, using megasonic or ultrasonic cleaning, or spin rinsing. Post-processing cleaning is a process in which vibration can usefully be imparted to a substrate to facilitate the cleaning of the substrate.

The post-processing 103 can also include one or more processes in which the substrate is annealed or cured. Thermal annealing or curing can be used. Electron beam (e-beam) or ultraviolet radiation annealing or curing can also be used. In particular, the use of electron beam or ultraviolet radiation annealing or curing after the use of molecular self-assembly to form material on a substrate can be used in substrate processing including the use of molecular self-assembly. Annealing can be used, for example, after electrochemical deposition of a material such as copper, to accelerate grain growth and film stability. Annealing or curing may be performed in a process apparatus that is constructed for that purpose and that is different from apparatus used for other processing of a substrate, but is not so limited.

The post-processing 103 can also include vaporization. Either or both of thermal and plasma vaporization can be used. Vaporization can be performed using the same apparatus used to perform annealing or curing, as described above. For instance, after functionalizing a molecularly self-assembled material with an organo-metallic tail group, annealing can be performed until the polymer breaks down and vaporizes, bonding the metallic material to the underlying material on which the molecularly self-assembled material was formed. This can be advantageous, as opposed to forming the metallic material directly on the underlying material, because the molecularly self-assembled material can be made more selective than the metallic material, thus enabling the metallic material to more easily be formed in desired regions. This can also be used as a means of forming conformal atomic scale metallic films.

In addition to the pre-processing, molecular self-assembly and post-processing described above, other types of processing may be included under an embodiment. For example, to reduce cross-contamination of different chemicals used in different processes performed in the same chamber, an embodiment can include the performance of one or more conventional purge, neutralization and/or passivation processes. This can be particularly useful when the same processing chamber is used for a large number of processes and/or a large number of types of processing (e.g., wet pre-processing, molecular self-assembly, functionalization of molecularly self-assembled material and post-processing cleaning).

Additionally, when wet processing is used in an embodiment as part of any or all of the pre-processing 101, molecular self-assembly processing 102 and post-processing 103, the substrate may be dried after rinsing with, for example, de-ionized water, either completely or at least to a point that ensures that water marks will not be left on the substrate. Thus, when wet processing is used in an embodiment the substrate is dried when the substrate is moved from a wet processing chamber to a dry processing chamber, or from a wet processing chamber to the system interface of the system (e.g., FIGS. 2, 3, and 4) of which the wet processing chamber is part.

An embodiment can also include drying when the substrate is moved from one wet processing chamber to another. Thus, a drying process can be part of one or more of the pre-processing 101, molecular self-assembly processing 102 and post-processing 103, or a drying process may not be associated with any of the pre-processing 101, molecular self-assembly processing 102 and post-processing 103, if the drying process occurs between two of the pre-processing 101, molecular self-assembly processing 102 and post-processing 103. Any type of drying process can be used. For example, a rapid vapor drying process, such as an isopropyl alcohol (IPA) drying process (e.g., Marangoni drying), can be used. Alternatively, spin rinse drying can be used. Drying is commonly performed in the same processing chamber in which cleaning is performed but is not so limited.

Substrate processing in accordance with the molecular self-assembly of an embodiment can be performed using conventional substrate processing apparatus known to those skilled in the art of processing substrates in view of the types of substrate processing to be performed. In particular, conventional commercial substrate processing apparatus (e.g., conventional commercial semiconductor processing apparatus) can be used, with, in some cases, some modification and/or addition as appropriate to the substrate processing of an embodiment. Any such modification or addition can be effected by one of skill in the relevant art in view of the description herein.

For example, a chemical delivery system may be modified to enable delivery of chemistries that are different from, and/or in addition to, the types of chemistries that can otherwise be delivered by that apparatus. As another example, an apparatus for imparting vibration to a substrate may be added to conventional substrate processing apparatus. As still another example, an apparatus for producing a magnetic and/or electric field in the region of a substrate may be added to conventional substrate processing apparatus.

Each of the pre-processing 101, molecular self-assembly processing 102, and post-processing 103 can be implemented in a single or multiple processing modules. Additionally, each of the pre-processing 101, molecular self-assembly processing 102, and post-processing 103 can be implemented in module(s) that are entirely different from, partly different from, or the same as module(s) used to implement, in whole or in part, one or both of the other of the pre-processing 101, molecular self-assembly processing 102, and post-processing 103. As will be understood from the description herein, the number and type of modules used, as well as whether process steps are performed in the same module can depend on the particular processes performed.

Figure 2:
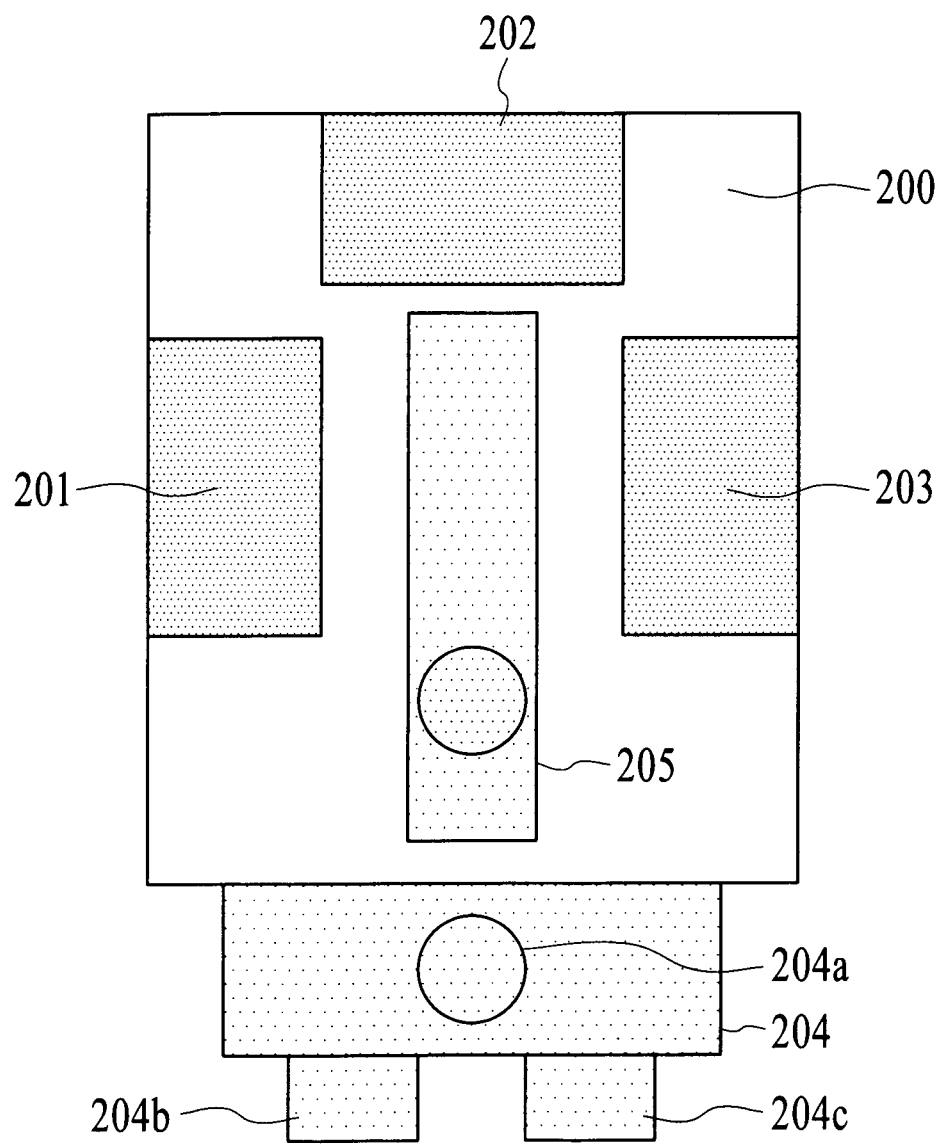
FIG. 2 is a substrate processing system using molecular self-assembly, under an embodiment.

FIG. 2 is a substrate processing system 200 using molecular self-assembly, under an embodiment. The substrate processing system 200 includes a pre-processing module 201, a molecular self-assembly processing module 202, and a post-processing module 203. Each of the pre-processing 101, molecular self-assembly processing 102, and post-processing 103 described above are implemented in a single module that is different from the modules used to implement the other of the pre-processing 101, molecular self-assembly processing 102, and post-processing 103, but the embodiment is not so limited. For example, any of the modules 201, 202, and 203 may include functions of the pre-processing, molecular self-assembly, and/or post-processing modules. The system 200 is not required to include at least one of each of the preceding module types; for example, a particular process flow may include only the molecular self-assembly processing module 202 and means for moving a substrate into and out of the system 200. Also, functions of all of the pre-processing, molecular self-assembly, and post-processing modules may be embedded within a single module. The modules 201, 202 and 203 can each be implemented using apparatus (in particular, conventional commercial substrate processing apparatus) as appropriate to the types of substrate processing for which the modules 201, 202 and 203 are to be used. The modules 201, 202, and 203 may be implemented with modification(s) and/or addition(s) depending on the particular characteristics of the molecular self-assembly. For example, when the molecular self-assembly is used to process semiconductor wafers, the modules 201, 202 and 203 are implemented using conventional commercial semiconductor wafer processing apparatus and methods.

Substrates enter and leave the system 200 via a system interface 204, also referred to as a factory interface 204. A single substrate can be processed at one time in the system 200 or multiple substrates can be processed at one time in a batch. The system interface 204 includes a substrate handler 204*a* (which can be implemented, for example, using a robot) that moves substrate(s) into and out of the system 200. To facilitate moving substrates into and out of the system 200, the system interface 204 includes a substrate load station 204*b* and a substrate unloading station 204*c* (also referred to as a wafer cassette (FOUP) load station 204*b* and a wafer cassette (FOUP) unload station 204*c*, respectively).

After substrate(s) that have been processed are removed from the system 200 and placed on the substrate unload station 204*c* (for eventual movement to another location) by the substrate handler 204*a*, new substrate(s) that have previously been placed on the substrate load station 204*b* are taken from the substrate load station 204*b* by the substrate handler 204*a* and moved into the system 200 for processing. The system interface 204 (including the substrate handler 204*a*, substrate load station 204*b* and substrate unload station 204*c*) can be implemented using conventional apparatus and methods known to those skilled in the art of processing substrates. For example, when the molecular self-assembly is used to process semiconductor wafers, the system interface 204 can be implemented using conventional apparatus and methods known to those skilled in the art of processing semiconductor wafers to enable movement of a wafer and/or a cassette of wafers into and out of the semiconductor wafer processing system. The system 200 of one or more alternative embodiments can include multiple system interfaces, each of which can be constructed and operate as described above.

Once in the system 200, a substrate handling system 205 can be used to move substrate(s) processed by the system 200 between different modules 201-203 of the system 200. Like the substrate handler 204*a* of the system interface 204, the substrate handling system 205 can be implemented, for example, using one or more robots. If the modules 201, 202 and 203 include both wet and dry processing modules, then the substrate handling system 205 includes at least two types of apparatus: a dry substrate handler for moving substrate(s) into and out of dry processing modules and the system interface 204 and out of a drying module, and a wet substrate handler for moving substrate(s) into and out of wet processing modules and into a drying module. The substrate handling system 205 can be implemented using apparatus and methods known to those skilled in the art of processing substrates. For example, when the molecular self-assembly is used to process semiconductor wafers, the substrate handling system 205 can be implemented using conventional apparatus and methods known to those skilled in the art of processing semiconductor wafers to enable movement of a wafer and/or a cassette of wafers between different modules of the semiconductor wafer processing system.

Other than when substrate(s) are being moved into or out of the system 200 through the system interface 204, the system 200 is sealed from the external environment. Depending on the processing to be performed by the system 200, the environment within the system 200 that is outside of the pre-processing module 201, molecular self-assembly processing module 202, and post-processing module 203 (for convenience, sometimes referred to hereinafter as the "system environment") can be maintained at atmospheric pressure, held at a vacuum pressure, and/or pressurized (i.e., held at a pressure above atmospheric pressure). Similarly, the system environment can be maintained at the ambient temperature of the environment outside of the system 200, or at a temperature that is higher or lower than that ambient temperature.

Further, the gaseous composition of the system environment can be controlled as desired. For example, the system environment can be ambient air (typically, controlled to reduce contamination from the external environment). The system environment can also be controlled to include, in whole or in part, a specified gas or gases, e.g., in a system used to process semiconductor wafers, the system environment can be controlled to be nitrogen or an inert gas. The system environment can also be controlled to exclude a specified gas or gases, e.g., oxygen can be excluded from the system environment to reduce the occurrence of oxidation of substrate(s) (or material(s) formed thereon) processed in the system.

Figure 3:
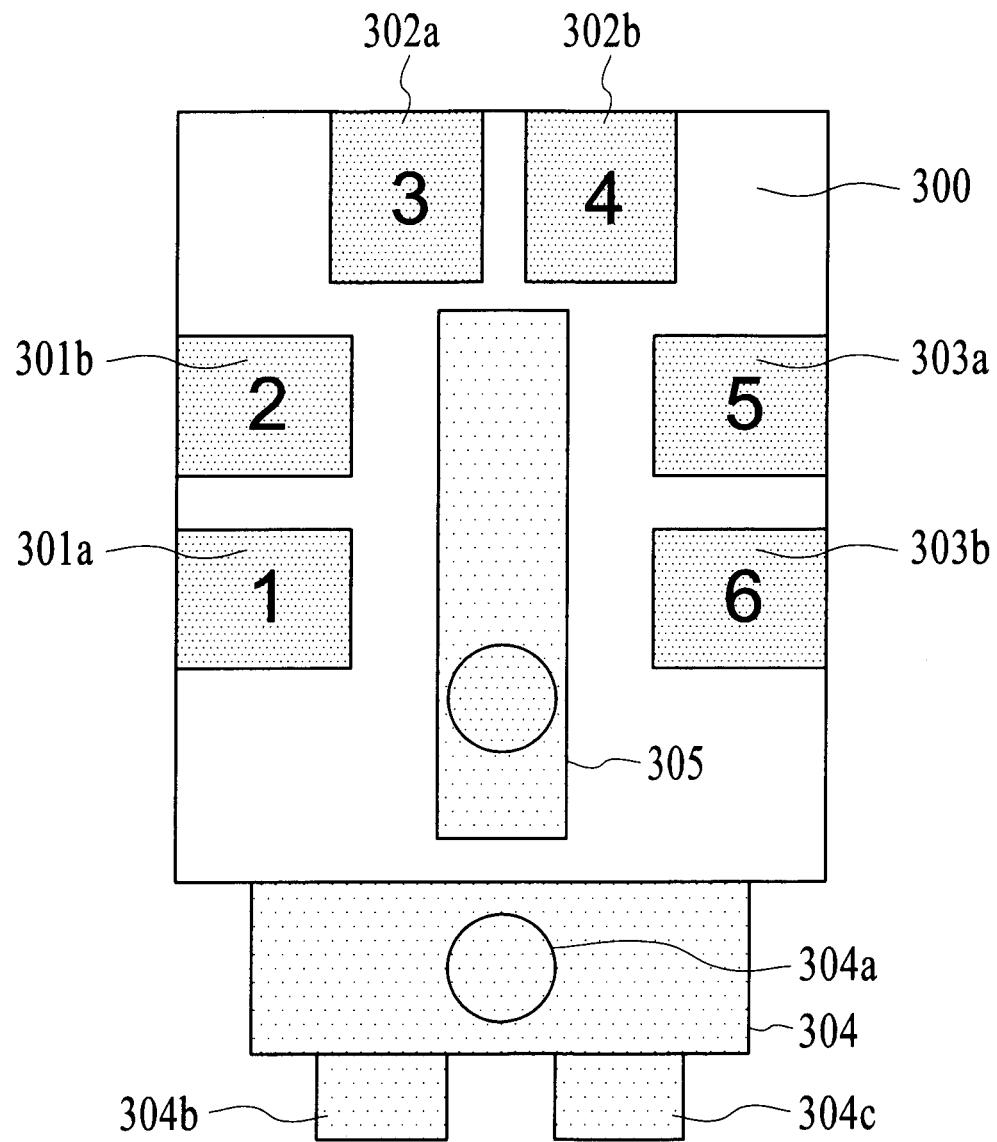
FIG. 3 is a substrate processing system using molecular self-assembly, under an alternative embodiment.

FIG. 3 is a substrate processing system 300 using molecular self-assembly, under an alternative embodiment. The system 300 includes a system interface 304. The system interface 304 of an embodiment includes but is not limited to a substrate handler 304*a*, substrate load station 304*b* and a substrate unload station 304*c* for moving substrate(s) into and out of the system 300. The system 300 includes a substrate handling system 305 for moving substrate(s) processed by the system 300 between different modules of the system 300. Each of the system interface 304, substrate handler 304*a*, substrate load station 304*b*, substrate unload station 304*c* and substrate handling system 305 can be implemented and operate as described above for the corresponding components of the system 200 (FIG. 2). Additionally, the system environment described above with respect to the system 200 applies to the system environment of the system 300.

The substrate processing system 300 includes two pre-processing modules 301*a* and 301*b*, two molecular self-assembly processing modules 302*a* and 302*b*, and two post-processing modules 303*a* and 303*b*, but is not so limited. Alternative embodiments of system 300 can include any number of each of the pre-processing modules 301*a* and 301*b*, molecular self-assembly processing modules 302*a* and 302*b*, and post-processing modules 303*a* and 303*b*.

As described above, in substrate processing according to the molecular self-assembly, pre-processing can include both wet processing and dry processing. In the system 300, the pre-processing modules 301*a* and 301*b* can be dry and wet processing modules, respectively, for performing pre-processing of substrates (e.g., pre-processing module 301*a* includes a plasma (dry) surface preparation module, and pre-processing module 301*b* includes a wet clean/surface preparation module). Any of the wet pre-processing and dry pre-processing described above can be performed in the modules

301a and 301b. The pre-processing modules 301a and 301b of various alternative embodiments can include an pre-processing processes.

The molecular self-assembly processing modules 302a and 302b can include, for example, a module 302a for forming self-assembled molecular material (e.g., self-assembly growth module) and a module 302b for performing subsequent processing that functionalizes that material (e.g., functionalization module). Any of the types of molecular self-assembly and subsequent functionalization described above can be performed in the modules 302a and 302b. The molecular self-assembly processing modules 302a and 302b of various alternative embodiments can include any self-assembly processes.

The post-processing modules 303a and 303b can include, for example, a module 303a for cleaning the substrate after forming material using molecular self-assembly (e.g., post-processing clean module) and a module 303b for annealing and/or vaporizing that material (e.g., post-processing anneal/vaporization module). Any of the types of cleaning, annealing and vaporizing described above can be performed in the modules 303a and 303b. The post-processing modules 303a and 303b of various alternative embodiments can include any post-processing processes.

Figure 4:
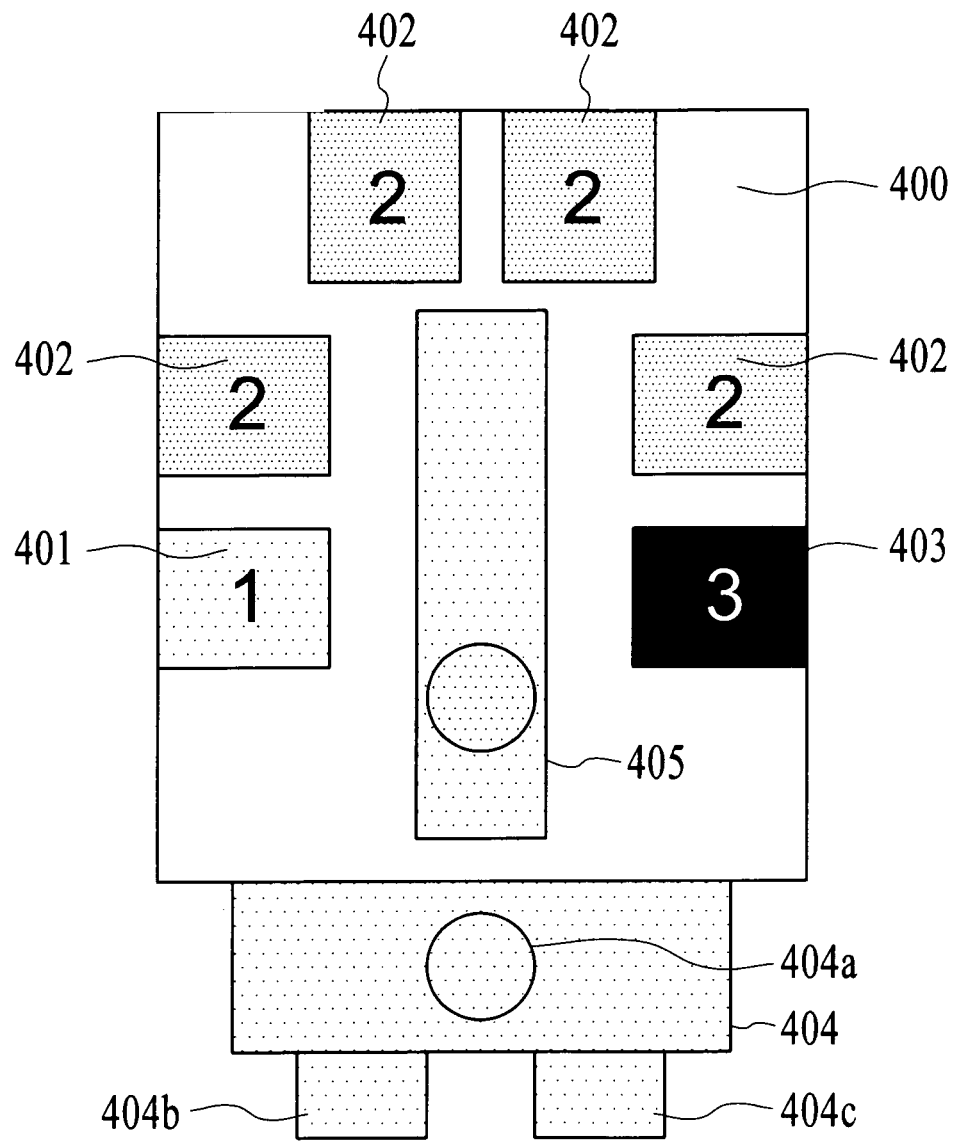
FIG. 4 is a substrate processing system using molecular self-assembly, under another alternative embodiment.

FIG. 4 is a substrate processing system 400 using molecular self-assembly, under another alternative embodiment. The substrate processing system 400 includes one pre-processing module 401 (e.g., plasma (dry) surface preparation module), four molecular self-assembly processing modules 402, and one post-processing module 403. The system 400 of alternative embodiments can include any number, type, and/or combination of modules.

The pre-processing module 401 of an embodiment can include a plasma (dry) surface preparation module, but is not so limited. However, any of the wet pre-processing and dry pre-processing described herein can be performed in the pre-processing module 401.

The molecular self-assembly processing modules 402 can include, for example, a wet clean/surface preparation module, a module for forming self-assembled molecular material (e.g., self-assembly growth module), a module for performing subsequent processing that functionalizes that material (e.g., functionalization module), and a module for cleaning the substrate after forming material using molecular self-assembly (e.g., post-processing clean module).

The post-processing module 403 can include, for example, a module 403 for annealing and/or vaporizing that material (e.g., post-processing anneal/vaporization module). Any of the types of cleaning, annealing and vaporizing described herein can be performed in the module 403.

The system 400 also includes a system interface 404, which, in turn, includes a substrate handler 404a, substrate load station 404b and a substrate unload station 404c for moving substrate(s) into and out of the system 400. The system 400 includes a substrate handling system 405 for moving substrate(s) processed by the system 400 between different modules of the system 400. Each of the system interface 404, substrate handler 404a, substrate load station 404b, substrate unload station 404c and substrate handling system 405 can be implemented and operate as described above for the corresponding components of the system 200 (FIG. 2). Additionally, the description above of the system environment for the system 200 also applies to the system environment of the system 400.

Like the substrate processing system 200 described above, the substrate processing system 400 includes three processing modules 401, 402 and 403. However, to illustrate that different types of processing steps can be performed in the same module, the module 402 of system 400 is shown four times, one for each type of processing that takes place in that module. For example, the module 402 can be used to perform the types of processing that, in system 300, take place in the four separate modules 301b, 302a, 302b and 303a, i.e., wet pre-processing, molecular self-assembly, functionalization of molecularly self-assembled material and post-processing cleaning, respectively. The system 400 can take advantage of the capability of commercial substrate processing apparatus and methods to rapidly change from one process chemistry to another in a module to facilitate the use of a single processing module for the performance of different types of process steps. In particular, in a substrate processing method including molecular self-assembly, multiple processing steps and multiple types of processing can be performed in the same processing chamber. In general, any number and combination of processes can be performed in a single processing chamber under the embodiments described herein. A spin processor coupling a chemistry dispense mechanism with substrate rotation is an example of such a processing chamber. The chemistry can be provided via a single dispense, a multi-port dispense, a spray dispense, and combinations thereof. Substrate rotation assists in uniform application of the process chemistries and can be used to dry the substrate.

In describing the substrate processing systems 200, 300 and 400, it has been assumed that a single wafer or a single batch of wafers is processed at one time. However, each of the substrate processing systems 200, 300 and 400 can be modified to include a multiplicity of each of the types of modules used to process a single wafer or single batch of wafers, i.e., multiple versions of a substrate processing system in accordance with the invention can operate in parallel as a single system. This can be desirable to improve the throughput of substrates processed by a substrate processing system. This can also be desirable to add redundancy in the substrate processing system so that system availability can be maintained even when one or more of the modules of the system are rendered non-operational for a period of time (e.g., for preventative maintenance or repair).

The molecular self-assembly systems described above are presented as examples, and systems including other numbers of processing modules can be used. Furthermore, types of processing modules other than those described above can be used. Manual loading and unloading of substrate(s) may be used in some processing systems instead of a substrate handler for moving substrate(s) into and out of the system.

Figure 5A:
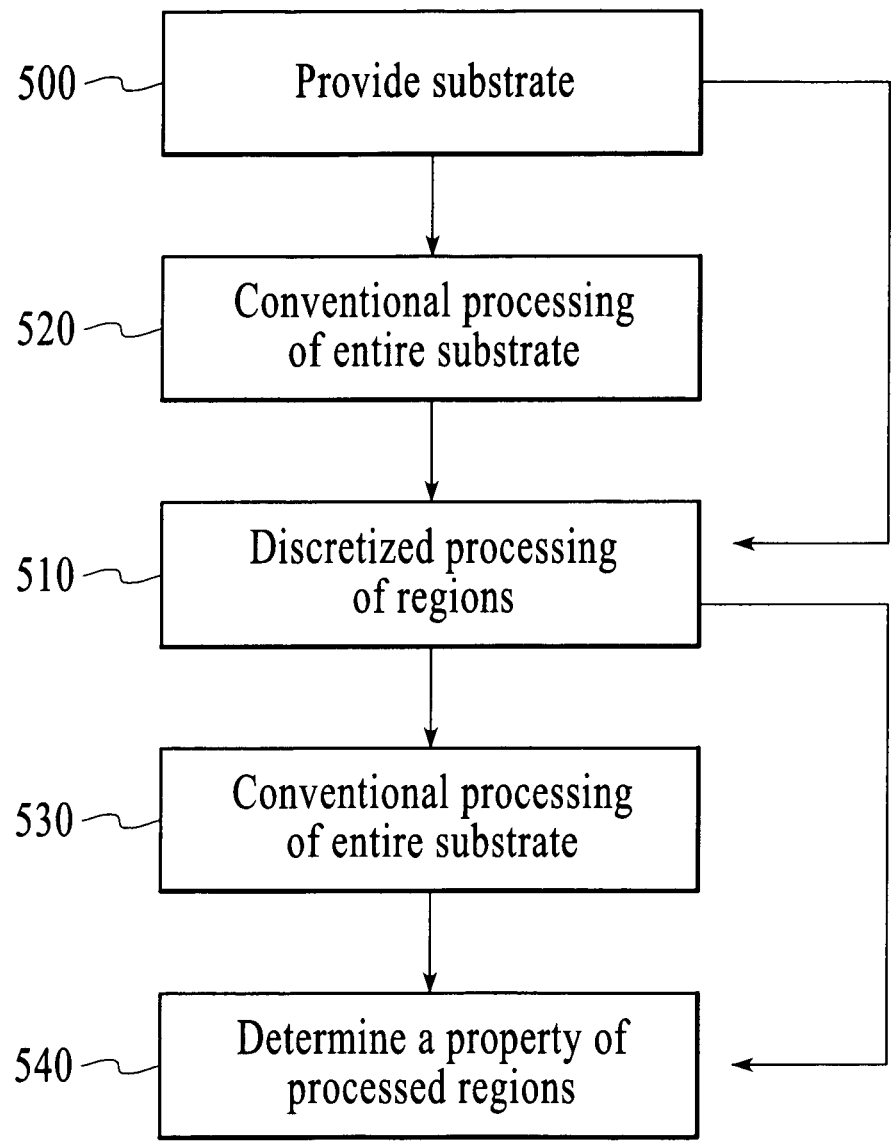
FIG. 5A is a flow diagram for combinatorial process sequence integration, under an embodiment.

The substrate processing systems 200, 300, and 400 described above can include one or more modules (also referred to as components) and/or methods for combinatorially processing regions on a single substrate. Generally, an array of regions is combinatorially processed by delivering processing materials to one or more regions on a substrate and/or modifying the regions. The regions on a substrate of an embodiment include but are not limited to pre-defined regions and regions identified during and/or as a result of processing of the substrate. FIG. 5A is a flow diagram for combinatorial process sequence integration, under an embodiment. The embodiment may utilize a processing tool (which may or may not be an integrated tool comprised of discrete unit modules which collectively perform the effective unit process) that will perform the desired process for analysis. In one embodiment, the processing tool can perform the process in a discretized fashion within unique regions contained in a single monolithic substrate, such as a 300 mm diameter wafer used in IC manufacturing. The substrate is provided to the system 500, and is processed in a discretized, preferably isolated, fashion (either in a serial, parallel, or serial-parallel mode) whereby at least two regions of the substrate are processed differently from each other 510. The substrate processed in the combinatorial fashion can optionally also be previously 520 and/or subsequently 530 processed in a conventional fashion with at least one process or process step, whereby the entire or substantially close to the entire substrate is subject to the same processing conditions. This allows the described combinatorial processing/combinatorial process sequence integration approach to be used in desired segments of the process flow required to build an end device(s), integrated circuit, etc.

The processed regions, such as devices or portions of devices created, can be tested 540 for a property of interest using conventional methods for analysis, such as parametric testing for properties such as yield, via resistance, line resistance, capacitance, etc. and/or reliability testing for properties such as stress migration, electromigration, bias thermal stress, time dependent dielectric breakdown, and related testing known to those of skill in the art. The processed regions can be tested simultaneously, sequentially, or in a parallel-serial mode, where a first plurality of regions is simultaneously tested, followed by a second plurality of regions being simultaneously tested. The testing 540 is optionally performed in one or more alternative embodiments of the methodology for combinatorial process sequence integration.

The combinatorial process sequence integration of an embodiment uses a processing tool referred to herein as a site-isolated processing tool (also referred to as a site-isolated reactor (SIR)) that performs one or more processes. In one embodiment, the site-isolated processing tool processes a substrate in a discretized, isolated fashion (either in a serial, parallel, or serial-parallel mode) within unique regions of the substrate (e.g., at least two regions of the substrate are processed differently from each other). In processing an array of regions, as described herein, processing materials can be delivered to regions (including predefined regions) on a substrate and/or the regions (including predefined regions) can be modified using any number of site-isolated processing processes or sequences in combination with any number of conventional processing processes or sequences.

For example, a method under the combinatorial process sequence integration described herein receives a substrate from at least one first process selected from a group including depositing, patterning, etching, cleaning, planarizing, implanting, and treating. The method generates a processed substrate by processing at least one region of the substrate differently from at least one other region of the substrate. The processing includes modifying the at least one region, wherein modifying includes at least one of physical modifications, chemical modifications, electrical modifications, thermal modifications, magnetic modifications, photonic modifications, and photolytic modifications. The processing forms at least one array of differentially processed regions on the substrate. In one embodiment, the processing described above includes modifying using at least one of materials, processing conditions, process sequences, process sequence integration, and process sequence conditions. In one other embodiment, the processed substrate described above is provided to at least one additional process selected from a group including depositing, patterning, etching, cleaning, planarizing, implanting, and treating.

As another example, a method under the combinatorial process sequence integration described herein generates a processed substrate by processing at least one region of the substrate differently from at least one other region of the substrate. The processing includes modifying the at least one region, wherein modifying includes at least one of physical modifications, chemical modifications, electrical modifications, thermal modifications, magnetic modifications, photonic modifications, and photolytic modifications. The processing forms at least one array of differentially processed regions on the substrate. The method continues by providing the processed substrate to at least one additional process selected from a group including depositing, patterning, etching, cleaning, planarizing, implanting, and treating. In one embodiment, the processing described above includes modifying using at least one of materials, processing conditions, process sequences, process sequence integration, and process sequence conditions.

Figure 5B:
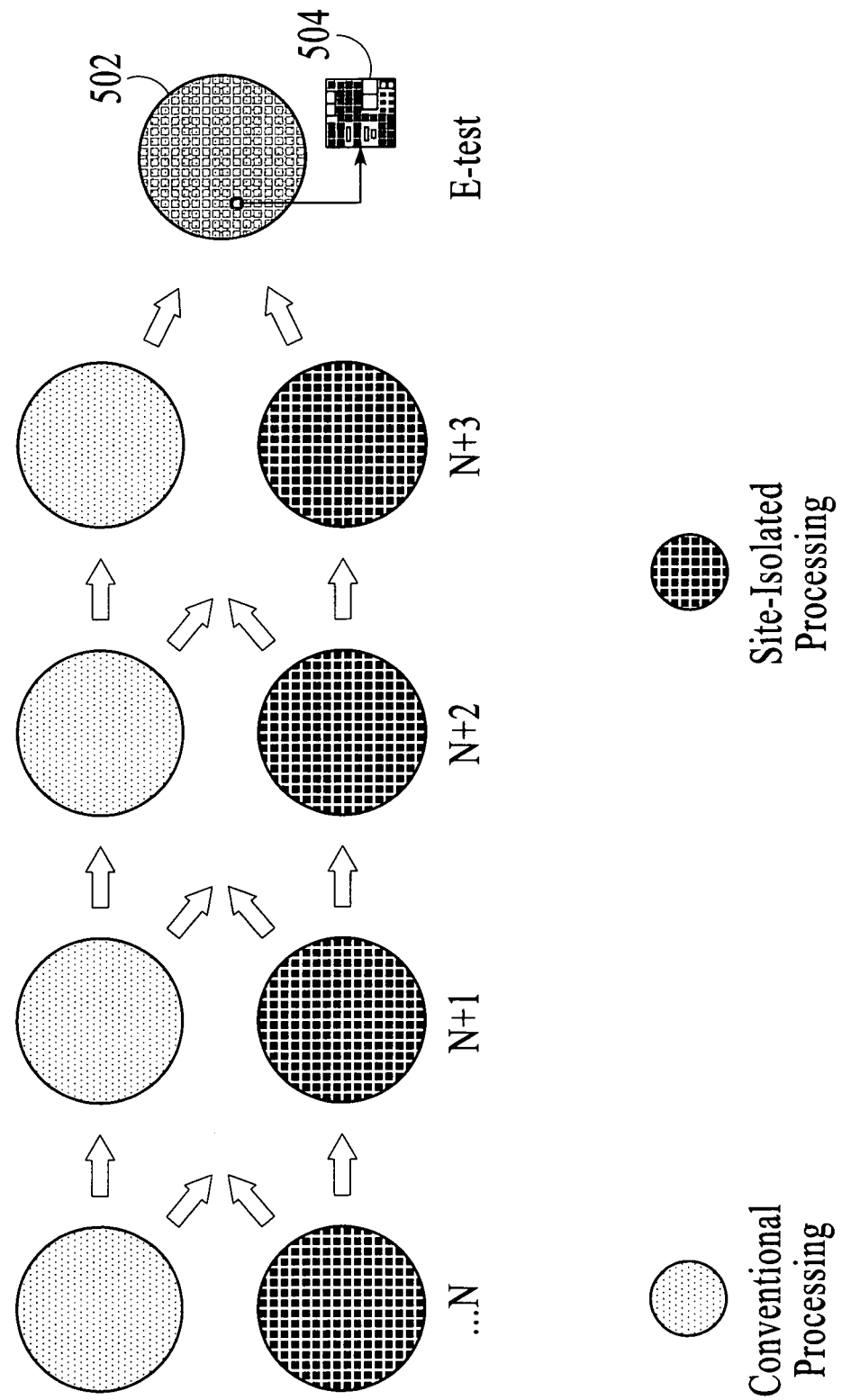
FIG. 5B is a combinatorial process sequence integration process flow that includes site-isolated processing and/or conventional processing, under an embodiment.

FIG. 5B is a combinatorial process sequence integration process flow 500-B that includes site-isolated processing and/or conventional processing, under an embodiment. One example of a processing sequence under the embodiments herein is as follows: process the substrate using Conventional Process N, then process the substrate using Site-Isolated Process N+1, then process the substrate using Site-Isolated Process N+2, then process the substrate using Conventional Process N+3, then perform E-test (e.g. electrical testing). Another example of a processing sequence under the embodiments herein is as follows: process the substrate using Site-Isolated Process N, then process the substrate using Site-Isolated Process N+1, then process the substrate using Conventional Process N+2, then process the substrate using Site-Isolated Process N+3, then perform E-test. Yet another example of a processing sequence under the embodiments herein is as follows: process the substrate using Site-Isolated Process N, then process the substrate using Conventional Process N+1, then process the substrate using Site-Isolated Process N+2, then process the substrate using Conventional Process N+3, then perform E-test. Various other processing sequences can be effected according to the process flow 500-B.

The combinatorial process sequence integration thus generates for example a semiconductor wafer 502 comprising a die array that includes a plurality of dies 504 that can be test dies and/or actual product dies containing intended integrated circuitry. Blanket wafers, pattern wafers, devices, functional chips, functional devices, test structures, semiconductors, integrated circuits, flat panel displays, optoelectronic devices, data storage devices, magnetoelectronic devices, magnetooptic devices, molecular electronic devices, solar cells, photonic devices, and packaged devices can be processed and/or generated using the aforementioned combinatorial process sequence integration methodology. The combinatorial process sequence integration can be applied to any desired segment(s) and/or portion(s) of an overall process flow. Characterization, including electrical testing, can be performed after each process step, and/or series of process steps within the process flow as needed and/or desired.

Figure 5C:
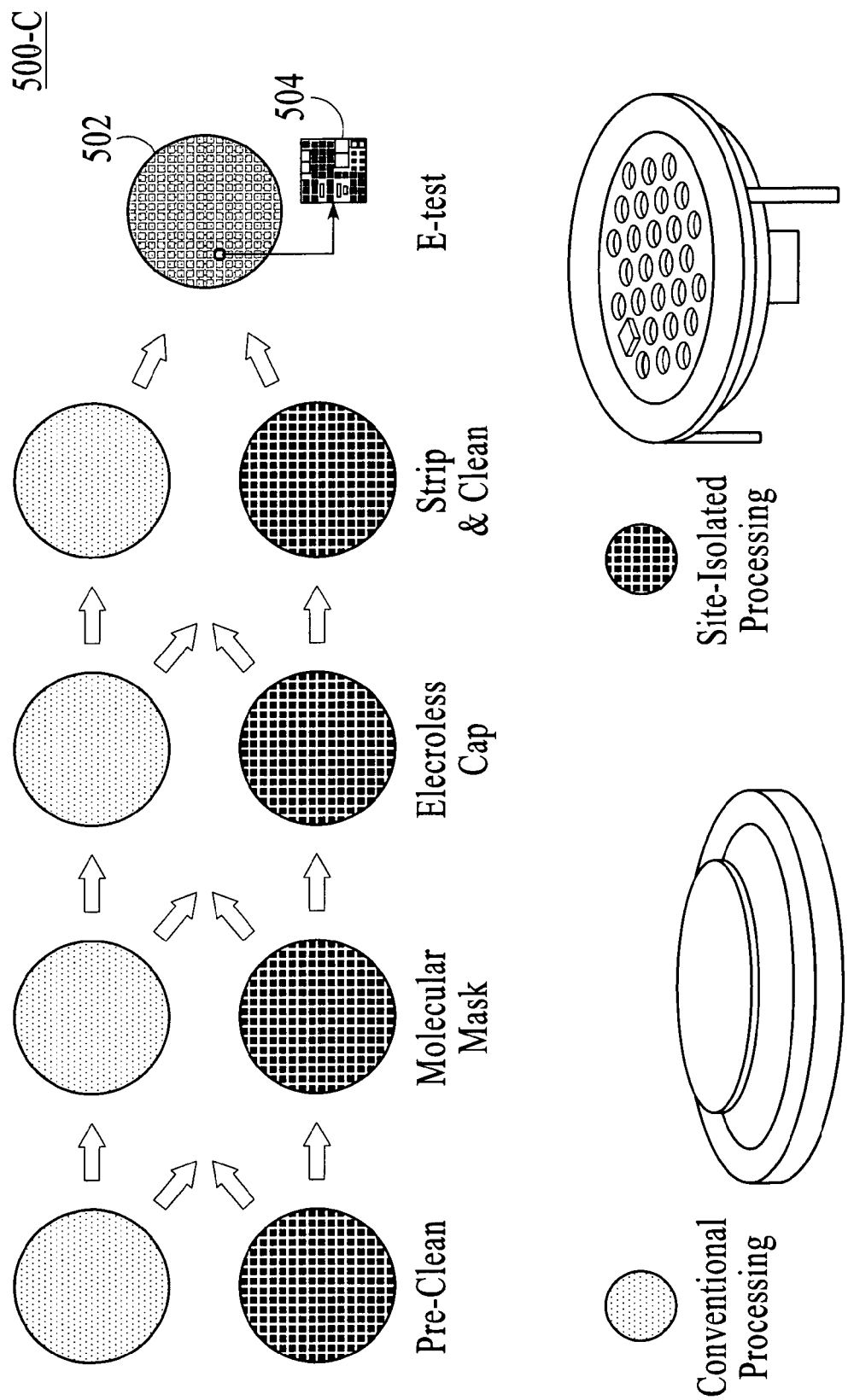
FIG. 5C is a more specific combinatorial process sequence integration process flow that includes site-isolated processing and/or conventional processing, under an embodiment.

FIG. 5C is a more specific combinatorial process sequence integration process flow 500-C that includes site-isolated processing and/or conventional processing, under an embodiment. One example of a processing sequence under the embodiments herein is as follows: process the substrate using Conventional Pre-clean, then process the substrate using Site-Isolated Molecular Mask, then process the substrate using Site-Isolated Electroless Cap, then process the substrate using Conventional Strip and Clean, then perform E-test. Another example of a processing sequence under the embodiments herein is as follows: process the substrate using Site-Isolated Pre-clean, then process the substrate using Site-Isolated Molecular Mask, then process the substrate using Conventional Electroless Cap, then process the substrate using Site-Isolated Strip and Clean, then perform E-test. Yet another example of a processing sequence under the embodiments herein is as follows: process the substrate using Site-Isolated Pre-clean, then process the substrate using Conventional Molecular Mask, then process the substrate using Site-Isolated Electroless Cap, then process the substrate using Conventional Strip and Clean, then perform E-test. Various other processing sequences can be effected according to the process flow 500-C.

In some embodiments described herein, processing materials are delivered to predefined regions on the substrate, and can be reacted using a number of different techniques. For example, the processing materials can be reacted using, for example, solution based synthesis techniques, photochemical techniques, polymerization techniques, template directed synthesis techniques, epitaxial growth techniques, by the sol-gel process, by thermal, infrared or microwave heating, by calcination, sintering or annealing, by hydrothermal methods, by flux methods, by crystallization through vaporization of solvent, etc. Other useful reaction techniques that can be used to react the processing materials of interest will be readily apparent to those of skill in the art.

Since the regions of the substrate are processed independently of each other, the processing conditions at different regions can be controlled independently. As such, process material amounts, reactant solvents, processing temperatures, processing times, processing pressures, the rates at which the reactions are quenched, deposition order of process materials, process sequence steps, etc. can be varied from region to region on the substrate. Thus, for example, when exploring materials, a processing material delivered to a first and a second region can be the same or different. If the processing material delivered to the first region is the same as the processing material delivered to the second region, this processing material can be offered to the first and second regions on the substrate at either the same or different concentrations. This is true as well for additional processing materials delivered to the first and second regions, etc. As with the processing material delivered to the first and second regions, the additional processing materials delivered to the first and second regions can be the same or different and, if the same, can be offered to the first and second regions on the substrate at either the same or different concentrations.

Moreover, within a given predefined region on the substrate, the processing materials can be delivered in either a uniform or gradient fashion. If the same processing materials are delivered to the first and second regions of the substrate at identical concentrations, then the conditions (e.g., reaction temperatures, reaction times, etc.) under which the regions are processed can be varied from region to region. Parameters which can be varied include, for example, material amounts, solvents, process temperatures, process times, the pressures at which the processes are carried out, the atmospheres in which the processes are conducted, the rates at which the processes are quenched, the order in which the materials are deposited, etc. Other process parameters which can be varied will be apparent to those of skill in the art.

Moreover, an embodiment provides for forming at least two different arrays of materials by delivering substantially the same processing materials at approximately identical concentrations to corresponding regions on both first and second substrates having different surfaces, such as a dielectric material surface and an electrically conductive surface, in order to represent different portions of regions on an IC chip, and, thereafter, subjecting the process materials on the substrates to a first set of process conditions. Using this method, the effects of the process parameters or materials on the various substrate surfaces can be studied and, in turn, optimized.

The processing materials utilized in the processing of the individual regions must often be prevented from moving to adjacent regions. Most simply, this can be ensured by leaving a sufficient amount of space between the regions on the substrate so that the various processing materials cannot inter-diffuse between regions. Moreover, this can be ensured by providing an appropriate barrier between the various regions on the substrate during processing. In one approach, a mechanical device or physical structure defines the various regions on the substrate. A wall or other physical barrier, for example, can be used to prevent the materials in the individual regions from moving to adjacent regions. This wall or physical barrier may be removed after the synthesis is carried out. One of skill in the art will appreciate that, at times, it may be beneficial to remove the wall or physical barrier before screening the array of materials.

In other embodiments, the processing may be effected without the need of barriers which physically touch the substrate. For example, lasers, radiative lamps, UV radiation sources, other "point" sources can be used to process regions in a site addressable fashion as the area of modification is nominally smaller and/or equivalent in size to the discrete regions of interest on the substrate. In yet another embodiment, a physical barrier can be used to essentially screen and/or limit the processing to a desired region(s) and/or portion(s) of a region(s) wherein the physical barrier does not physically touch the substrate. For example, a physical barrier can be used to essentially block and/or restrict processing to certain region(s) and/or portion(s) or region(s). A screen, such as a mask or shutter, can be used to block vapor fluxes such as from PVD (i.e. sputtering) or evaporation sources for example. An opaque vs. transparent mask can be used to let certain radiation through the transparent regions to effect processing in specified regions on the substrate. In yet another embodiment, gas flows, of preferably an inert gas such as argon (Ar), can be used to screen out gaseous reagents and or limit the concentrations of such reagents so as to effectively screen out the effects of such reagents from certain regions. In this fashion, specific regions on a substrate can be processed differently without the need for a physical barrier in communication with the substrate. This approach is particularly amenable to sequential gas phase vacuum based surface kinetic processes such as atomic layer deposition and various forms thereof (e.g. ion, radical, and plasma induced/enhanced).

Combinatorial processing systems of an embodiment include a processing tool adapted to process each region of the substrate individually. In one embodiment, the processing tool is adapted for the delivery of processing materials to the regions of the substrate, and is carried out using a partially or fully automated solution delivery system including a processing cell and its associated solution delivery system, robotics and electronics. The processing tool for combinatorial processing as described herein, which includes operations under the combinatorial process sequence integration process flows 500-B and 500-C described above, can be a component of a substrate processing system like the substrate processing systems 200, 300, and 400 described above and/or one or more modules of the substrate processing systems 200, 300, and 400 described above with reference to FIGS. 2, 3, and 4. The combinatorial process sequence integration process flows 500-B and/or 500-C can be embodied in a processing module 202 of a MSAS 200 (FIG. 2), for example. Similarly, the combinatorial process sequence integration process flows 500-B and/or 500-C can be embodied across one or more processing modules 302a and/or 302b of a MSAS 300 (FIG. 3) as another example.

Figure 6:
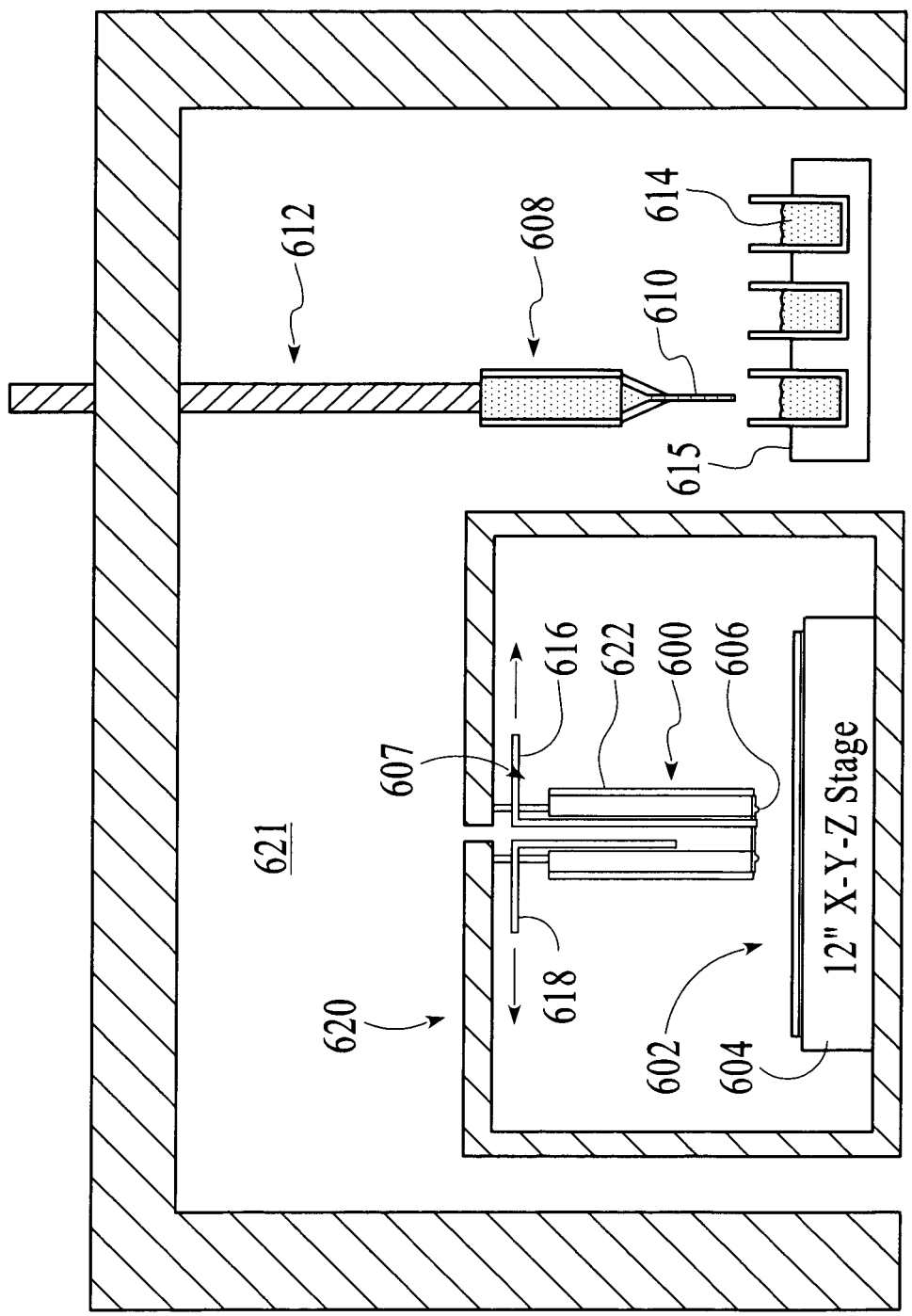
FIG. 6 is a processing system for processing regions of a substrate, under an embodiment.

FIG. 6 is a processing system for processing regions of a substrate, under an embodiment. The processing system provides combinatorial process sequence integration of wet processes, such as those used in IC and related manufacturing, but is not so limited. The processing system of an embodiment includes one or more modules of the substrate processing systems 200, 300, and 400 described above and/or is a component of one or more modules of the substrate processing systems 200, 300, and 400 described above, but is not so limited. The processing system includes a processing cell for carrying out a processing step or process sequence, where the processing cell can be discretely stepped across desired locations of a substrate, such as a wafer, preferably per die location by translating the substrate. The cell is made so as to fully encompass each region, e.g., die, or a first portion of each die, but not interfere with neighboring regions, e.g., dies or portions of dies.

In the system, a processing cell 600 corresponds to a first region, such as an individual die location on a single monolithic substrate 602, such as a 300 mm wafer. The processing cell 600, which is held by a frame (not shown) and optionally hangs from a spring (not shown), can be used to process a unique region on the substrate 602 in a unique fashion compared to other regions on the substrate 602. The processing cell 600 can also be used to perform a unique sequence of unit processes. In one embodiment, the substrate 602 is located on a stage 604, such as an X-Y-Z translatable stage, which can hold the substrate 602. Positioning and alignment techniques can be used to align and position the substrate 602, such that the processing cell 600 is aligned and brought into contact with a corresponding region, such as a die on the substrate 602. This can be achieved using alignment pins in conjunction with stepper motors, or optical alignment, and/or other commonly known techniques to move the substrate 602 with respect to the processing cell 600.

A sealing element 606 such as an elastomeric seal, e.g., o-ring, can be used to form a seal between the processing cell 600 and the substrate 602 when the two elements are brought into contact, to isolate the region of the substrate from other regions of the substrate. The elastomeric seal may be constructed of a material such as Kalrez, Viton or Chemrez, which is chosen to be chemically inert and/or stable with respect to the processing environment. The seal is configured such that when in contact with the substrate, the region to be processed will be isolated from other regions to be processed. In this particular example, the stage 604 is motorized so as to be able to move the substrate 602 in an X-Y direction to align a region of interest with the processing cell 600 and vertically until such sealing can be achieved.

Dispensing, placing, processing, etc. within the processing cell 600 can be achieved in a serial fashion with a delivery system 608 which delivers processing fluids 614 through the processing cell 600. The processing cell 600 optionally includes a vacuum line 616 for removing residual processing fluids and rinse solvents from the region of the substrate 602 subsequent to processing, a rinse line 618, in fluid communication with a rinse solvent source (not shown) for rinsing the processed region of the substrate 602, and/or a gas purge line 617 (shown in FIG. 7B) in fluid communication with a purge gas source (such as argon or nitrogen, not shown) for introducing a gas to the region of the substrate 602 before, during, and/or after processing. The gas purge line 617 can be configured to introduce gas into the processing cell through the processing fluid (by having a length such that an outlet of the line is immersed in the processing fluid) or to introduce the gas to the atmosphere of the processing cell (by having a length such that an outlet of the line is not in the processing fluid). The vacuum line 616 and rinse line 618 are configured to remove and deliver fluids through the processing cell 600 to the isolated region of the substrate.

In order to maintain a clean room-type environment, the processing cell 600 and substrate 602 are located in a mini-environment 620 which may be optionally sealed and/or purged. In some embodiments, the mini-environment 620 is purged with a purge gas such as argon or nitrogen. In another embodiment, it is desirable to control the level of oxygen in the mini-environment to prevent oxidation of the substrate and/or reagents used during the processing of the substrate, and the like. Nitrogen, argon, helium, forming gas, and other suitable purge gases can be used to maintain low oxygen concentrations within the mini-environment 620. The environment 621 outside of the mini-environment 620 can be similarly controlled.

The processing cell 600 can also include a heating element 622 embedded either in the wall of the cell 600 (not shown) or around the outside of the cell 600, in order to enable heating of the processing fluids and/or the substrate 602. In another embodiment, the stage 604 can be heated to heat the substrate 602.

An agitation mechanism 619 (shown in FIG. 7B) can also be included in the processing cell 600 to facilitate reactions. For example, a physical stir rod, a magnetically based agitation, a gas based agitation, a vibration based agitation (e.g., sonication), and the like can be used to locally agitate the processing region of interest. In addition, the substrate can be globally agitated via the stage 604 in a rotational, vibrational, and the like fashion(s).

Figure 7B:
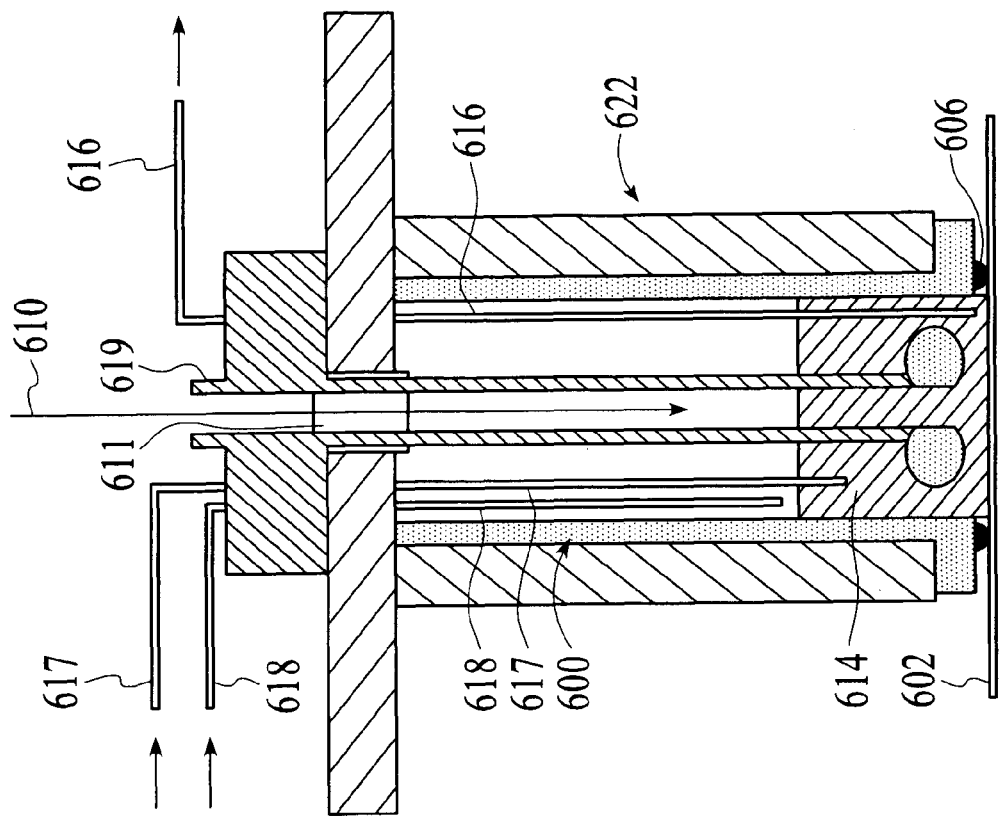
FIG. 7B is a processing cell in contact with a substrate, under an embodiment.
Figure 7A:
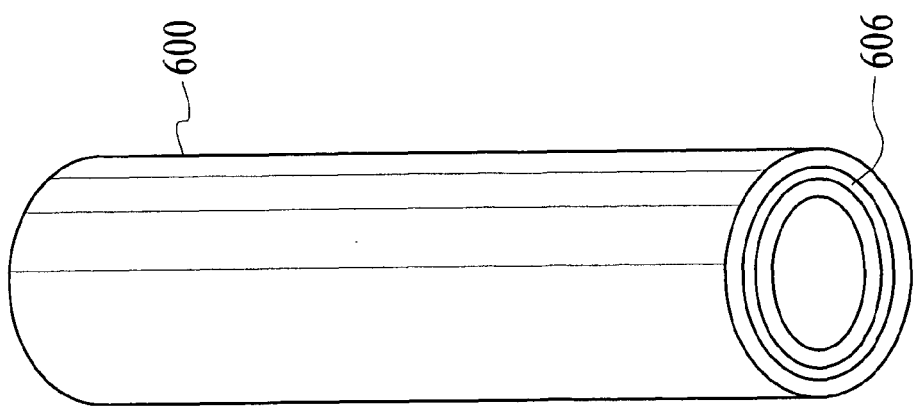
FIG. 7A is a processing cell, under an embodiment.

In one embodiment, the processing cell 600, as shown in FIG. 7A, can have a tubular configuration having an inner diameter consummate with the size of the region or portion of the region of the substrate 602 that is to be isolated. In one embodiment, the inner diameter of the processing cell 600 is between 5-50 mm, more specifically between 10-30 mm, and more specifically between 10-20 mm. One of skill in the art will recognize that the shape is not critical, and that a variety of configurations are within the scope of the description herein. The material used for fabrication of the processing cell 600 is chosen to be chemically inert and stable with respect to process chemistries and environments, such as Teflon or quartz. The processing cell can also optionally include an insert (not shown) that is configured to be disposable and optionally can be adapted to be used for specific types of processing.

As shown in FIG. 7B, when the processing cell 600 is in contact with the substrate 602, processing fluids 614 are delivered to the isolated region of the substrate 602 through a probe 610 of the delivery system. In one embodiment, the processing cell is sealed on its upper surface, such as with a septum 611. When delivering processing fluids to the processing cell 600, the probe 610 pierces the septum 611. The sealing element 606 prevents the processing fluids 614 from leaving the isolated region. In one embodiment, the processing system is designed for the processing cell 600 to hold between 10 μL and 10,000 μL, more specifically between 100 μL and 5,000 μL, and more specifically between 500 μL and 2,000 μL.

The delivery system 608, as shown in FIG. 6, such as an auto-delivery system and delivery methods, such as auto-delivering methods can be used to deliver processing materials, such as processing fluids to the isolated regions of the substrate 602 for processing the region. In one embodiment, an auto-delivering system 608 can include a movable probe (tip) 610, typically mounted on a support arm 612, a translation station (not shown) for providing three-dimensional motion of the probe 610, and a microprocessor (not shown), such as a computer, for controlling three-dimensional motion of the probe 610 between various spatial addresses. The auto-delivery system 608 of an embodiment also comprises a user-interface (not shown) to allow for user programming of the microprocessor with respect to probe motion and manipulations.

The probe 610 can have an interior surface defining a cavity and an inlet port for fluid communication between the cavity and a processing fluid source 614. In one embodiment, the probe is heated using a resistive temperature-control element or a fluid heat-exchanger type temperature-control element such as those disclosed in U.S. Pat. No. 6,260,407. The probe 610 is also configured for fluid communication with the processing cell 600.

The support arm 612 is an XYZ robotic arm, such as can be commercially obtained from Cavro Scientific Instruments, Inc. (Sunnyvale, Calif.) among others, but is not so limited. To improve smoothness of operation at high speeds, such XYZ robotic arms have motions based on gradient variations rather than step-function variations, and are belt-driven rather than shaft driven.

The auto-delivery system 608 can further include one or more pumps (not shown), for example syringe pumps, for drawing and/or expelling fluids, such as liquids, and related connection lines (not shown) for fluid communication between the pumps, the probe 610, and liquid (e.g. solvent) reservoirs 615. Pump configurations, such as peristaltic pumps, vacuum-pumps or other motive-force providing means can be used additionally or alternatively.

In operation, the microprocessor of the auto-delivery system 608 can be programmed to direct the auto-delivery system 608 to withdraw a processing fluid 614 (e.g., a reactant) from a fluid container 615 (e.g., a sample well) formed in a sample tray into the delivery probe 610, and subsequently to direct the probe 610 to the processing cell 600 for delivering the fluid to the isolated region of the substrate 602 through the processing cell 600. The microprocessor of the auto-delivery system includes a user-interface that can be programmed in order to variate the processing conditions among the plurality of regions of the substrate 602.

Figure 8A:
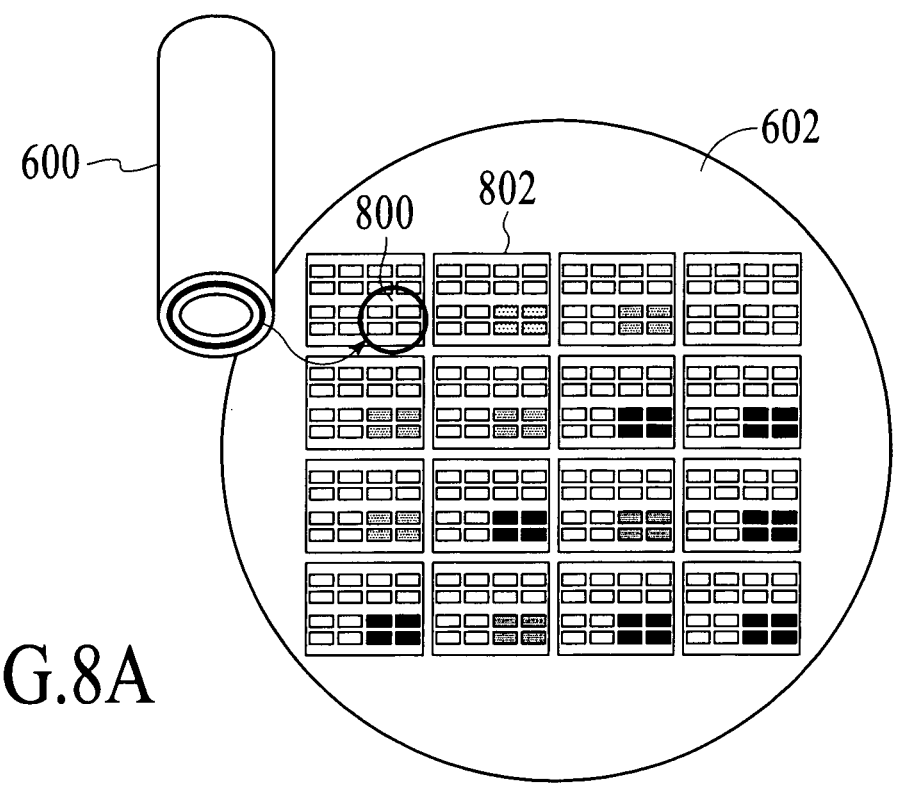
FIGS. 8A-C show the operation of an automated processing system, under an embodiment.
Figure 8B:
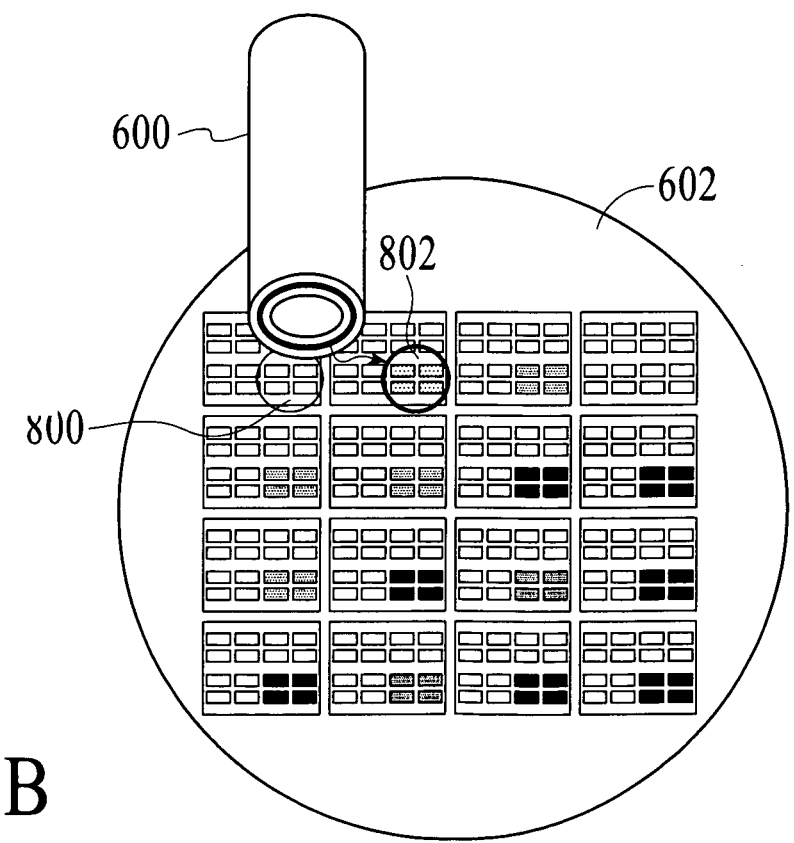
Figure 8C:
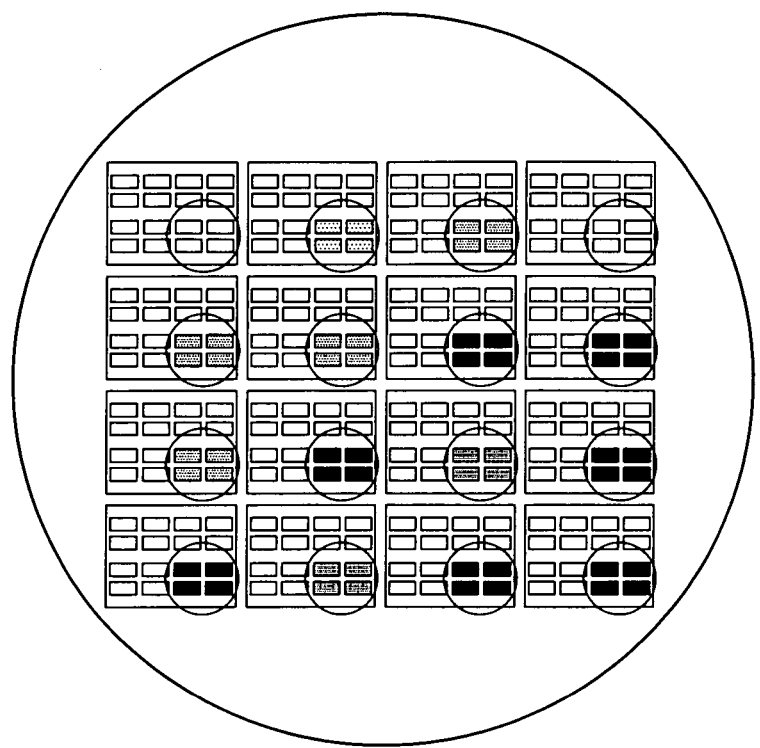

Referring to FIGS. 8A-C, the operation of the automated processing system is described as follows. After bringing the processing cell 600 into contact with the substrate 602 to isolate a region or a portion of a region 800 of the substrate 602 from other regions of the substrate 602, the delivery system is positioned above the processing cell 600. The pumps are activated causing the processing fluids located in the cavity of the probe 610 to flow through the processing cell 600 and collect in a region 800 of the substrate 602 isolated by the processing cell 600 under processing conditions. After processing, residual fluids located in the processing cell 600 are removed via the vacuum line 616, the region is optionally rinsed via the rinse line 618, and the delivery system 608 is optionally rinsed and moved to the next region 802 (as shown in FIG. 8B) where the next specified processing occurs. In one embodiment, a plurality of process fluids are delivered and/or a plurality of process sequences are carried out in the first region 800 prior to the processing cell 600 moving to the next region 802. In one embodiment, all regions, or a portion of all regions of the substrate are individually processed such that the regions are processed differently from each other, as shown in FIG. 8C.

In one embodiment, a purge gas is used in conjunction with and/or after rinsing. For example, a cleaning or rinsing fluid, such as isopropyl alcohol can be used in conjunction with nitrogen purge gas to effect a cleaning and/or rinse/dry sequence (e.g., to eliminate or control watermark formation) either in between or after the delivery of certain process fluids to a region. The purge gas distribution tube 617 can be added to the processing cell so as to effect localized distribution of the purge gas to the region of interest.

Furthermore, the array of process materials can be processed between the various delivery steps. For example, material A can be delivered to a first region on a substrate and, thereafter, exposed to oxygen at elevated temperature, for example. Subsequently, material B can be delivered to the first region on the substrate and, thereafter, reacted under a set of reaction conditions. Other manipulations and processing steps which can be carried out between the various delivery steps will be apparent to those of skill in the art upon reading this disclosure.

Figure 9:
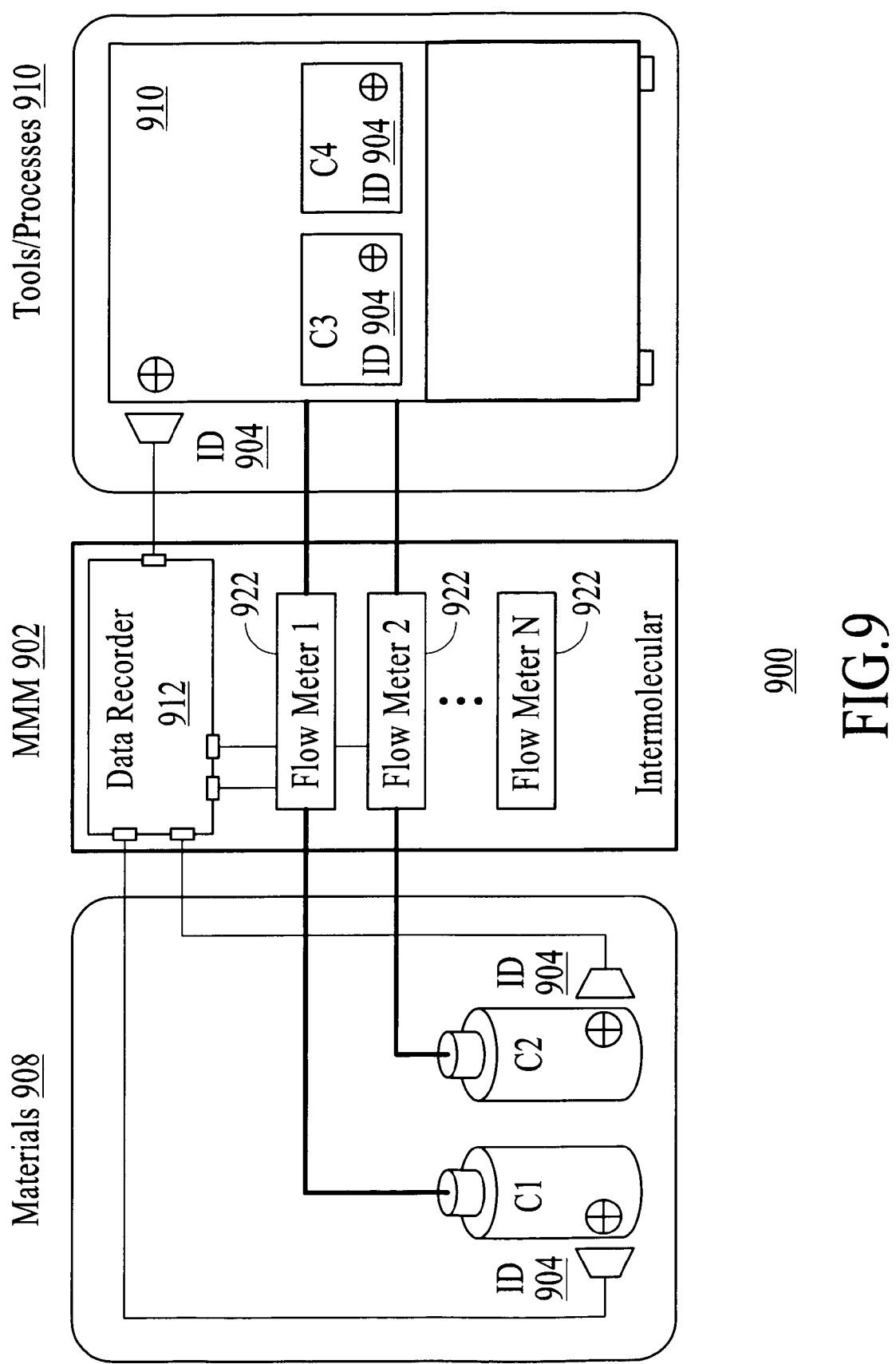
FIG. 9 is a substrate processing system that includes a process tracking system (PTS), under an embodiment.

The substrate processing system of an embodiment includes a process tracking system (PTS) that captures information of materials, processing modules, tools, and/or processes used in substrate processing by the host system. FIG. 9 is a substrate processing system 900 that includes a process tracking system (PTS), under an embodiment. The PTS of an embodiment includes a Material Management Module (MMM) 902 and runs under one or more processors that are components of and/or coupled to the substrate processing system 900. The MMM 902 includes a data recorder 912 along with one or more material handling devices 922. The PTS also includes one or more identification (ID) devices 904 that couple or connect between components or subsystems of the substrate processing system and the MMM 902, as described below. The subsystems may include material containers, material delivery systems, material synthesis systems, tools, process tools, processing modules, processing cells, metrology modules, metrology tools, inspection modules, and inspection tools, but is not so limited.

The PTS as described herein can be a component of and/or coupled or connected to a substrate processing system 900, which includes processing systems like substrate processing systems 200, 300, and 400 described above. Similarly, the PTS can be a component of and/or coupled or connected to one or more modules of the substrate processing systems 200, 300, and 400 described above. In one embodiment, the PTS can capture information of one or more processes hosted by processing modules 201, 202, and/or 203 in carrying out combinatorial process sequence integration process flow(s) 500-B and/or 500-C using processing modules 201, 202, and/or 203 of a MSAS 200 (FIG. 2). Similarly, the combinatorial process sequence integration process flow(s) 500-B and/or 500-C can be embodied across one or more processing modules 301a, 301b, 302a, 302b, 303a, and/or 303b of a MSAS 300 (FIG. 3) for example, where the PTS functions to capture information of one or more processes hosted by processing modules 301a, 301b, 302a, 302b, 303a, and/or 303b in another embodiment.

The substrate processing system 900 includes one or more processing tools and/or processes 910 for use in substrate processing as described above. As an example, the tool 910 of an embodiment is the MSAS 200 described above with reference to FIG. 2; a process running on the MSAS 200 includes one or more processes running under processing modules 201, 202, and/or 203 but is not so limited. As another example, the tool 910 of an embodiment is the MSAS 400 described above with reference to FIG. 4, where processes running on the MSAS 400 include one or more processes running under processing modules 401, 402, and/or 403, but is not so limited. The tools and/or processes 910 can be from one or more third-parties but are not so limited.

The system 900 also includes one or more materials 908 for use in processes appropriate to the substrate processing. The materials 908 can be from one or more third-parties but are not so limited.

Each ID device 904 of the PTS is configured to provide or output electronic identification information corresponding to or specific to the material(s) 908, tool, process cell, process module, and/or process 910 to which it is coupled. The ID devices 904 of an embodiment are coupled or connected between the MMM 902 and the containers C1-C4 that contain the materials 908. The containers C1-C4 can include any type of material container known in the art and appropriate to a processing system, for example, a bottle, a canister, a material delivery system, a material synthesis system, and a Front Opening Unified Pod (FOUP), open cassettes, closed cassettes, to name just a few, but is not so limited. The number of containers of each type can be chosen as appropriate. In one embodiment, C1 and C2 represent canisters to hold source chemistries, whereas C3 and C4 represent FOUPs to hold substrates (e.g. wafers). The type(s) of materials may include one or more of process chemicals, gases, liquids, solids, and substrates as appropriate to the type(s) of containers utilized, but is not so limited. The ID devices 904 of the containers (e.g. C1) provide electronic identification information that corresponds to each container (e.g. C1) and/or material contained in the container (e.g. C1). The MMM 902 sends, receives and/or records identification information received from the ID devices 904. The ID devices 904 are similarly coupled or connected between the MMM 902 and the processing tools 910.

Additionally or alternatively, the ID devices 904 are coupled or connected to one or more individual subsystems, including but not limited to processing cells and/or processing modules (e.g. processing module 402 of MSAS 400, with reference to FIG. 4) of one or more processing tools 910 in one embodiment. The ID devices 904 of the tool and/or processes 910 provide electronic identification information that corresponds to one or more of the tools, processing cells, processing modules, and/or processes 910 that receive material transferred from the at least one material handling device 922. The ID devices 904 include one or more devices including radio frequency (RF) identification devices and bar code devices to name a few, but is not so limited.

The material handling devices 922 of an embodiment are configured to transfer material between subsystems or components of the PTS. Each material handling device 922 captures, sends, and/or receives information of material transferred through the material handling device 922. A material handling device 922 couples or connects to one or more materials. The information of transferred material of an embodiment generally includes but is not limited to one or more of information of a start date of each transfer event, a start time of each transfer event, a stop date of each transfer event, a stop time of each transfer event, an amount of material transferred, a flow rate of each transfer event, a temperature of each transfer event, a pressure of each transfer event, process tool settings during each transfer event, process module settings during each transfer event, process cell settings during each transfer event, process parameters during each transfer event, and the sequence of each material transfer event. The MMM 902 sends, receives, and/or records information of transferred materials received from the material handling devices 922. The material handling devices 922 of an embodiment include but are not limited to flow meters and/or flow control devices (e.g. valves), as described below.

The material handling devices 922 of an embodiment include flow meters, flow control devices, flow regulation devices, flow measurement devices, and combinations of one or more of these devices. The flow meters, which are electrically coupled to the data recorder 912, are also coupled or connected in-line between each material container (e.g. C1) of a process and the processing tool or process 910 that receives the material for use in processing operations. During processing operations, the MMM 902 sends and/or receives ID information from each ID device to which it is coupled. Further, the MMM 902 sends and/or receives flow information from each flow meter. The flow information includes but is not limited to information of a start date of each flow event, a start time of each flow event, a stop date of each flow event, a stop time of each flow event, and an amount of material transferred from a material container (e.g. C1) to a tool and/or process 910. Information received by the MMM 902 is recorded or written to memory (not shown) coupled to the MMM 902, where the memory may be hosted by a component of the PTS.

The material handling devices 922 of an alternative embodiment include flow control devices like valves, or other devices which in concert provide the functionality provided by valves. The valves are also coupled or connected in-line between each material container (e.g. C1) of a process and the processing tool or process 910 that receives the material for use in processing operations. During processing operations, the MMM 902 sends and/or receives ID information from each ID device 904 to which it is coupled. The MMM 902 is configured to control a state of the valve (e.g., open, closed) and thus control the flow of materials to processes in response to at least one parameter. The parameters of an embodiment used by the MMM 902 to control valve state include the identification information of the material, the information of transferred material, at least one process recipe, at least one process sequence, at least one material application sequence, and process conditions. The material handling device 922 of an alternative embodiment includes a valve having an integrated flow meter, but other alternative embodiments are not so limited.

The MMM 902 of an embodiment is configured to correlate identification information received from one or more ID devices 904 with information of transferred material received from one or more material handling devices 922. This correlation can be performed by the MMM 902 or another component of the host processing system in real-time or during post-processing of gathered data. The MMM 902 can transfer correlated identification information and/or information of transferred material to a variety of other processor-based systems. The MMM 902 can also transfer raw identification information and/or information of transferred material to a variety of other processor-based systems. The MMM is configured to transfer the information using any number or combination of wired, wireless, and/or hybrid wired/wireless components and/or networks.

Information received, recorded, and/or correlated by the MMM 902 has many uses in processing operations. For example, the information captured by the MMM 902 is used to control compliance with process recipes, process sequences, material application sequences, process conditions, and/or tool use limits/restrictions. Information captured by the MMM 902 is also used to provide yield and/or product lot information by, for example, allowing an IC manufacturer to correlate yields of specific lots of (licensed) materials and/or to monitor variability between product lots.

Information captured and/or correlated by the MMM 902 can be used to control flow of material by, for example, controlling valves in the flow path as described above. For example, if the MMM 902 detected an improper material for a particular tool and/or process, information of the MMM 902 could be used to close a valve between the material container and the tool. As another example, in a liquid-based application, information of the material ID can be used to control sequencing of materials in the process so that improper sequencing is detected and valves or other mechanisms that control flow are deactivated or closed so as to stop out-of-sequence flow according to a (e.g. licensed, production, and/or best known method BKM, etc.) process in use. Information of the MMM 902 can be used to determine that correct process or recipe was used in the event yield issues are detected.

As another example, information captured by the MMM 902 provides material usage information that, in addition to the compliance described above, supports inventory management. The MMM 902 or other components generate inventory information or inventory control information of materials used in processes in response to the identification information and the information of transferred material. The inventory information includes product yield information, product lot information, and/or material usage information to name a few.

In one embodiment, information captured by the MMM 902 includes electronic identification information that corresponds to one or more of a material container, a material contained in the material container, a name of the material manufacturer, a name of the licensed user of the material, a material production lot number, date of material production, place of production, date of material fill of a material container, place of material fill of a material container, date of first use, time of first use, date of last refill, time of last refill, and place of last refill.

The MMM 902 of an embodiment, in yet another example, can provide licensors of materials, tools, and/or processes with information by which the licensors can track compliance with their license conditions. For example, captured information of the MMM 902 provides a material licensor with the ability to determine if containers are being refilled with material from an unlicensed source instead of being replaced with licensed material. Additionally, captured information of the MMM 902 provides a tool or process licensor with the ability to determine if the proper materials and/or material quantities are being used with the licensed tool or process. The MMM 902 also provides licensors information for use in evaluating processes or recipes used along with materials and quantities used in troubleshooting reported yield and/or tool problems.

As one example supporting use of the MMM 902, Company A licenses Company B (e.g. semiconductor manufacturer) to use process(es) that include use of a licensed material for use in the licensed process(es) (and tools). Company B orders the licensed material from a material supplier for use in the licensed process(es) (and tools) that includes the MMM 902 described above. The material supplier requests and receives RFID devices from Company A and places the tags on the quantity of materials for shipment to Company B. Company A records the RFIDs as belonging to Company B. Similarly, the tools used by Company B to implement licensed processes include RFID tags, and Company A records the RFIDs of the tools as belonging to the semiconductor manufacturer purchasing the tool. The materials and tools purchased by Company B are used in conjunction with the MMM 902, which captures identification information of the materials and tools used in Company B's processing operations. The MMM 902 also captures information of materials transferred and thus consumed during Company B's processing operations.

The combinatorial processing can be effected using the site-isolated reactors (SIR) and/or MSAS described above to, for example, form a masking layer on a dielectric region. The masking layer, as formed, facilitates formation of a capping layer on electrically conductive regions separated by the dielectric region, as described in the Related Applications. The capping layer inhibits electromigration in the electrically conductive regions (and, in some cases, enhances inhibition of diffusion of material from the electrically conductive regions). As an example, the MSAS and/or SIR of an embodiment is used to form a masking layer on one or more dielectric regions of a substrate, where the substrate includes (i.e., as part of, or having formed on and/or in) electrically conductive regions separated by the dielectric region(s) (such a substrate is sometimes referred to herein as an "electronic device"). The electrically conductive regions can be electrical interconnections between electrical elements (e.g., transistors, capacitors, resistors) of the electronic device.

The masking layer can be formed selectively on the dielectric region so that no or negligible masking layer material is formed on the electrically conductive regions. Alternatively, the masking layer can be formed non-selectively on both the dielectric regions and the electrically conductive regions, and masking layer material formed on the electrically conductive regions subsequently removed.

As used herein, a "capping layer" (also sometimes referred to as a "self-aligned barrier layer") is a layer of material formed on electrically conductive regions of an electronic device (e.g., after planarization of the top of the electrically conductive regions) to inhibit electromigration in the electrically conductive regions. In particular, the capping layer inhibits electromigration in the electrically conductive regions better than a dielectric barrier layer that would otherwise be formed on the electrically conductive regions. Additionally, in some cases, a capping layer may inhibit diffusion of material from the electrically conductive regions and, in particular, may inhibit such diffusion to an extent that enables elimination, or reduction of the thickness, of a dielectric barrier layer that would otherwise be formed on the capping layer.

The capping layer can be formed selectively on the electrically conductive regions so that no or negligible capping layer material is formed on the masking layer. In particular, the material(s) and/or one or more process used to form the masking layer and/or the capping layer can be tailored to inhibit formation of capping layer material on the masking layer, thus fostering the selective formation of the capping layer on the electrically conductive regions. Alternatively, the capping layer can be formed non-selectively on both the electrically conductive regions and the masking layer, and capping layer material formed on the masking layer subsequently removed (this can be done, for example, by removing some or all of the masking layer and, with it, capping layer material formed thereon).

The MSAS and/or SIR of an embodiment forms the masking layer or capping layer with any degree of selectivity. As indicated above, "selective" formation of a material on a region or surface means that the material forms on that region or surface with better coverage of the region or surface than that with which the material forms on other region(s) or surface(s). In any embodiment of the MSAS and/or SIR, masking layer material formed on electrically conductive regions or capping layer material formed on the masking layer can be removed if deemed necessary or desirable. However, as discussed further below, removal of masking layer material formed on electrically conductive regions or capping layer material formed on the masking layer may not be necessary in some cases, e.g., when negligible amounts of masking layer material are formed on electrically conductive regions or negligible amounts of capping layer material are formed on the masking layer, such as may be the case when the masking layer is formed selectively on the dielectric regions or the capping layer is formed selectively on electrically conductive regions, respectively.

The MSAS and/or SIR processes of an embodiment inhibit capping layer material from being formed on the masking layer over the dielectric region (in addition to the inhibition of formation of capping layer material on or in the dielectric region, due to the presence of the masking layer on the dielectric region). Consequently, unlike previous approaches to forming a capping layer in which a layer of electrically conductive material (e.g., a cobalt alloy, nickel alloy or tungsten) is selectively deposited on electrically conductive regions, processes of the MSAS and/or SIR prevent the occurrence of unacceptable current leakage between electrically conductive regions when electrically conductive material is used to form the capping layer. Since processes of the MSAS and/or SIR inhibits formation of capping layer material over, on or in the dielectric region, the MSAS and/or SIR enables a great deal of flexibility in the selection of material(s) and/or one or more process for forming the capping layer, without regard for the selectivity of the capping layer material for the electrically conductive regions vis-a-vis the dielectric region (and, in some embodiments, without regard for the selectivity of the capping layer material for any material).

The MSAS and/or SIR thus enable, for example, the use of material(s) and/or process(es) and/or process regime(s) in the formation of the capping layer that would otherwise be undesirable due to a lack of sufficient selectivity. This serves to widen the material choices and/or process(es) and/or process regime(s) available for effecting other desired attributes. For example, the material and/or processes used to form the capping layer can be chosen to enhance adhesion of the capping layer to the electrically conductive regions (thus improving inhibition by the capping layer of electromigration in the electrically conductive regions). The materials and/or processes used to form the capping layer can also be chosen to produce a capping layer that does not unacceptably or undesirably increase resistance in the electrically conductive regions; for example, the capping layer can be formed without replacing any of the material of the electrically conductive regions with capping layer material having a higher resistivity. The materials and/or processes used to form the capping layer can also be chosen so that very little poisoning (undesired diffusion of constituents into and/or adverse modifications) of the electrically conductive regions occurs. Poisoning can lead to undesirable changes in electrical characteristics such as an increase in resistance of the electrically conductive regions. In yet another embodiment, the materials and/or processes used to form the capping layer can be chosen to protect the underlying electrically conductive regions from moisture containing environments, oxygen containing environments, oxidizing environments, and the like.

Additionally or alternatively, the materials and/or processes used to form the capping layer can be chosen to produce a capping layer that is sufficiently effective in inhibiting diffusion of material used to form the electrically conductive regions (e.g., copper) so that a dielectric barrier layer can be eliminated from the electronic device or, at least, reduced in thickness (with attendant decrease in capacitance and associated benefits). Further, since the masking layer inhibits formation of capping layer material in the dielectric region, the MSAS and/or SIR facilitates the use of porous dielectric materials that are increasingly deemed desirable for use in electronic devices. Additionally, the MSAS and/or SIR enables production of a thermally stable capping layer on copper so that the capping layer remains continuous and defect-free (i.e., having sufficiently few defects according to one or more criteria) under typical operating conditions of many electronic devices.

Figure 10:
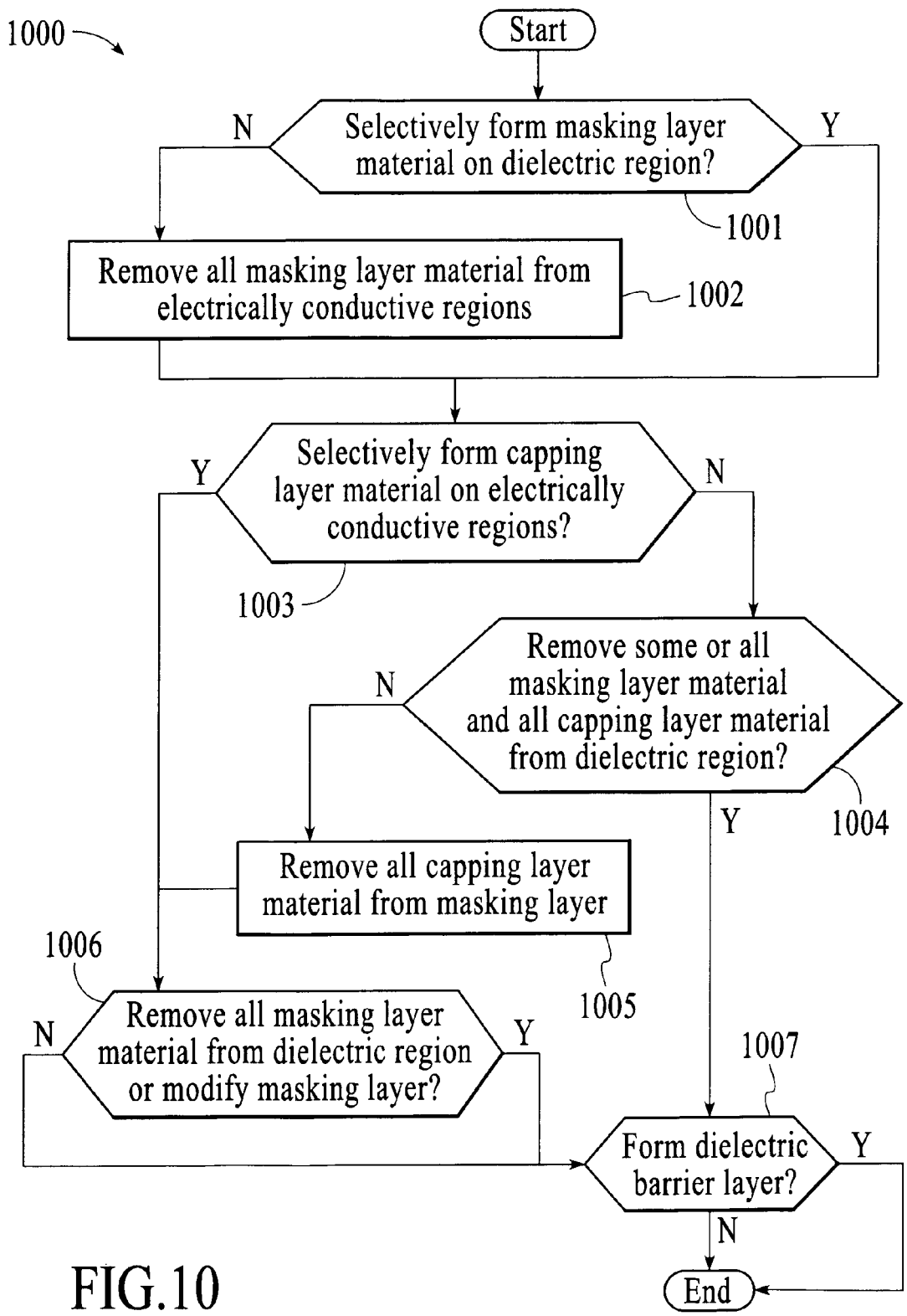
FIG. 10 is a flow diagram for forming a capping layer on electrically conductive regions separated by a dielectric region, under the molecular self-assembly of an embodiment.
Figure 11A:
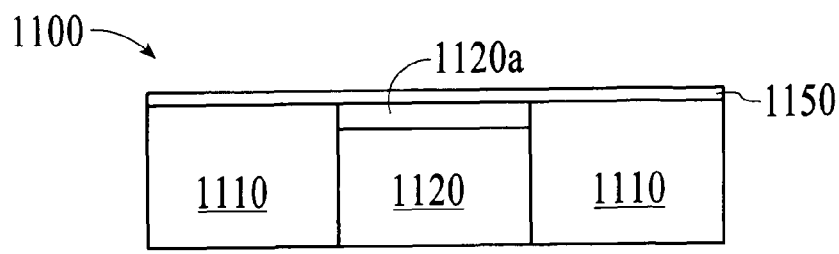
FIGS. 11A through 11E show cross-sectional views of an electronic device undergoing formation of a capping layer on electrically conductive regions separated by a dielectric region, under the molecular self-assembly of an embodiment.
Figure 11B:
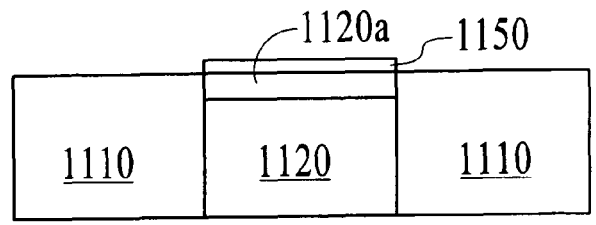
Figure 11C:
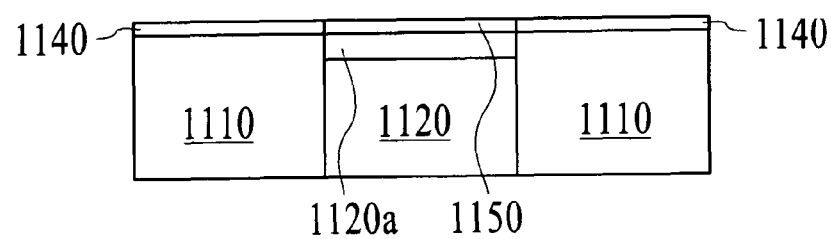
Figure 11D:
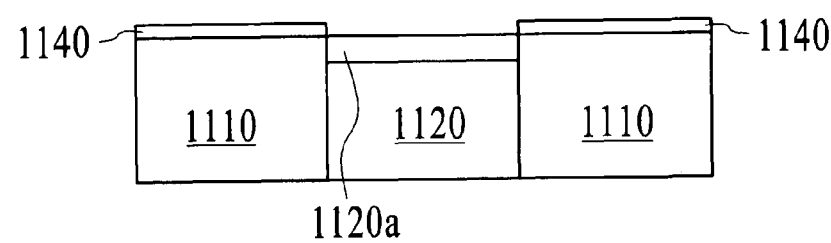
Figure 11E:
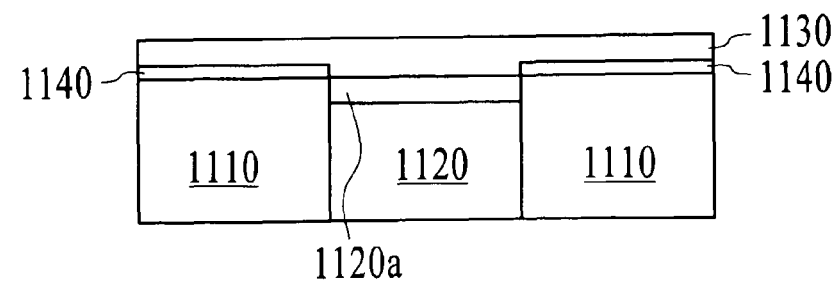

FIG. 10 is a flow diagram for forming or producing 1000 a capping layer on electrically conductive regions separated by a dielectric region, under an embodiment. Formation 1000 of the capping layer includes the use of combinatorial processing and the site-isolated reactors (SIR) and/or MSAS described above but is not so limited. A masking layer is formed 1001 and 1002 on the electronic device so that the masking layer is formed on the dielectric region, but not the electrically conductive regions. After formation of the masking layer, a capping layer is formed 1003, 1004, 1005, and 1006 on the electronic device. Optionally, a dielectric barrier layer can be formed 1007 on the electronic device, depending on the properties of the capping layer, as discussed further below.

The capping layer of an embodiment is formed on the electrically conductive regions but not on or in the dielectric region or the masking layer. The presence of the masking layer inhibits formation of capping layer material on or in the dielectric region that may otherwise have occurred without the masking layer. Consequently, the capping layer produced 1000 forms capping layer material only on the electrically conductive regions (no or negligible capping layer material is formed over, on or in a dielectric region separating electrically conductive regions). This selective capping layer production 1000 therefore reduces or eliminates unacceptable current leakage between electrically conductive regions of the substrate.

FIGS. 11A through 11E show cross-sectional views of an electronic device 1100 undergoing formation of a capping layer 1140 on electrically conductive regions 1110 separated by a dielectric region 1120, under the molecular self-assembly of an embodiment. The electrically conductive regions 1110 can be interconnections between electrical elements of the electronic device, such as, for example, transistors, capacitors and resistors. The dielectric region 1120 is illustrated with a hard mask layer 1120a formed as a top part of the dielectric region 1120, as is commonly the case in current electronic devices; however, the dielectric region 1120 need not necessarily include the hard mask layer 1120a. As described below, the method 1000 can produce a capping layer in accordance with various alternative embodiments not shown. In particular, due to imperfect selectivity or non-selectivity of the formation of the masking layer 1150, masking layer material can be formed on the electrically conductive regions 1110 that are subsequently removed prior to forming the capping layer 1140. However, the formation of the masking layer 1150 may also be accomplished with greater selectivity i) so that no masking layer material is formed on the electrically conductive regions 1110 (in that case, the intermediate structure shown in FIG. 11A would not occur) or ii) so that a negligible amount of masking layer material is formed on the electrically conductive regions 1110 that need not necessarily be removed from the electrically conductive regions 1110 (in that case, the intermediate structure shown in FIG. 11B would not occur and the subsequently formed structures shown in further figures would include the negligible amount of masking layer material formed on the electrically conductive regions 1110).

Generally, a masking layer 1150 is formed non-selectively on both the dielectric region 1120 and the electrically conductive regions 1110. The masking layer material is removed from the electrically conductive regions 1110, and capping layer material is formed selectively on the electrically conductive regions 1110. The masking layer material is removed from the dielectric region 1120, and a dielectric barrier layer 1130 is formed over the capping layer 1140 and dielectric region 1120.

Prior to forming a masking layer in accordance with the invention, the exposed surfaces of the electrically conductive regions and the exposed surface of the dielectric region are prepared for processing in accordance with the invention. This surface preparation includes at least one or more cleaning steps (e.g., a deionized water rinse and/or any of a variety of other well-known surface cleaning step(s)) to remove contaminants left from previous processing. In particular, a low-pH solution chemistry can be used to remove copper oxides and a high pH solution chemistry can be used to remove post CMP residue(s).

The surface preparation can include other processing steps as well. For example, the exposed surfaces of the electrically conductive regions and/or the exposed surface of the dielectric region can be functionalized to facilitate selective formation of the masking layer. In particular, the surface of the dielectric region can be functionalized to promote formation of the masking layer and the exposed surfaces of the electrically conductive regions can be functionalized to inhibit formation of the masking layer. Similarly, the exposed surfaces of the electrically conductive regions and/or the exposed surface of the dielectric region can also be functionalized to facilitate selective formation of the capping layer. In particular, the surface of the dielectric region can be functionalized to inhibit formation of the capping layer (though the use of a masking layer in accordance with the molecular self-assembly described herein may render this unnecessary or, at least, of greatly reduced importance) and the exposed surfaces of the electrically conductive regions can be functionalized to promote adhesion of the capping layer.

In general, the particular manner in which the surfaces of the electrically conductive regions and/or the surface of the dielectric region are functionalized depends on the nature of the materials used to form the electrically conductive regions, the dielectric region and the masking layer, and the desired properties to be produced (e.g., passivation, promotion of material formation). For example, a dielectric region formed of a silicon dioxide-based dielectric material can be functionalized to produce a large number of hydroxyl groups at the surface of the dielectric region to which a self-assembled monolayer has an affinity for attachment, thus promoting formation of the masking layer on the dielectric region. Additionally, a molecule used to form a molecularly self-assembled layer can be established to include a head group that covalently bonds with an exposed hydroxyl group of the material used to form a dielectric region.

With reference to FIG. 10, a masking layer is formed 1001 and 1002 on an electronic device so that the masking layer is formed on a dielectric region of the electronic device, but not on the electrically conductive regions of the electronic device that are separated by the dielectric region. The masking layer can be formed 1001 selectively on the dielectric region or the masking layer can be formed non-selectively on both the dielectric region and the electrically conductive regions. Selective formation of a masking layer on a dielectric region encompasses negligible formation of masking layer material on the electrically conductive regions, i.e., masking layer material coverage that does not impair performance of a method according to the molecular self-assembly and/or combinatorial processing or the functionality of an electronic device produced using molecular self-assembly and/or combinatorial processing.

Non-selective formation of a masking layer on both the dielectric region and the electrically conductive regions encompasses formation of the masking layer with no preference for the dielectric region or electrically conductive regions, with some degree of preference for the electrically conductive regions, or with preference for the dielectric region that is inadequate to result in the formation of no or negligible masking layer material on the electrically conductive regions. When the masking layer is formed non-selectively on the dielectric region and the electrically conductive regions, all masking layer material formed on the electrically conductive regions is subsequently removed 1002. Removal of all masking layer material formed on the electrically conductive regions encompasses leaving negligible masking layer material formed on the electrically conductive regions. Referring again to the electronic device 1100, non-selective formation of a masking layer 1150 on both the dielectric region 1120 and the electrically conductive regions 1110 is followed by removal of all masking layer material formed on the electrically conductive regions 1110, leaving the masking layer 1150 formed only on the dielectric region 1120.

In general, the masking layer can be formed using any number, type, and/or combination of materials and processes that form a masking layer. The masking layer can be formed using either wet processing (e.g., immersion of a substrate in a chemical bath, spraying or spinning of chemical fluid on to a substrate) or dry processing (e.g., vapor deposition). If wet processing is used, a rinsing process may be used afterwards to clean the electronic device, which is then followed by a drying process. Additionally, if wet processing is used, vibration of specified amplitude and/or frequency (e.g., high frequency vibration, such as ultrasonic or megasonic vibration) can be imparted to the electronic device during the processing to facilitate (e.g., speed up) the processing. The masking layer can be deposited or grown on the dielectric region. The masking layer can also be formed by stamping.

The masking layer of an embodiment is formed comprising an electrically insulative (effectively non-conductive) material, since the masking layer is formed in regions that, in the finished electronic device, are electrically non-conductive. However, in embodiments in which the masking layer is completely removed from the electronic device (e.g., FIG. 11D), the masking layer can be formed of an electrically conductive or semiconductor material.

After formation of the masking layer, the masking layer can be functionalized or otherwise modified (e.g., chemically, thermally and/or photo-chemically modified) in a desired manner to produce desired properties (e.g., to produce a desired propensity for formation on the masking layer of material to subsequently be formed on the electronic device, such as a capping layer or a dielectric barrier layer, or to enable some or all of the masking layer to be removed after formation of the capping layer so that capping layer material formed on the masking layer can be removed).

The masking layer can be, for example, a molecularly self-assembled layer, which can be formed as a monolayer (SAM) or a multilayer, and can be formed of organic and/or inorganic material. A molecularly self-assembled layer can be produced by forming (e.g., depositing or growing) additional material on the surface of the dielectric region, or by chemically activating or modifying the material of the dielectric region to produce a new distinct layer of material. The ability to tailor the molecule type, head group, terminal group and/or chain length of a molecularly self-assembled layer advantageously provides flexibility in establishing the characteristics of a masking layer, which can be used to produce desired masking layer properties, as described herein. The masking layer can also be, for example, a layer formed from any class of materials known to form with controlled film thickness, such as, for instance, multi-layer polyelectrolytes. The masking layer can also be, for example, a layer formed on the surface of the dielectric region through the catalytic growth of inorganic or organic materials. The masking layer can also be, for example, a layer formed from dendrimers, hyper-branched polymers, or block co-polymers. The masking layer can also be, for example, an ionic or electrochemically-enhanced self-assembled multilayer or monolayer.

The characteristics of a masking layer formed using the molecular self-assembly can be established to produce desired properties of the masking layer. For example, the type of molecule(s) used to form a molecularly self-assembled layer can be chosen, and the characteristics of the molecule, such as the head group, terminal group and/or length, can be established to produce desired properties of the molecularly self-assembled layer. The particular manner in which the characteristics of a masking layer are tailored include for example one or more of the properties of the dielectric region, the necessity or desirability of avoiding formation of masking layer material on the electrically conductive regions, the characteristics of the materials and/or processes used to form the capping layer, and/or the characteristics of the materials and/or processes used to subsequently form material on the masking layer, but are not so limited.

With reference to FIG. 10, subsequent to forming 1001 and 1002 the masking layer the molecular self-assembly and/or combinatorial processing of an embodiment forms 1003, 1004, 1005, and 1006 a capping layer on the electronic device. The capping layer is formed on the electrically conductive regions, but not on or in the masking layer and/or the dielectric region. The capping layer can be formed 1003 selectively on the electrically conductive regions or the capping layer can be formed non-selectively on both the masking layer and the electrically conductive regions. Selective formation of a capping layer on electrically conductive regions encompasses negligible formation of capping layer material on or in the masking layer and/or dielectric region. Non-selective formation of a capping layer on both the masking layer and the electrically conductive regions encompasses formation of the capping layer with no preference for the electrically conductive regions or masking layer, with some degree of preference for the masking layer, or with preference for the electrically conductive regions that is inadequate to result in the formation of no or negligible capping layer material on or in the masking layer and/or dielectric region.

When the capping layer is formed non-selectively on the masking layer and the electrically conductive regions, all capping layer material formed on the masking layer is subsequently removed 1004 and 1005. Referring again to FIG. 111C, the electronic device 1100 includes selective formation of a capping layer 1140 on the electrically conductive regions 1110; non-selective formation of a capping layer on the masking layer and the electrically conductive regions, followed by removal of all capping layer material formed on the masking layer is further described in the Related Applications.

The capping layer is generally formed using any of a number, type, and/or combination of materials and processes as appropriate to the electronic device (e.g., that inhibits electromigration in electrically conductive regions on which the capping layer is formed, that inhibits diffusion of material from electrically conductive regions on which the capping layer is formed). The capping layer can be formed of an electrically conductive, semiconductor or electrically insulative (effectively non-conductive) material. For example, materials (e.g., cobalt alloys, such as an alloy of cobalt, tungsten and phosphorous or an alloy of cobalt and boron; nickel alloys, such as an alloy of nickel, molybdenum and phosphorous; tungsten; tantalum; tantalum nitride, etc.) and processes (e.g., electroless deposition; chemical vapor deposition; physical vapor deposition (sputtering); atomic layer deposition; etc.) that have previously been used to selectively deposit a capping layer on electrically conductive regions of a semiconductor device can be used. The capping layer can be functionalized but is not so limited.

The presence of the masking layer prevents formation of capping layer material on or in (through diffusion) the dielectric region, thus enforcing good selectivity of the capping layer material for the electrically conductive regions compared with the dielectric region regardless of the selectivity otherwise associated with the material(s) and process(es) used to form the capping layer. Thus, the molecular self-assembly and/or combinatorial processing described herein provides increased flexibility in the materials and processes that can be used to form the capping layer. For example, the molecular self-assembly and/or combinatorial processing enables use of materials and processes for depositing an electrically conductive material to form a capping layer that have previously been inadequate to form a capping layer without producing unacceptable current leakage between electrically conductive regions, but that are effective in inhibiting electromigration because of good adhesion to electrically conductive regions.

Additionally, since the presence of the masking layer enables production of a capping layer by forming additional material on an electrically region, there is no need to create a capping layer by chemically modifying a top part of the electrically conductive region. Thus, the undesirable increase in resistance in the electrically conductive region that is associated with creation of a capping layer in that manner is avoided using the molecular self-assembly described herein.

As described above with reference to FIGS. 10 and 11, when the capping layer is formed non-selectively on both the masking layer and the electrically conductive regions, all capping layer material formed on the masking layer is subsequently removed 1004 and 1005 so that no (or negligible) capping layer material is present over the dielectric region. This reduces or eliminates the possibility of current leakage between the electrically conductive regions when an electrically conductive material is used to form the capping layer. Removal of the capping layer includes removing 1005 just the capping layer material from the masking layer, or removing 1004 a portion (e.g., a top part on which the capping layer material is formed) or all of the masking layer together with the capping layer material formed thereon.

Referring again to FIG. 10, when capping layer material is removed 1004 and 1005 from the masking layer, the removal 1004 and 1005 under the molecular self-assembly and/or combinatorial processing of an embodiment includes subsequent removal 1006 of all of the masking layer or modification of the masking layer (i.e., removing some and/or functionalizing). Removing 1006 all of, or modifying, the masking layer may be used to produce a surface (i.e., an exposed surface of the masking layer or the dielectric region) having particular characteristics (e.g., good propensity for adhesion to a dielectric barrier layer subsequently to be formed on the masking layer). When first removing the capping layer, then removing or modifying the masking layer, the process of an embodiment removes some or all of the masking layer (and/or to functionalize the masking layer) after removing the capping layer (rather than together with removal of the capping layer) for one or more of a variety of reasons. Any of a variety of processes can be used to remove masking layer material from the dielectric region. Similarly, any of a variety of processes can be used to functionalize a masking layer. The particular process or processes used in an embodiment to remove masking layer material from the dielectric region and/or to functionalize the masking layer can depend, in particular, on the characteristics of the masking layer material, and may also depend on the material used to form the dielectric region.

A dielectric barrier layer can also be formed 1007 on the electronic device or not, depending on the properties of the capping layer. FIG. 11 E shows formation of a dielectric barrier layer 1130 on the electronic device 1100. If a dielectric barrier layer is formed on the electronic device, such formation can be accomplished using any type, number, and/or combination of materials and/or processes.

When the capping layer is formed of a material that provides good inhibition of diffusion of the electrically conductive material into adjacent material of the electronic device while still providing other required properties of the capping layer, it is possible to eliminate the dielectric barrier layer from the electronic device or, at least, reduce the thickness of the dielectric barrier layer. The molecular self-assembly and/or combinatorial processing of an embodiment forms a capping layer so that diffusion of material from the electrically conductive regions into adjacent regions is inhibited with sufficient effectiveness that the dielectric barrier layer can be formed with a smaller thickness than would be the case if the capping layer was not present. The molecular self-assembly and/or combinatorial processing of other embodiments forms a capping layer so that diffusion of material from the electrically conductive regions into adjacent regions is inhibited with sufficient effectiveness that a dielectric barrier layer need not be formed. Eliminating the dielectric barrier layer or reducing the thickness of the dielectric barrier layer reduces capacitance, which can decrease the power consumption and/or increase speed of operation of the electronic device. By using a masking layer on the dielectric region to minimize or eliminate selectivity as an important consideration in choosing materials and/or processes for forming the capping layer, the molecular self-assembly and/or combinatorial processing enables formation of a capping layer that provides adequate inhibition of electromigration and a good barrier to diffusion of electrically conductive material. This enables elimination or reduction in thickness of a conventional dielectric barrier layer. The capping layer can also be optimized to resist against any deleterious effects associated with subsequent exposure to moisture containing environments, oxygen containing environments, oxidizing environments, and the like.

The following terms are intended to have the following general meanings as they are used herein.

The term "substrate" is used herein to refer to a material having a rigid, semi-rigid, or flexible surface. The substrate can also include a substance or material acted upon by another substance, material, and/or process. In one embodiment, the substrate can include supporting material(s) (such as a wafer) upon or within which a component or plurality of components (such as a test structure) is fabricated or to which a component is attached. In another embodiment, the substrate can include the supporting material(s) and the component(s). The substrate includes for example a plate, wafer, panel and/or disk of suitable material on and/or in which the components of a unit, such as an integrated or printed circuit, are deposited or formed. A flexible substrate can include plastic or polymeric material, for example flexible materials used in displays or other flexible IC applications. In many embodiments, at least one surface of the substrate will be substantially flat, although in some embodiments it may be desirable to physically separate synthesis regions for different materials with, for example, dimples, wells, raised regions, etched trenches, or the like. In some embodiments, the substrate itself contains wells, raised regions, etched trenches, etc. which form all or part of the processing regions.

The term "predefined region" is used herein to refer to a localized area on a substrate which is, was, or is intended to be used for processing or formation of a selected material and is otherwise referred to herein in the alternative as "known" region, a "selected" region, or simply a "region." The predefined region can include one region and/or a series of regular or periodic regions pre-formed on the substrate. The predefined region may have any convenient shape, e.g., circular, rectangular, elliptical, wedge-shaped, etc. In some embodiments, a predefined region and, therefore, the area upon which each process is performed or distinct material is synthesized, is smaller than about 25 $cm^2$, preferably less than 10 $cm^2$, more preferably less than 5 $cm^2$, even more preferably less than 1 $cm^2$, still more preferably less than 1 $mm^2$, and even more preferably less than 0.5 $mm^2$.

The term "radiation" is used herein to refer to energy which may be selectively applied including energy having a wavelength between $10^{-14}$ and $10^4$ meters including, for example, electron beam radiation, gamma radiation, x-ray radiation, ultraviolet radiation, visible light, infrared radiation, microwave radiation and radio waves. "Irradiation" refers to the application of radiation to a surface or emission of energy directed at a substrate.

As used herein, the term "processing material" is used herein to refer to each of the substances that are delivered to a region of a substrate for processing.

The term "process" or "processing" is used herein to refer to a finite course of actions, operations, events, and/or changes defined by purpose or effect. "Process" or "processing" is used herein to include, but not be restricted to, providing a processing material to a region and/or modifying a region. Processing specifically includes physical modifications, chemical modifications, electrical modifications, thermal modifications, magnetic modifications, photonic modifications, and photolytic modifications, more specifically cleaning, surface modification, surface preparation, deposition, dispensing, reaction, functionalization, etching, planarization, chemical mechanical planarization, electrochemical mechanical planarization, lithography, patterning, implantation, irradiation, electromagnetic irradiation, microwave irradiation, radio frequency (RF) irradiation, thermal treatment, infrared (IR) treatment, ultraviolet (UV) treatment, deep ultraviolet (DUV) treatment, extreme ultraviolet (EUV) treatment, electron beam treatment, and x-ray treatment, and more specifically electrochemical deposition, electroless deposition, physical vapor deposition, chemical vapor deposition, atomic layer deposition, vapor phase epitaxy, liquid phase epitaxy, chemical beam epitaxy, molecular beam epitaxy, molecular self-assembly, and evaporation. Processing conditions are those conditions, such as temperature, time, pressure, material phase, amount, component ratio, etc., under which processing occurs. "Process sequence" is used herein to refer to a series of processes performed in a unique order and/or combination to effect a desired end result, for example, to form or modify structures, test structures, devices, integrated circuits, etc. "Process sequence conditions" are those conditions such as temperature, time, pressure, material phase, amount, component ratio, etc., under which a sequence of processes occurs. "Combinatorial process sequence integration" is used herein to describe i) evaluating different materials, ii) evaluating different processing conditions, iii) evaluating different sequencing and integration of processes (with respect to both modules within a tool and to a plurality of tools in a process flow), and combinations thereof, for such used as in the manufacture of devices such as integrated circuits.

The term "device" is used herein to refer to a unit that is capable of performing some specific function. A device can include electrical, biological, and/or mechanical components, such as discrete electronic components. A device can also include components (e.g., transistor, resistor, diode, capacitor, etc.) of a particular type (e.g., electronic, magnetic, photonic, optoelectronic, magnetoelectronic, magenetooptic, molecular, etc.) on a substrate; which can be active or passive.

The term "structure" is used herein to refer to an arrangement, organization, and/or placement of one or more parts and/or elements. The structure can include topographical features, such as vias, holes, lines, trenches, and test structures, useful for extracting information about a process, identifying process problems, and improving a process as well as device performance. Test structures include device test structures, such as transistors, capacitors and diodes, process test structures, such as a 4-point probe structures, via chain structures, and continuity and isolation structures, circuit test structures, such as inverters and ring oscillators, and SEM test structures.

The processing of an embodiment includes a system comprising at least one of: at least one interface configured to receive at least one substrate; a number of modules coupled to the interface, the modules including one or more of at least one pre-processing module, at least one molecular self-assembly processing module, and at least one post-processing module, wherein each module contains at least one of a number of different processes as appropriate to processes contained in at least one other module, wherein processing of the substrate using the modules includes forming a masking layer on at least one dielectric region of the substrate and forming a capping layer (typically via an electroless deposition module) on at least one electrically conductive region of the substrate; and at least one handler coupled to the interface and configured to move the substrate between the interface and the modules.

The processing of an embodiment includes a system comprising at least one of at least one interface configured to receive at least one substrate, at least one module coupled to the interface, the at least one module including at least one molecular self-assembly processing module, and at least one handler coupled to the interface and configured to move the substrate between the interface and the at least one module.

The system of an embodiment further comprises processing the at least one substrate using the at least one module, wherein the processing includes forming a masking layer on at least one dielectric region of the substrate and forming a capping layer on at least one electrically conductive region of the substrate.

Forming the masking layer of an embodiment comprises selectively forming a molecularly self-assembled layer on the dielectric region.

Forming the masking layer of an embodiment comprises forming masking layer material on the dielectric region and the electrically conductive region and removing the masking layer material from the electrically conductive region.

Forming the capping layer of an embodiment comprises selectively forming capping layer material on the electrically conductive region.

The masking layer of an embodiment inhibits capping layer formation on the dielectric region and generates a selective capping layer.

The at least one module of an embodiment includes at least one other module selected from at least one of a pre-processing module and a post-processing module.

The at least one module of an embodiment includes a plurality of modules, wherein each module of the plurality of modules includes at least one of a plurality of different processes as appropriate to processes contained in at least one other of the plurality of modules.

The system of an embodiment further comprises forming a dielectric barrier layer over the electrically conductive region and the dielectric region after forming the masking layer and the capping layer. The dielectric barrier layer of an embodiment covers at least one of the capping layer and the masking layer.

The system of an embodiment further comprises removing the masking layer after forming the capping layer. The system of an embodiment further comprises forming a dielectric barrier layer over the electrically conductive region and the dielectric region after forming the masking layer and the capping layer. The dielectric barrier layer of an embodiment covers at least one of the capping layer and the dielectric region.

Forming masking layer material of an embodiment comprises forming a molecularly self-assembled layer on the dielectric region and the electrically conductive regions.

Forming the capping layer of an embodiment comprises forming capping layer material on the masking layer and the electrically conductive region and removing capping layer material formed on the masking layer.

The at least one module of an embodiment includes at least one of wet processing modules, dry processing modules, and treatment modules. The wet processing modules of an embodiment include at least one of clean modules, rinse modules, dry modules, electrolesss deposition modules, and electrochemical deposition modules. The dry processing modules of an embodiment include plasma processing modules. The treatment modules of an embodiment include at least one of annealing modules, vaporization modules, ultraviolet (UV) treatment modules, and e-beam treatment modules.

The substrate of an embodiment includes one or more of silicon, glass, plastic, semiconductors, and wafers.

The system of an embodiment further comprises at least one controller coupled to control an environment, wherein the environment includes at least one of an internal environment that is internal to the at least one module and an external environment that is external to the at least one module, wherein the controller controls at least one of temperature, pressure, and composition of the environment.

The controller of an embodiment controls the pressure of the environment at one or more pre-specified pressures, wherein the pre-specified pressures include atmospheric pressure, at least one pressure below atmospheric pressure, and at least one pressure above atmospheric pressure.

The controller of an embodiment controls the temperature of the environment at one or more pre-specified temperatures.

The controller of an embodiment controls the composition of the environment to include one or more pre-specified gases at one or more pre-specified compositions.

The processing of an embodiment includes a method, the method comprising producing a capping layer on electrically conductive regions of a device that are separated by a dielectric region of the device. The device may include an electronic device. The method of an embodiment comprises at least one of forming a masking layer on the dielectric region but, not on the electrically conductive regions, and forming a capping layer on at least the electrically conductive regions. The capping layer is formed subsequent to and/or simultaneous with the masking layer in an embodiment.

Forming a masking layer of an embodiment comprises selectively forming masking layer material on the dielectric region. Selectively forming masking layer material of an embodiment comprises selectively forming a molecularly self-assembled layer on the dielectric region.

Forming a masking layer of an embodiment comprises at least one of forming masking layer material on the dielectric region and the electrically conductive regions, and removing masking layer material from the electrically conductive regions so that no or negligible masking layer material remains on the electrically conductive regions.

Forming a capping layer of an embodiment comprises selectively forming capping layer material on the electrically conductive regions.

After formation of the masking layer and the capping layer of an embodiment, the method further comprises forming a dielectric barrier layer over the electrically conductive regions and the dielectric region.

Forming a capping layer of an embodiment comprises forming the capping layer so that the capping layer inhibits diffusion of material from the electrically conductive regions into adjacent regions with sufficient effectiveness that the dielectric barrier layer can be formed with a smaller thickness than would be the case if the capping layer was not present.

Forming a capping layer of an embodiment comprises forming the capping layer so that the capping layer inhibits diffusion of material from the electrically conductive regions into adjacent regions with sufficient effectiveness that a dielectric barrier layer need not be formed over the electrically conductive regions and the dielectric region.

After formation of the capping layer of an embodiment, the method further comprises removing the masking layer.

Subsequent to and/or simultaneous with formation of the masking layer and the capping layer of an embodiment, the method further comprises forming a dielectric barrier layer over the electrically conductive regions and the dielectric region.

Forming a capping layer of an embodiment comprises forming the capping layer so that the capping layer inhibits diffusion of material from the electrically conductive regions into adjacent regions with sufficient effectiveness that the dielectric barrier layer can be formed with a smaller thickness than would be the case if the capping layer was not present.

Forming a capping layer of an embodiment comprises forming the capping layer so that the capping layer inhibits diffusion of material from the electrically conductive regions into adjacent regions with sufficient effectiveness that a dielectric barrier layer need not be formed over the electrically conductive regions and the dielectric region.

Forming masking layer material of an embodiment comprises forming a molecularly self-assembled layer on the dielectric region and the electrically conductive regions.

Forming a capping layer of an embodiment comprises selectively forming capping layer material on the electrically conductive regions.

Forming a capping layer of an embodiment comprises at least one of forming capping layer material on the masking layer and the electrically conductive regions, removing capping layer material formed on the masking layer so that no or negligible capping layer material remains formed over the dielectric region between the electrically conductive regions. Removing capping layer material formed on the masking layer of an embodiment comprises removing some or substantially all the masking layer, thereby removing capping layer material formed on the masking layer. Removing capping layer material formed on the masking layer comprises removing capping layer material such that no or negligible masking layer material is removed.

The method of an embodiment further comprises, subsequent to and/or simultaneous with formation of the capping layer, removing the masking layer.

The method of an embodiment further comprises, subsequent to and/or simultaneous with formation of the masking layer and the capping layer, forming a dielectric barrier layer over the electrically conductive regions and the dielectric region. Forming a capping layer of an embodiment comprises forming the capping layer so that the capping layer inhibits diffusion of material from the electrically conductive regions into adjacent regions with sufficient effectiveness that the dielectric barrier layer can be formed with a smaller thickness than would be the case if the capping layer was not present.

Forming a capping layer of an embodiment comprises forming the capping layer so that the capping layer inhibits diffusion of material from the electrically conductive regions into adjacent regions with sufficient effectiveness that a dielectric barrier layer need not be formed over the electrically conductive regions and the dielectric region.

The method of an embodiment further comprises, prior to formation of the masking layer, processing exposed surfaces of the electrically conductive regions and the exposed surface of the dielectric region in a specified manner. Processing exposed surfaces of an embodiment comprises cleaning exposed surfaces of the electrically conductive regions and the exposed surface of the dielectric region. Processing exposed surfaces of an embodiment comprises functionalizing exposed surfaces of the electrically conductive regions and/or the exposed surface of the dielectric region.

The masking layer of an embodiment comprises a silane-based material.

The capping layer of an embodiment comprises an electrically conductive material.

The capping layer of an embodiment comprises a cobalt alloy.

The capping layer of an embodiment comprises a nickel alloy.

The capping layer of an embodiment comprises tungsten.

The capping layer of an embodiment comprises tantalum.

The capping layer of an embodiment comprises tantalum nitride.

Forming a capping layer of an embodiment comprises forming the capping layer using electroless deposition.

Forming a capping layer of an embodiment comprises forming the capping layer using chemical vapor deposition.

Forming a capping layer of an embodiment comprises forming the capping layer using physical vapor deposition.

Forming a capping layer of an embodiment comprises forming the capping layer using atomic layer deposition.

The capping layer of an embodiment comprises an electrically insulative material.

The dielectric region of an embodiment comprises a porous dielectric material.

The dielectric region of an embodiment further comprises a hard mask layer formed on the porous dielectric material.

The dielectric region of an embodiment comprises a hard mask layer formed on a dielectric material.

The device of an embodiment is a semiconductor device.

The processing of an embodiment includes a device, comprising at least one of first and second electrically conductive regions. The device may include an electronic device. The device of an embodiment includes one or more of a dielectric region separating the first and second electrically conductive regions, a masking layer or part of a masking layer formed on the dielectric region, but not on the electrically conductive regions, and a capping layer formed on at least the electrically conductive regions.

The masking layer of an embodiment comprises a molecularly self-assembled layer.

The masking layer of an embodiment comprises a silane-based material.

The device of an embodiment further comprises a dielectric barrier layer formed over the capping layer and the masking layer or part of masking layer. The capping layer of an embodiment inhibits diffusion of material from the electrically conductive regions into adjacent regions with sufficient effectiveness that the dielectric barrier layer can be formed with a smaller thickness than would be the case if the capping layer was not present.

The capping layer of an embodiment inhibits diffusion of material from the electrically conductive regions into adjacent regions with sufficient effectiveness that a dielectric barrier layer need not be formed over the electrically conductive regions and the dielectric region.

The capping layer of an embodiment comprises an electrically conductive material.

The capping layer of an embodiment comprises a cobalt alloy.

The capping layer of an embodiment comprises a nickel alloy.

The capping layer of an embodiment comprises tungsten.

The capping layer of an embodiment comprises tantalum.

The capping layer of an embodiment comprises tantalum nitride.

The capping layer of an embodiment comprises an electrically insulative material.

The dielectric region comprises a porous dielectric material. The dielectric region of an embodiment further comprises a hard mask layer formed on the porous dielectric material.

The dielectric region of an embodiment further comprises a hard mask layer formed on a dielectric material of which the dielectric region is comprised.

The electronic device of an embodiment is a semiconductor device.

The processing of an embodiment includes a device, comprising at least one of first and second electrically conductive regions. The device may include an electronic device. The device comprises at least one of a dielectric region separating the first and second electrically conductive regions, and a capping layer formed on the electrically conductive regions. Formation of the capping layer of an embodiment includes one of more of forming a masking layer on the dielectric region, but not on the electrically conductive regions, and, after formation of the masking layer, forming the capping layer on at least the electrically conductive regions. The presence of the masking layer during formation of the capping layer results in no or negligible capping layer material being formed on, in or over the dielectric region, such that unacceptable current leakage between the first and second electrically conductive regions cannot occur during operation of the electronic device.

The device of an embodiment further comprises a dielectric barrier layer formed over the capping layer. The capping layer of an embodiment is formed so that the capping layer inhibits diffusion of material from the electrically conductive regions into adjacent regions with sufficient effectiveness that the dielectric barrier layer can be formed with a smaller thickness than would be the case if the capping layer was not present.

The capping layer of an embodiment is formed so that the capping layer inhibits diffusion of material from the electrically conductive regions into adjacent regions with sufficient effectiveness that a dielectric barrier layer need not be formed over the electrically conductive regions and the dielectric region.

The capping layer of an embodiment comprises an electrically conductive material.

The capping layer of an embodiment comprises a cobalt alloy.

The capping layer of an embodiment comprises a nickel alloy.

The capping layer of an embodiment comprises tungsten.

The capping layer of an embodiment comprises tantalum.

The capping layer of an embodiment comprises tantalum nitride.

The capping layer of an embodiment comprises an electrically insulative material.

The dielectric region of an embodiment comprises a porous dielectric material.

The dielectric region of an embodiment further comprises a hard mask layer formed on the porous dielectric material.

The dielectric region of an embodiment further comprises a hard mask layer formed on a dielectric material of which the dielectric region is comprised.

The device of an embodiment is a semiconductor device.

The processing of an embodiment includes an electronic device, comprising at least one of first and second electrically conductive regions, a dielectric region separating the first and second electrically conductive regions, and a capping layer formed on the electrically conductive regions, wherein no or negligible capping layer material is formed on, in or over the dielectric region, such that unacceptable current leakage between the first and second electrically conductive regions cannot occur during operation of the electronic device.

The processing of an embodiment includes a method comprising receiving a substrate. The substrate includes at least one dielectric material. A molecularly self-assembled layer is formed on an exposed surface of the dielectric material, the molecularly self-assembled layer comprising at least one material having at least one of a molecular characteristic and a molecular type that includes one or more of a molecular type of a head group of molecules of the material, a molecular characteristic of a head group of molecules of the material, a molecular type of a terminal group of molecules of the material, a molecular characteristic of a terminal group of molecules of the material, a molecular type of a linking group of molecules of the material, and a molecular characteristic of a linking group of molecules of the material, wherein the at least one of the molecular characteristic and molecular type are selected according to at least one pre-specified property of the molecularly self-assembled layer.

The method of an embodiment comprises preparing the exposed surface of the dielectric material, wherein preparing includes one or more of functionalization, cleaning, etching, rinsing, drying, vaporization, annealing, curing, thermal treatment, UV treatment, IR treatment, electron treatment, ion treatment, and x-ray treatment.

The method of an embodiment comprises post-processing the molecularly self-assembled layer, wherein the post-processing includes one or more of functionalization, cleaning, etching, rinsing, drying, vaporization, annealing, curing, thermal treatment, UV treatment, IR treatment, electron treatment, ion treatment, and x-ray treatment.

The at least one pre-specified property of the molecularly self-assembled layer of an embodiment includes one or more of pore sealing properties, adhesion properties, diffusion barrier properties, passivation properties, and selectivity.

The at least one pre-specified property of an embodiment is specified according to at least one of an application of the molecularly self-assembled layer, a type of the dielectric material, and a type of the material to be subsequently formed on the molecularly self-assembled layer.

The at least one pre-specified property of an embodiment includes a plurality of properties, further comprising assigning degrees of importance to each of the plurality of properties.

The method of an embodiment comprises one or more of cross-linking, polymerizing, and oligomerizing molecules of the molecularly self-assembled layer.

Forming the molecularly self-assembled layer of an embodiment comprises joining complementary materials in nano-molecular action using coordinated action of independent molecules under distributed control.

The dielectric material of an embodiment is a porous dielectric material, wherein the at least one of a molecular characteristic and a molecular type causes the molecularly self-assembled layer to seal a majority of pores of the exposed surface of the dielectric material The molecular type of an embodiment is an organic molecule and the molecular characteristic includes at least one of a size and a length of one or more of a terminal group and a linking group.

The at least one of the molecular characteristic and the molecular type of an embodiment comprise a carbon chain including at least one of a linking group and a terminal group, wherein a length of at least one of the linking group and the terminal group is long enough relative to a size of the pores of the exposed surface so as to seal the pores.

Sealing of the majority of pores of an embodiment prevents diffusion of at least one of reactants, reagents, precursors, and carrier gases from subsequent depositions into the porous dielectric material.

The method of an embodiment comprises etching at least one structure in the dielectric material.

The at least one structure of an embodiment includes one or more of at least one via and at least one trench.

The method of an embodiment comprises forming at least one deposited barrier layer on the molecularly self-assembled layer, wherein the deposited barrier layer prevents diffusion of other materials into the dielectric material.

The method of an embodiment comprises forming at least one conductive layer on the at least one deposited barrier layer, wherein the at least one conductive layer comprises at least one electrically conductive material.

The at least one conductive layer of an embodiment includes a seed layer.

The method of an embodiment comprises filling the at least one structure with the at least one electrically conductive material.

The at least one electrically conductive material of an embodiment includes one or more of copper, ruthenium, tungsten, and aluminum.

The molecularly self-assembled layer of an embodiment forms a masking layer on the dielectric material.

The method of an embodiment comprises cleaning the substrate, wherein the cleaning includes removing contamination from an electrically conductive material at a bottom portion of the at least one structure, wherein a portion of the contamination is captured in the masking layer.

The masking layer of an embodiment protects the dielectric material during the cleaning.

The cleaning of an embodiment generates an anchor area at the bottom portion of the at least one structure by removing a portion of the electrically conductive material at the bottom portion of the at least one structure.

The method of an embodiment comprises forming a structural anchor in the anchor area by filling the anchor area with material of at least one of barrier layer deposition, seed layer deposition, and bulk copper fill during at least one of the barrier layer deposition, the seed layer deposition, and the bulk copper fill.

The electrically conductive material of an embodiment is a metal, wherein the contamination includes at least one of organic contamination, metallic contamination, and metal oxide contamination.

The method of an embodiment comprises removing the masking layer from at least a portion of the dielectric material, wherein removing the masking layer includes removing the contamination.

The method of an embodiment comprises forming a capping layer over an exposed surface of the electrically conductive material at the bottom portion of the at least one structure.

Forming of the metal alloy capping layer of an embodiment includes delivering and effecting a plating chemistry for electroless plating of the capping layer, wherein the capping layer is a metal alloy capping layer.

The method of an embodiment comprises removing excess material of the capping layer.

The method of an embodiment comprises removing the masking layer from at least a portion of the dielectric material, wherein removing the masking layer includes removing at least one of the contamination, material of the capping layer, and the excess material of the capping layer.

The method of an embodiment comprises preparing the exposed surface, wherein the preparing further includes preparing an exposed surface of an electrically conductive material at a bottom portion of at least one structure of the dielectric material.

The method of an embodiment comprises functionalizing at least one terminal group of the molecularly self-assembled layer by modifying at least one characteristic of the terminal group so as to generate a pre-specified interaction with at least one other material formed on the molecularly self-assembled layer.

The method of an embodiment comprises selecting the at least one of the molecular characteristic and the molecular type to provide a pre-specified force of adhesion between the molecularly self-assembled layer and the dielectric material.

The adhesion of an embodiment is produced by covalent bonding between molecules of at least one material, wherein the at least one material includes material of the molecularly self-assembled layer and the dielectric material.

The adhesion of an embodiment includes covalent bonding between silicon and one or more of oxygen, carbon, and nitrogen.

The at least one of the molecular characteristic and the molecular type of an embodiment includes a pre-specified head group for molecules of the material.

The method of an embodiment comprises selecting the at least one of the molecular characteristic and the molecular type to provide a pre-specified force of adhesion between the molecularly self-assembled layer and at least one material formed on the molecularly self-assembled layer.

The at least one of the molecular characteristic and the molecular type of an embodiment includes a pre-specified terminal group for molecules of the material.

The dielectric material of an embodiment comprises a semiconductor substrate.

The molecularly self-assembled layer of an embodiment is a monolayer.

The molecularly self-assembled layer of an embodiment is a multilayer.

The molecularly self-assembled layer of an embodiment comprises an organic material.

The molecularly self-assembled layer of an embodiment comprises an inorganic material.

The molecularly self-assembled layer of an embodiment comprises thiol molecules.

The molecularly self-assembled layer of an embodiment comprises silicon-based molecules.

The molecularly self assembled layer of an embodiment comprises at least one of a cluster of atoms, a cluster of functionalized atoms, nanoparticles, and functionalized nanoparticles.

The molecularly self-assembled layer of an embodiment comprises molecules including organosilanes.

The molecularly self-assembled layer of an embodiment comprises one or more of dendrimers, hyper-branched polymers, polymer brushes, and block co-polymers.

The dielectric constant of the dielectric material of an embodiment is less than or equal to approximately 2.5.

The size of the pores of the dielectric material of an embodiment is approximately in a range of ten (10) angstroms to fifty (50) angstroms.

The porosity of the dielectric material of an embodiment is equal to or less than approximately fifty percent (50%).

The methods, processes, and systems described above can be used to produce or manufacture semiconductor devices.

The processing of an embodiment includes a method comprising receiving a substrate. The method of an embodiment includes processing at least one region of the substrate differently from at least one other region of the substrate. The processing of an embodiment includes modifying the at least one region. The modifying of an embodiment includes at least one of physical modifications, chemical modifications, electrical modifications, thermal modifications, magnetic modifications, photonic modifications, and photolytic modifications. The processing of an embodiment forms at least one array of differentially processed regions on the substrate.

The processing of an embodiment includes providing at least one material in the at least one region.

At least one of physical modifications, chemical modifications, electrical modifications, thermal modifications, magnetic modifications, photonic modifications, and photolytic modifications of an embodiment include at least one of cleaning, surface modification, surface preparation, deposition, etching, planarization, chemical mechanical planarization, electrochemical mechanical planarization, lithography, patterning, implantation, irradiation, electromagnetic irradiation, microwave irradiation, radio frequency (RF) irradiation, thermal treatment, infrared (IR) treatment, ultraviolet (UV) treatment, deep ultraviolet (DUV) treatment, extreme ultraviolet (EUV) treatment, electron beam treatment, and x-ray treatment.

The deposition of an embodiment includes at least one of electrochemical deposition, electroless deposition, physical vapor deposition, chemical vapor deposition, atomic layer deposition, vapor phase epitaxy, liquid phase epitaxy, chemical beam epitaxy, molecular beam epitaxy, molecular self-assembly, and evaporation.

The surface modification of an embodiment includes functionalization.

The processing of an embodiment includes modifying the at least one region using at least one predefined sequence of modifications.

The processing of an embodiment includes modifying the at least one region using a predefined sequence of modifications and modifying the at least one other region using a different predefined sequence of modifications.

The processing of an embodiment includes one or more of sequentially processing regions of at least one group of regions and simultaneously processing regions of at least one group of regions.

The method of an embodiment includes characterizing the at least one region.

The characterizing of an embodiment includes one or more of sequentially characterizing regions of at least one group of regions and simultaneously characterizing regions of at least one other group of regions.

The characterizing of an embodiment includes characterizing the at least one region for material properties that include at least one of optical properties, chemical composition, chemical reactivity, electrical properties, physical properties, magnetic properties, thermal properties, mechanical properties, and porosity.

The characterizing of an embodiment includes characterizing the at least one region for structural properties that include at least one of material location, material distribution, material thickness, material step coverage, material continuity, and mechanical properties.

The characterizing of an embodiment includes parametric testing of the at least one region that includes testing for at least one of yield, via chain yield, line yield, via resistance, line resistance, Kelvin resistance, leakage, and capacitance.

The characterizing of an embodiment includes device testing of the at least one region, wherein device testing is selected from a group consisting of operational frequency, switching speed, power dissipation, mobility, transconductarce, drive current, threshold voltage, capacitance, resistance, and charge density.

The characterizing of an embodiment includes reliability testing of the at least one region that includes testing for at least one of stress migration, electromigration, bias thermal stress, thermal stress, mechanical stress, environmental stress of at least one environmental parameter, and time dependent dielectric breakdown.

The substrate of an embodiment is selected from a group consisting of blanket wafers, patterned wafers, devices, functional chips, functional devices, and test structures.

Each region of the substrate of an embodiment is one of semiconductors, integrated circuits, flat panel displays, optoelectronic devices, data storage devices, magnetoelectronic devices, magnetooptic devices, molecular electronic devices, solar cells, photonic devices, and packaged devices.

The processing of an embodiment includes a method comprising receiving a substrate. The method of an embodiment includes combinatorially processing a plurality of regions of the substrate. The combinatorial processing of an embodiment includes at least one of a plurality of materials, a plurality of processes, a plurality of processing conditions, a plurality of material application sequences, and a plurality of process sequences. At least one of the materials, processes, processing conditions, material application sequences, and process sequences of an embodiment is different for the combinatorial processing in at least one region of the plurality of regions from at least one other region of the plurality of regions.

The processing of an embodiment includes a method comprising receiving a substrate from at least one first process selected from a group consisting of depositing, patterning, etching, cleaning, planarizing, implanting, and treating. The method of an embodiment includes generating a processed substrate by processing at least one region of the substrate differently from at least one other region of the substrate. The processing of an embodiment includes modifying the at least one region. The modifying of an embodiment includes at least one of physical modifications, chemical modifications, electrical modifications, thermal modifications, magnetic modifications, photonic modifications, and photolytic modifications. The processing of an embodiment forms at least one array of differentially processed regions on the substrate.

The method of an embodiment includes providing the processed substrate to at least one additional process selected from a group consisting of depositing, patterning, etching, cleaning, planarizing, implanting, and treating.

The processing of an embodiment includes using at least one of materials, processing conditions, process sequences, process sequence integration, and process sequence conditions.

The processing of an embodiment includes a method comprising generating a processed substrate by processing at least one region of the substrate differently from at least one other region of the substrate. The processing of an embodiment includes modifying the at least one region. The modifying of an embodiment includes at least one of physical modifications, chemical modifications, electrical modifications, thermal modifications, magnetic modifications, photonic modifications, and photolytic modifications. The processing of an embodiment includes forming at least one array of differentially processed regions on the substrate.

The method of an embodiment includes providing the processed substrate to at least one additional process selected from a group consisting of depositing, patterning, etching, cleaning, planarizing, implanting, and treating.

The processing of an embodiment includes using at least one of materials, processing conditions, process sequences, process sequence integration, and process sequence conditions.

The processing of an embodiment includes a substrate comprising at least a first and a second discrete region. The first discrete region of an embodiment includes at least one area modified using a first combinatorial processing that includes at least one of a plurality of materials, a plurality of processes, a plurality of processing conditions, a plurality of material application sequences, and a plurality of process sequences. The second discrete region of an embodiment includes at least one area modified using a second combinatorial processing that includes at least one of a plurality of materials, a plurality of processes, a plurality of processing conditions, a plurality of material application sequences, and a plurality of process sequences. At least one of the materials, processes, processing conditions, material application sequences, and process sequences of an embodiment is different between the first combinatorial processing and the second combinatorial processing.

The processing of an embodiment includes a method of forming an array of differentially processed regions. The method of an embodiment includes providing a substrate. The method of an embodiment includes processing at least a portion of at least two regions of the substrate. At least a portion of at least one region of an embodiment is processed differently from at least a portion of at least one other region. The processing of an embodiment includes at least one of cleaning, surface modification, etching, planarization, patterning, implantation, electromagnetic irradiation, microwave irradiation, radio frequency (RF) irradiation, infrared (IR) treatment, ultraviolet (UV) treatment, deep ultraviolet (DUV) treatment, extreme ultraviolet (EUV) treatment, electron beam treatment, and x-ray treatment.

The substrate of an embodiment includes an array of predefined regions, each region including at least two structures or devices.

The at least two structures or devices of an embodiment are different from each other.

Each region of an embodiment is similar.

The processing of an embodiment includes modifying the regions. The modifying of an embodiment includes at least one of physical modifications, chemical modifications, electrical modifications, thermal modifications, magnetic modifications, photonic modifications, and photolytic modifications.

Modifying the regions of an embodiment includes functionalization of a surface of the region.

The processing of an embodiment includes one or more of chemical mechanical planarization, electrochemical mechanical planarization, surface preparation, irradiation, thermal treatment, and lithography.

The processing of an embodiment is deposition that includes at least one of electrochemical deposition, electroless deposition, physical vapor deposition, chemical vapor deposition, atomic layer deposition, vapor phase epitaxy, liquid phase epitaxy, chemical beam epitaxy, molecular beam epitaxy, molecular self-assembly, and evaporation.

The processing of an embodiment includes at least one of a plurality of processes, a process sequence, a plurality of processing conditions, a material application sequence, and a plurality of processing sequence conditions. At least one of the processes, process sequence, processing conditions, material application sequence, and processing sequence conditions of an embodiment is different for the processing in at least one region of the plurality of regions.

The processing of an embodiment includes modifying at least a portion of at least one region using at least one predefined sequence of modifications.

The processing of an embodiment includes modifying at least a portion of a first region using a first predefined sequence of modifications and modifying at least a portion of a second region using a second predefined sequence of modifications different from the first predefined sequence of modifications.

The processing of an embodiment includes a processing sequence that includes processing a plurality of regions of the substrate the same prior to processing at least two regions of the plurality of regions differently from each other.

The processing of an embodiment includes a processing sequence that includes processing all regions of the substrate the same subsequent to processing at least two regions differently from each other.

Each region of the substrate of an embodiment is processed simultaneously.

Each region of the substrate of an embodiment is processed sequentially.

At least four regions of the substrate of an embodiment are processed simultaneously.

The method of an embodiment includes determining a property of processed regions. The property of an embodiment includes at least one of optical properties, chemical composition, chemical reactivity, electrical properties, physical properties, magnetic properties, thermal properties, mechanical properties, and porosity.

The property of an embodiment includes at least one of material location, material distribution, material thickness, material step coverage, and material continuity.

The determining of an embodiment includes parametric testing that includes testing for at least one of yield, resistance, leakage, and capacitance.

The testing of an embodiment includes testing for yield. The yield of an embodiment includes at least one of via chain yield, and line yield.

The testing of an embodiment includes testing for resistance. The resistance of an embodiment includes at least one of via resistance, line resistance, and Kelvin resistance.

The determining of an embodiment includes device testing of the at least one region.

The device testing of an embodiment is selected from a group including operational frequency, switching speed, power dissipation, mobility, transconductance, drive current, threshold voltage, capacitance, resistance, and charge density.

The determining of an embodiment includes reliability testing that includes testing for at least one of stress migration, electromigration, bias thermal stress, thermal stress, mechanical stress, environmental stress of at least one environmental parameter, and time dependent dielectric breakdown.

The property of each region of an embodiment is determined simultaneously.

The property of each region of an embodiment is determined sequentially.

The property of at least four regions of an embodiment is determined simultaneously.

Every region of the array of an embodiment is processed differently from every other region of the array.

The substrate of an embodiment is selected from a group including blanket wafers, patterned wafers, substrates including devices, substrates including functional chips, substrates including functional devices, and substrates including test structures.

The substrate of an embodiment is a single monolithic substrate.

Each region of the substrate of an embodiment is one of semiconductors, integrated circuits, flat panel displays, optoelectronic devices, data storage devices, magnetoelectronic devices, magnetooptic devices, molecular electronic devices, solar cells, photonic devices, and packaged devices.

The substrate of an embodiment includes a plurality of predefined areas. The predefined areas of an embodiment include at least one of the at least one region, a portion of the at least one region, the at least one other region, and a portion of the at least one other region.

The substrate of an embodiment includes at least four regions.

The substrate of an embodiment includes at least fifty regions.

The substrate of an embodiment includes at least one hundred regions.

The substrate of an embodiment includes at least one thousand regions.

The method of an embodiment includes providing a barrier to isolate the region from other regions during processing.

The method of an embodiment includes isolating the region that is being processed from the other regions during processing.

The processing of an embodiment includes simultaneously isolating at least four regions of the substrate from other regions of the substrate with at least four processing cells. The processing of an embodiment includes processing the at least four regions, wherein each region is processed differently.

Simultaneously isolating of an embodiment includes providing at least four processing cells, wherein the substrate and the at least four processing cells are configured to move relative to each other. Simultaneously isolating of an embodiment includes moving the at least four processing cells into contact with the substrate so that the at least four processing cells surround at least four corresponding regions of the substrate.

The method of an embodiment includes providing a processing cell. The substrate and the processing cell of an embodiment are configured to move relative to each other. The processing of an embodiment includes isolating a first region of the substrate from other regions of the substrate by bringing the processing cell into contact with the substrate so that the first region is located within the processing cell. The processing of an embodiment includes processing the first region. The processing of an embodiment includes removing the processing cell from contact with the substrate. The processing of an embodiment includes isolating a second region of the substrate from other regions of the substrate by bringing the processing cell into contact with the substrate so that the second region is located within the chamber. The processing of an embodiment includes processing the second region differently from the first region.

The processing cell of an embodiment moves and the substrate is stationary.

The substrate of an embodiment moves and the processing cell is stationary.

Another portion of each region of an embodiment is not processed.

The processing of an embodiment includes delivering a first processing material to one region of the at least two regions of the substrate under conditions to form a first solid layer on a portion of the one region of the substrate. The processing of an embodiment includes delivering a second processing material to the one region of the at least two regions of the substrate under conditions to form a second solid layer on a portion of the one region of the substrate. The first solid layer of an embodiment inhibits formation of the second solid layer on the portion of the one region on which the first layer is formed. The processing of an embodiment includes repeating the delivering of the first processing material and the second processing material for at least one other region of the at least two regions of the substrate. At least one of the first processing material and the second processing material delivered to the one region of an embodiment is different from at least one of the first processing material and the second processing material delivered to the at least one other region.

Each region of the substrate of an embodiment includes a dielectric portion and an electrically conductive portion.

Processing each region of an embodiment includes forming a masking layer on the dielectric portion.

Processing each region of an embodiment includes forming a capping layer on the electrically conductive portion.

The processing of an embodiment includes a method of forming an array of differentially processed regions. The method of an embodiment includes providing a substrate including an array of predefined regions. Each region of an embodiment is similar and includes at least two different structures or devices. The method of an embodiment includes processing at least a portion of at least two regions of the substrate. At least a portion of at least one region of an embodiment is processed differently from at least a portion of at least one other region. The processing of an embodiment includes one or more of providing a material to at least a portion of the at least two regions and modifying at least a portion of the at least two regions.

The processing of an embodiment includes a method of forming an array of differentially processed regions. The method of an embodiment includes providing a substrate. The method of an embodiment includes processing at least a portion of at least two regions of the substrate, wherein at least a portion of at least one region is processed differently from at least a portion of at least one other region. The processing of an embodiment includes one or more of providing a material to at least a portion of the at least two regions and modifying at least a portion of the at least two regions. The method of an embodiment includes determining a property of processed regions, the property including at least one of yield, leakage, operational frequency, switching speed, power dissipation, mobility, transconductance, drive current, threshold voltage, electrical resistance, capacitance, charge density, stress migration, electromigration, bias thermal stress, and time dependent dielectric breakdown.

The processing of an embodiment includes a method of forming an array of materials on an array of regions. The method of an embodiment includes providing a substrate comprising two or more discrete regions, each region comprising a dielectric portion and an electrically conductive portion. The method of an embodiment includes forming a masking layer on the dielectric portion of at least one region of the two or more regions. The method of an embodiment includes forming a capping layer on the electrically conductive portion of at least one region of the two or more regions. At least one of the capping layer and the masking layer of at least one region of an embodiment is different from at least one of the capping layer and the masking layer of at least one other region.

The method of an embodiment includes forming a space between two or more regions. A dimension of the space of an embodiment is configured to prevent materials from substantially interdiffusing between the two or more regions.

The masking layer of an embodiment is not formed on the electrically conductive portion of at least one region.

The method of an embodiment includes removing the masking layer after forming the capping layer of at least one region. The removing of an embodiment enhances selectivity of the capping layer of the at least one region.

The capping layer of an embodiment is not formed on the dielectric portion of at least one region.

The masking layer of an embodiment inhibits formation of capping layer material in the dielectric portion of at least one region.

The processing of an embodiment includes a method of forming an array of materials on an array of regions. The method of an embodiment includes providing a substrate comprising four or more discrete regions. Each region of an embodiment includes an electrically conductive portion and a dielectric portion and is configured to provide a sufficient amount of space between the regions such that materials do not substantially interdiffuse between the four or more discrete regions. The method of an embodiment includes forming a masking layer on the dielectric portion of at least one of the four or more regions. The method of an embodiment includes forming a capping layer on the electrically conductive portion of at least one of the four or more regions, wherein at least one of the capping layer and the masking layer of at least one region is different from at least one of the capping layer and the masking layer of at least one other region.

The masking layer of an embodiment is not formed on the electrically conductive portion of at least one region.

The method of an embodiment includes removing the masking layer after forming the capping layer of at least one region, wherein the removing enhances selectivity of the capping layer of the at least one region.

The capping layer of an embodiment is not formed on the dielectric portion of at least one region.

The masking layer of an embodiment inhibits formation of capping layer material in the dielectric portion of at least one region.

The processing of an embodiment includes a substrate. The substrate of an embodiment includes two or more discrete regions, each region comprising an electrically conductive portion and a dielectric portion. The substrate of an embodiment includes a masking layer on the dielectric portion of at least one region of the two or more regions. The substrate of an embodiment includes a capping layer on the electrically conductive portion of at least one region of the two or more regions. At least one of the capping layer and the masking layer of at least one region is different from at least one of the capping layer and the masking layer of at least one other region.

At least one region of the substrate of an embodiment is further configured to provide a space between at least one other region. A dimension of the space is configured to prevent materials from substantially interdiffusing between the regions.

The masking layer of an embodiment is not formed on the electrically conductive portion of at least one region.

The masking layer of an embodiment is removed after the capping layer of at least one region is formed. Removal of the masking layer of an embodiment enhances selectivity of the capping layer of the at least one region.

The dielectric portion of at least one region of an embodiment does not include the capping layer.

The masking layer of an embodiment inhibits formation of capping layer material in the dielectric portion of at least one region.

The processing of an embodiment includes a substrate. The substrate of an embodiment includes four or more discrete regions, each region comprising an electrically conductive portion and a dielectric portion and configured to provide a sufficient amount of space between the regions such that materials do not substantially interdiffuse between the four or more discrete regions. The substrate of an embodiment includes a masking layer on the dielectric portion of at least one region of the four or more regions. The substrate of an embodiment includes a capping layer on the electrically conductive portion of at least one region of the four or more regions, wherein at least one of the capping layer and the masking layer of at least one region is different from at least one of the capping layer and the masking layer of at least one other region.

The masking layer of an embodiment is not formed on the electrically conductive portion of at least one region.

The masking layer of an embodiment is removed after the capping layer of at least one region is formed. Removal of the masking layer enhances selectivity of the capping layer of the at least one region.

The dielectric portion of at least one region of an embodiment does not include the capping layer.

The masking layer of an embodiment inhibits formation of the capping layer material in the dielectric portion of at least one region.

The processing of an embodiment includes a system for processing regions on a substrate. The system of an embodiment includes a substrate comprising an array of discrete regions, wherein each region comprises a plurality of structures and/or devices. The system of an embodiment includes a processing tool adapted to process at least one region of the substrate differently from at least one other region.

The processing tool of an embodiment is movable and is adapted to move in at least one direction relative to the substrate.

The substrate of an embodiment is movable and is adapted to move in at least one direction relative to the processing tool.

The processing tool of an embodiment is adapted to isolate a region of the substrate from other regions of the substrate during processing of the region.

The processing tool of an embodiment includes a processing cell adapted to isolate one region of the substrate from the other regions of the substrate.

The processing tool of an embodiment includes a plurality of processing cells adapted to isolate a plurality of corresponding regions of the substrate from the other regions of the substrate.

The processing tool of an embodiment includes a number of processing cells corresponding to the number of regions on the substrate.

The system of an embodiment includes one or more processing fluid sources and a delivery system for delivering one or more processing fluids from the one or more sources to a first region on the substrate. The system of an embodiment includes a removal system for removing fluid from the region.

The system of an embodiment includes a purge gas line for delivering a purge gas to a region of the substrate.

The system of an embodiment includes a mini-environment.

The processing tool of an embodiment includes one or more processing fluid sources and a plurality of delivery systems corresponding to a plurality of processing cells for delivering one or more processing fluids from the one or more processing fluid sources to regions on the substrate through the processing cells.

The system of an embodiment includes a plurality of removal systems corresponding to the plurality of processing cells for removing fluids from each region through the processing cells.

The processing tool of an embodiment includes a sealing element.

The plurality of structures and/or devices of an embodiment are different from each other.

Each region of the substrate of an embodiment is similar to each other region.

The processing tool of an embodiment is adapted to perform at least one of cleaning, surface modification, surface preparation, deposition, etching, planarization, chemical mechanical planarization, electrochemical mechanical planarization, lithography, patterning, implantation, irradiation, electromagnetic irradiation, microwave irradiation, radio frequency (RF) irradiation, thermal treatment, infrared (IR) treatment, ultraviolet (UV) treatment, deep ultraviolet (DUV) treatment, extreme ultraviolet (EUV) treatment, electron beam treatment, and x-ray treatment.

The processing tool of an embodiment is adapted to modify the regions. Modifying of an embodiment includes at least one of physical modifications, chemical modifications, electrical modifications, thermal modifications, magnetic modifications, photonic modifications, and photolytic modifications.

At least one of physical modifications, chemical modifications, electrical modifications, thermal modifications, magnetic modifications, photonic modifications, and photolytic modifications of an embodiment include at least one of cleaning, surface modification, surface preparation, deposition, etching, planarization, chemical mechanical planarization, electrochemical mechanical planarization, lithography, patterning, implantation, irradiation, electromagnetic irradiation, microwave irradiation, radio frequency (RF) irradiation, thermal treatment, infrared (IR) treatment, ultraviolet (UV) treatment, deep ultraviolet (DUV) treatment, extreme ultraviolet (EUV) treatment, electron beam treatment, and x-ray treatment.

The deposition of an embodiment includes at least one of electrochemical deposition, electroless deposition, physical vapor deposition, chemical vapor deposition, atomic layer deposition, vapor phase epitaxy, liquid phase epitaxy, chemical beam epitaxy, molecular beam epitaxy, molecular self-assembly, and evaporation.

The modification of an embodiment includes functionalization of a surface of the region.

The processing tool of an embodiment is adapted to perform at least one of a process, a process sequence, a plurality of processing conditions, a material application sequence, and a plurality of process sequence conditions. The processing tool of an embodiment is adapted to apply the at least one of the process, process sequence, processing conditions, material application sequence, and process sequence conditions differently for the processing in at least one region of the plurality of regions.

The processing tool of an embodiment is adapted to modify at least a portion of at least one region using at least one predefined sequence of modifications.

The processing tool of an embodiment is adapted to modify at least a portion of a first region using a first predefined sequence of modifications and modify at least a portion of a second region using a second predefined sequence of modifications different from the first predefined sequence of modifications.

The system of an embodiment is adapted to process each region simultaneously.

The system of an embodiment is adapted to process each region sequentially.

The system of an embodiment is adapted to process at least four regions simultaneously.

The system of an embodiment includes an analytical tool for determining a property of the regions processed, the property including at least one of optical properties, chemical composition, chemical reactivity, electrical properties, physical properties, magnetic properties, thermal properties and mechanical properties.

The analytical tool of an embodiment is adapted to determine a physical property including at least one of material location, material distribution, material thickness, material step coverage, and material continuity.

The analytical tool of an embodiment is adapted for parametric testing that includes testing for at least one of yield, resistance, leakage, and capacitance.

The testing of an embodiment is for yield that includes at least one of via chain yield and line yield.

The testing of an embodiment is for resistance that includes at least one of via resistance, line resistance, and Kelvin resistance.

The analytical tool of an embodiment is adapted to conduct device testing.

The device testing of an embodiment is selected from a group including operational frequency, switching speed, power dissipation, mobility, transconductance, drive current, threshold voltage, capacitance, resistance, and charge density.

The analytical tool of an embodiment is adapted to conduct reliability testing of the regions that includes testing for at least one of stress migration, electromigration, bias thermal stress, thermal stress, mechanical stress, environmental stress of at least one environmental parameter, and time dependent dielectric breakdown.

The analytical tool of an embodiment is adapted to determine a property of each region simultaneously.

The analytical tool of an embodiment is adapted to determine a property of each region sequentially.

The analytical tool of an embodiment is adapted to determine a property of at least four regions simultaneously.

The substrate of an embodiment includes is selected from a group including blanket wafers, patterned wafers, substrates including devices, substrates including functional chips, substrates including functional devices, and substrates including test structures.

The substrate of an embodiment includes a single monolithic substrate.

The substrate of an embodiment includes one of semiconductor devices, wafers, integrated circuits, flat panel displays, optoelectronic devices, data storage devices, magnetoelectronic devices, magnetooptic devices, molecular electronic devices, solar cells, photonic devices, and packaged devices.

The substrate of an embodiment includes at least ten regions.

The substrate of an embodiment includes at least fifty regions.

The substrate of an embodiment includes at least one hundred regions.

The processing tool of an embodiment includes a plurality of processing cells and a single sealing element.

The processing tool of an embodiment includes a plurality of sealing elements corresponding to a plurality of processing cells.

The processing of an embodiment includes a system for processing regions on a substrate. The system of an embodiment includes a substrate comprising an array of regions. The system of an embodiment includes a processing tool adapted to process at least one region of the substrate differently from at least one other region. The processing tool of an embodiment is adapted to perform one or more of cleaning, surface modification, surface preparation, deposition, etching, planarization, chemical mechanical planarization, electrochemical mechanical planarization, lithography, patterning, implantation, irradiation, electromagnetic irradiation, microwave irradiation, radio frequency (RF) irradiation, thermal treatment, infrared (IR) treatment, ultraviolet (UV) treatment, deep ultraviolet (DUV) treatment, extreme ultraviolet (EUV) treatment, electron beam treatment, and x-ray treatment.

Aspects of the substrate processing systems described herein may be implemented as functionality programmed into any of a variety of circuitry, including programmable logic devices (PLDs), such as field programmable gate arrays (FPGAs), programmable array logic (PAL) devices, electrically programmable logic and memory devices and standard cell-based devices, as well as application specific integrated circuits (ASICs). Some other possibilities for implementing aspects of the substrate processing systems include: microcontrollers with memory (such as electronically erasable programmable read only memory (EEPROM)), embedded microprocessors, firmware, software, etc. Furthermore, aspects of the substrate processing systems may be embodied in microprocessors having software-based circuit emulation, discrete logic (sequential and combinatorial), custom devices, fuzzy (neural) logic, quantum devices, and hybrids of any of the above device types. Of course the underlying device technologies may be provided in a variety of component types, e.g., metal-oxide semiconductor field-effect transistor (MOSFET) technologies like complementary metal-oxide semiconductor (CMOS), bipolar technologies like emitter-coupled logic (ECL), polymer technologies (e.g., silicon-conjugated polymer and metal-conjugated polymer-metal structures), mixed analog and digital, etc.

It should be noted that the various components disclosed herein may be described and expressed (or represented) as data and/or instructions embodied in various computer-readable media. Computer-readable media in which such data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such data and/or instructions by carrier waves include, but are not limited to, transfers (uploads, downloads, e-mail, etc.) over the Internet and/or other computer networks via one or more data transfer protocols (e.g., HTTP, FTP, SMTP, etc.). When received within a computer system via one or more computer-readable media, such data and/or instruction-based expressions of the above described components may be processed by a processing entity (e.g., one or more processors) within the computer system in conjunction with execution of one or more other computer programs.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

The above description of illustrated embodiments of the substrate processing systems is not intended to be exhaustive or to limit the substrate processing systems to the precise form disclosed. While specific embodiments of, and examples for, the substrate processing systems are described herein for illustrative purposes, various equivalent modifications are possible within the scope of the substrate processing systems, as those skilled in the relevant art will recognize. The teachings of the substrate processing systems provided herein can be applied to other processing systems and methods, not only for the systems and methods described above.

The elements and acts of the various embodiments described above can be combined to provide further embodiments. These and other changes can be made to the substrate processing systems in light of the above detailed description.

In general, in the following claims, the terms used should not be construed to limit the substrate processing systems to the specific embodiments disclosed in the specification and the claims, but should be construed to include all processing systems that operate under the claims. Accordingly, the substrate processing systems are not limited by the disclosure, but instead the scope of the substrate processing systems is to be determined entirely by the claims.

While certain aspects of the substrate processing systems are presented below in certain claim forms, the inventors contemplate the various aspects of the substrate processing systems in any number of claim forms. Accordingly, the inventors reserve the right to add additional claims after filing the application to pursue such additional claim forms for other aspects of the substrate processing systems.

What is claimed is:

1. A system comprising:
   at least one interface configured to receive at least one substrate containing two or more regions;
   a plurality of modules coupled to the at least one interface, the plurality of modules comprising a first module configured for physical vapor deposition (PVD) processing of the substrate, a second module configured for atomic layer deposition (ALD) processing of the substrate, and a third module configured for a wet processing operation, wherein the third module includes a site-isolated reactor (SIR) to perform combinatorial processing on the substrate, the SIR moveably affixed to a frame and including a processing cell, the processing cell having a bottom surface configured to seal against a surface of the substrate to define one of the regions, wherein the processing cell is sealed on a top surface through a septum;
   a process tracking system (PTS) to capture information on the processing by the SIR;
   a first handler configured to move the substrate between the interface and one of the first or the second module; and
   a second handler configured to move the substrate between the interface and the third module.

2. The system of claim 1, wherein the plurality of modules further comprises at least one of a pre-processing module and a post-processing module.

3. The system of claim 1, wherein the system is configured to maintain a vacuum within the interface and the plurality of modules.

4. The system of claim 2, wherein the pre-processing module is a pre-cleaning chamber.

5. The system of claim 1, wherein the first module or the third module including the SIR is capable of independently varying the processing conditions at different regions of the substrate.

6. The system of claim 1, wherein at least one module of the plurality of modules is configured to characterize the substrate.

7. The system of claim 6, wherein the module configured to characterize the substrate is capable of sequentially characterizing regions of at least one group of regions and simultaneously characterizing regions of at least one other group of regions.

8. The system of claim 1, wherein the SIR isolates the at least one region from the at least one other region during processing.

9. The system of claim 1, wherein the SIR includes a plurality of processing cells, wherein the plurality of processing cells and the substrate are configured to move relative to each other.

10. The system of claim 1, wherein more than one of the plurality of modules is configured for combinatorial processing.

11. The system of claim 1, wherein the septum is configured such that when the septum is pierced by a probe, the probe enters an interior of the processing cell.

12. The system of claim 1, wherein the third module further comprises a probe movably affixed to the frame and configured to pierce the septum and deliver processing fluid into the processing cell.

13. The system of claim 12, wherein the third module further comprises a liquid reservoir, and wherein the probe is movable between a position adjacent the liquid reservoir and a position adjacent the processing cell.

14. The system of claim 13, wherein the probe is configured to withdraw the processing fluid from the liquid reservoir when the probe is in the position adjacent the liquid reservoir.

* * * * *